(12) United States Patent
Zhu et al.

(10) Patent No.: US 10,611,783 B2
(45) Date of Patent: Apr. 7, 2020

(54) ORIENTED PEROVSKITE CRYSTALS AND METHODS OF MAKING THE SAME

(71) Applicant: Alliance for Sustainable Energy, LLC, Golden, CO (US)

(72) Inventors: Kai Zhu, Littleton, CO (US); Donghoe Kim, Broomfield, CO (US); Joseph Jonathan Berry, Boulder, CO (US); Jaehong Park, Kyotu-fu (JP)

(73) Assignee: Alliance for Sustainable Energy, LLC, Golden, CO (US)

( * ) Notice: Subject to any disclaimer, the term of this patent is extended or adjusted under 35 U.S.C. 154(b) by 135 days.

(21) Appl. No.: 15/784,251

(22) Filed: Oct. 16, 2017

(65) Prior Publication Data

US 2018/0105543 A1 Apr. 19, 2018

Related U.S. Application Data

(60) Provisional application No. 62/408,383, filed on Oct. 14, 2016.

(51) Int. Cl.
*C07F 7/24* (2006.01)
*C30B 29/22* (2006.01)
(Continued)

(52) U.S. Cl.
CPC .................. *C07F 7/24* (2013.01); *C30B 7/06* (2013.01); *C30B 29/22* (2013.01);
(Continued)

(58) Field of Classification Search
CPC ........................................................ C07F 7/24
See application file for complete search history.

(56) References Cited

U.S. PATENT DOCUMENTS

2012/0234389 A1* 9/2012 Oooka .................. H01L 27/304
136/259
2015/0136232 A1 5/2015 Snaith et al.
(Continued)

FOREIGN PATENT DOCUMENTS

WO WO 2016/038338 A1 3/2016

OTHER PUBLICATIONS

Tian et al., "A Solution-Processed Organometal Halide Perovskite Hole Transport Layer for Highly Effi cient Organic Light-Emitting Diodes," 2016, Adv. Electon. Mater. 2, p. 1600165. (Year: 2016).*
(Continued)

*Primary Examiner* — Robert A Vetere
(74) *Attorney, Agent, or Firm* — Michael A. McIntyre

(57) ABSTRACT

An aspect of the present disclosure is a method that includes combining a first organic salt ($A^1X^1$), a first metal salt ($M^1(X^2)_2$), a second organic salt ($A^2X^3$), a second metal salt ($M^2Cl_2$), and a solvent to form a primary solution, where $A^1X^1$ and $M^1(X^2)_2$ are present in the primary solution at a first ratio between about 0.5 to 1.0 and about 1.5 to 1.0, and $A^2X^3$ to $M^2Cl_2$ are present in the primary solution at a second ratio between about 2.0 to 1.0 and about 4.0 to 1.0. In some embodiments of the present disclosure, at least one of $A^1$ or $A^2$ may include at least one of an alkyl ammonium, an alkyl diamine, cesium, and/or rubidium.

5 Claims, 42 Drawing Sheets

(51) Int. Cl.
C30B 7/06 (2006.01)
H01L 51/00 (2006.01)
H01L 31/0256 (2006.01)
H01L 51/42 (2006.01)

(52) U.S. Cl.
CPC ...... *H01L 51/0077* (2013.01); *C07B 2200/13* (2013.01); *H01L 31/0256* (2013.01); *H01L 51/4273* (2013.01); *H01L 2031/0344* (2013.01)

(56) References Cited

U.S. PATENT DOCUMENTS

| | | |
|---|---|---|
| 2016/0005547 A1 | 1/2016 | Seok et al. |
| 2017/0152608 A1* | 6/2017 | Jin .......................... C30B 7/14 |

OTHER PUBLICATIONS

Yang et al., "High-performance photovoltaic perovskite layers fabricated through intramolecular exchange," 2015, Science 348 (6240), pp. 1234-1237. (Year: 2015).*

Nie et al., "High-efficiency solution-processed perovskite solar cells with millimeter-scale grains," 2015, Science 347 (6221), pp. 522-525. (Year: 2015).*

Giesbrecht, N. et al., "Synthesis of Perfectly Oriented and Micrometer-Sized MAPbBr$_3$ Perovskite Crystals for Thin-Film Photovoltaic Applications," ACS Energy Letters, vol. 1, 2016, pp. 150-154.

Han, Q. et al., "Single Crystal Formamidinium Lead Iodide (FAPbI$_3$): Insight into the Structural, Optical, and Electrical Properties," Advanced Materials, vol. 28, 2016, pp. 2263-2258.

Heo, J. et al., "Efficient inorganic-organic hybrid heterojunction solar cells containing perovskite compound and polymeric hole conductors," Nature Photonics, published online May 5, 2013, pp. 1-6.

Jeon, N. et al., "Solvent engineering for high-performance inorganic-organic hybrid perovskite solar cells," Nature Materials, vol. 13, Sep. 2014, pp. 897-903.

Kline, R. et al., "Highly oriented crystals at the buried interface in polythiophene thin-film transistors," Nature Materials, vol. 5, Mar. 2006, pp. 222-228.

Law, M. et al., "Nanowire dye-sensitized solar cells," Nature Materials, vol. 4, Jun. 2005, pp. 455-459.

Lee, M. et al., "Efficient Hybrid Solar Cells Based on Meso-Superstructured Organometal Halide Perovskites," Science, vol. 338, Nov. 2, 2012, pp. 643-647.

McCulloch, I. et al., "Liquid-crystalline semiconducting polymers with high charge-carrier mobility," Nature Materials, vol. 5, Apr. 2006, pp. 328-333.

Penn, R. et al., "Imperfect Oriented Attachment: Dislocation Generation in Defect-Free Nanocrystals," Science, vol. 281, Aug. 14, 1998, pp. 969-971.

Wang, D. et al., "Reproducible One-Step Fabrication of Compact MAPbI$_{3-x}$Cl$_x$ Thin Films Derived from Mixed-Lead-Halide Precursors," Chemistry of Materials, vol. 26, 2014, pp. 7145-7150.

Williams, S. et al., "Role of Chloride in the Morphological Evolution of Organo-Lead Halide Perovskite Thin Films," ACS Nano, vol. 8, No. 10, 2014, pp. 10640-10654.

Liang, P. et al., "High-Performance Planar-Heterojunction Solar Cells Based on Ternary Halide Large-Band-Gap Perovskites," Advanced Energy Materials, vol. 5, 2015, 7 pages.

Saliba, M. et al., "Cesium-containing triple cation perovskite solar cells: improved stability, reproducibility and high efficiency," Energy & Environmental Science, vol. 9, No. 6, Jun. 2016, pp. 1989-1997.

Tian, Y. et al., "A Solution-Processed Organometal Halide Perovskite Hole Transport Layer for Highly Efficient Organic Light-Emitting Diodes," Advanced Electronic Materials, vol. 2, 2016, 5 pages.

Wang, J. et al., "FAPbCl$_3$ Perovskite as Alternative Interfacial Layer for Highly Efficient and Stable Polymer Solar Cells," Advanced Electronic Materials, vol. 2, 2016, 6 pages.

International Search Report from corresponding PCT patent application No. PCT/US17/56729 dated Jan. 8, 2018, three pages.

Written Opinion of the International Searching Authority from corresponding PCT patent application No. PCT/US17/56729 dated Jan. 8, 2018, five pages.

\* cited by examiner

2theta = 19.8° / (-120)

2theta = 24.3° / (021)

2theta = 28.2° / (-222)

ORIENTED PEROVSKITE CRYSTALS AND METHODS OF MAKING THE SAME

CROSS-REFERENCE TO RELATED APPLICATIONS

This application claims the benefit of U.S. Provisional Application No. 62/408,383 filed Oct. 14, 2016, the contents of which is incorporated herein by reference in its entirety.

CONTRACTUAL ORIGIN

The United States Government has rights in this disclosure under Contract No. DE-AC36-08GO28308 between the United States Department of Energy and the Alliance for Sustainable Energy, LLC, the Manager and Operator of the National Renewable Energy Laboratory.

BACKGROUND

The recent performance improvements in organic-inorganic perovskite solar cells (PSCs) was brought by incorporating formamidinium ($FA^+$) cation into their crystal structure. However, their imbalanced charge-transport characteristics and inferior light-absorption capability, with respect to methylammonium lead halide perovskite ($MAPbX_3$, X=I, Br, and Cl), have hindered broad application of FA-based perovskites in optoelectronic applications with a planar architecture. Thus, there remains a need for perovskite films and devices having improved physical property and/or performance metrics, as well as a need for improved methods for manufacturing such films and devices.

SUMMARY

An aspect of the present disclosure is a method that includes combining a first organic salt ($A^1X^1$), a first metal salt ($M^1(X^2)_2$), a second organic salt ($A^2X^3$), a second metal salt ($M^2Cl_2$), and a solvent to form a primary solution, where $A^1X^1$ and $M^1(X^2)_2$ are present in the primary solution at a first ratio between about 0.5 to 1.0 and about 1.5 to 1.0, and $A^2X^3$ to $M^2Cl_2$ are present in the primary solution at a second ratio between about 2.0 to 1.0 and about 4.0 to 1.0. In some embodiments of the present disclosure, at least one of $A^1$ or $A^2$ may include at least one of an alkyl ammonium, an alkyl diamine, cesium, and/or rubidium.

In some embodiments of the present disclosure, at least one of $A^1$ or $A^2$ may include at least one of methylammonium, ethylammonium, propylammonium, and/or butylammonium. In some embodiments of the present disclosure, at least one of $A^1$ or $A^2$ may include formamidinium. In some embodiments of the present disclosure, at least one of $M^1$ or $M^2$ may include a metal having a 2+ valence state. In some embodiments of the present disclosure, at least one of $M^1$ or $M^2$ may include at least one of lead, tin, and/or germanium. In some embodiments of the present disclosure, at least one of $X^1$, $X^2$, or $X^3$ may include a halogen. In some embodiments of the present disclosure, at least one of $X^1$, $X^2$, or $X^3$ may include at least one of fluorine, bromine, iodine, and/or astatine. In some embodiments of the present disclosure, the solvent may include an organic solvent. In some embodiments of the present disclosure, $A^1X^1$ and $M^1(X^2)_2$ may form a first reactant pair, $A^2X^3$ to $M^2Cl_2$ form a second reactant pair, and the first reactant pair and the second reactant pair may be present in the primary solution at a third ratio between about 1.0 to 1.0 and about 1.5 to 1.

In some embodiments of the present disclosure, the method may further include depositing at least a portion of the primary solution onto a solid surface, where the depositing may form a liquid layer that includes the primary solution on the solid surface. In some embodiments of the present disclosure, the depositing may be performed using at least one of spin coating, blade coating, curtain coating, and/or dip coating. In some embodiments of the present disclosure, the method may further include, after the depositing, treating at least the liquid layer, where the treating may convert at least a portion of the liquid layer to a solid layer that includes a plurality of organic-inorganic perovskite crystals, and the solid layer may be adhered to the solid surface. In some embodiments of the present disclosure, the plurality of organic-inorganic perovskite crystals may include $A^1_{(1-x-y)}A^2_xA^3_yM^1_zM^2_{1-z}X^1_aX^2_bX^3_cCl_d$, where x, y, and z may each be between zero and one inclusively, and a+b+c+d=3.0.

An aspect of the present disclosure is a device that includes a perovskite layer that includes an organic-inorganic perovskite crystal, where the perovskite layer is positioned substantially parallel with a plane, the organic-inorganic perovskite crystal has a molar composition defined by $A^1_{(1-x-y)}A^2_xA^3_yM^1_zM^2_{1-z}X^1_aX^2_bX^3_cCl_d$, where x, y, and z are each between zero and one inclusively, and d=3.0, at least one of $A^1$, $A^2$, and/or $A^3$ includes at least one of an alkyl ammonium, an alkyl diamine, cesium, and/or rubidium, and at least one of $M^1$ or $M^2$ includes a metal having a 2+ valence state. In some embodiments of the present disclosure, the alky ammonium may include at least one of methylammonium, ethylammonium, propylammonium, and/or butylammonium. In some embodiments of the present disclosure, the alkyl diamine may include formamidinium. In some embodiments of the present disclosure, the metal may include at least one of lead, tin, and/or germanium.

In some embodiments of the present disclosure, the organic-inorganic perovskite crystal may further include $X^1_aX^2_bX^3_c$, where a+b+c+d=3.0, and at least one of $X^1$, $X^2$, and/or $X^3$ includes a halogen. In some embodiments of the present disclosure, the organic-inorganic perovskite crystal may have a length dimension and a width dimension, and the length dimension and the width dimension may define an aspect ratio of the length dimension to the width dimension between about 1.5 and about 50. In some embodiments of the present disclosure, the length dimension may be oriented substantially perpendicular to the plane. In some embodiments of the present disclosure, the length dimension may be between about 100 nm and about 3000 nm. In some embodiments of the present disclosure, the organic-inorganic perovskite crystal may form a grain having a width between about 2 μm and about 5 μm.

BRIEF DESCRIPTION OF THE DRAWINGS

Exemplary embodiments are illustrated in referenced figures of the drawings. It is intended that the embodiments and figures disclosed herein are to be considered illustrative rather than limiting.

FIG. 4A illustrates the XRD pattern of the (−111) uniaxial-oriented $FA_{0.6}MA_{0.4}PbI_{(3-y)}Cl_y$ perovskite deposited on (100)-Si wafer. FIG. 4B illustrates the 2D-XRD image of a uniaxial-oriented perovskite deposited on F-doped $SnO_2$ (FTO) substrate. FIG. 4C illustrates the tilted-scanning electron microscope (SEM) image of a typical uniaxial-oriented perovskite film. FIG. 4D illustrates a schematic of the uniaxial-oriented organic-inorganic perovskite layer 330 constructed from a plurality of organic-inorganic perovskite crystals (only one referenced 100) deposited on first charge-transport layer 320 made of c-$TiO_2$/FTO, further deposited on a substrate 310. The inset image is a crystal structure image of [−111]-oriented $FA_{0.6}MA_{0.4}PbI_{(3-y)}Cl_y$ perovskite.

(FIG. 5A) (−111) plane measured at 14.0°, (FIG. 5B) (−120) plane measured at 19.8°, (FIG. 5C) (021) plane measured at 24.3°, and (FIG. 5D) (−222) plane measured at 28.2° of uniaxial-oriented perovskite. The 2theta values of (−120) and (021) planes in the perovskite film were determined from the XRD patterns of randomly oriented $FA_{0.6}MA_{0.4}PbI_3$ perovskite prepared using a conventional solvent-engineering process.

FIG. 8A illustrate the relative {−111}-oriented crystallinity of $FA_xMA_{(1-x)}PbI_{(3-y)}Cl_y$ perovskite film as a function of (FAI-$PbI_2$) molar ratio, where "FA" refers formamidinium. Squares indicates the randomly oriented $FA_{0.6}MA_{0.4}PbI_3$ perovskite film prepared by conventional solvent engineering; diamonds represents pure $MALI_{(3-x)}Cl_x$ and $FAPbI_3$ perovskites. Inset images illustrate 2-D XRD patterns for determining degree of {−111}-oriented crystallinity. FIG. 8B illustrates the annealing temperature dependence of texture coefficients of {−111} planes using different precursors: 0.6FAI-2.4MAI-$PbCl_2$ (black squares); 0.6FAI-0.4MAI-$PbI_2$ (diamonds); and 0.6(FAI-$PbI_2$)-0.4(3MAI-$PbCl_2$) (circles), wherein "MA" refers to methylammonium. FIGS. 8C-8G illustrate SEM images and schematics of the topotactic-oriented attachment (TOA) process. Samples were annealed at 130° C. for (FIG. 8C) 10 seconds (FIG. 8D) 30 seconds (FIG. 8F) 180 seconds, and (FIG. 8G) 300 seconds. FIG. 8E illustrates a schematic of a detailed TOA process at the interface between perovskite and intermediate phase.

FIG. 20A illustrates J-V curves of the TOA- and SE-PSCs with 50-ms scan delay time under AM 1.5G illumination using 0.12-cm$^2$ black metal aperture. FIG. 20B illustrates EQE spectra and integrated J$_{sc}$. FIG. 20C illustrates stabilized photocurrent density and PCE of TOA- and SE-PSCs biased at 0.83 V and 0.93 V, respectively. FIG. 20D illustrates scan rate (delay time) dependence of forward- and reverse-scan PCEs for TOA- and SE-PSCs. PCEs were normalized to that obtained from reverse scan with 50-ms delay time.

FIG. 22A illustrates independent certification of typical uniaxial-oriented perovskite PHJ device from National Renewable Energy Laboratory (NREL) via asymptotical stabilization method, confirming a PCE of 17.17%. FIG. 22B illustrates the J-V curve of the same device measure at AM 1.5G illumination in our lab and forward- and reverse-scan PCEs. The certificated, stabilized PCE showed 96% of reverse-scan PCE.

FIG. 23A illustrates XRD patterns and FIG. 23B morphologies of MAPbI$_{(3-y)}$Cl$_y$, (FA$_{0.8}$MA$_{0.2}$)PbI$_{(3-y)}$Cl$_y$, and (Cs$_{0.05}$FA$_{0.55}$MA$_{0.4}$)Pb(I$_{(2.9-y)}$Br$_{0.1}$Cl$_y$) prepared by TOA process. The indexing labels mean the following: ^=perovskite phase, and *=FTO.

REFERENCE NUMBERS

Figure 1:
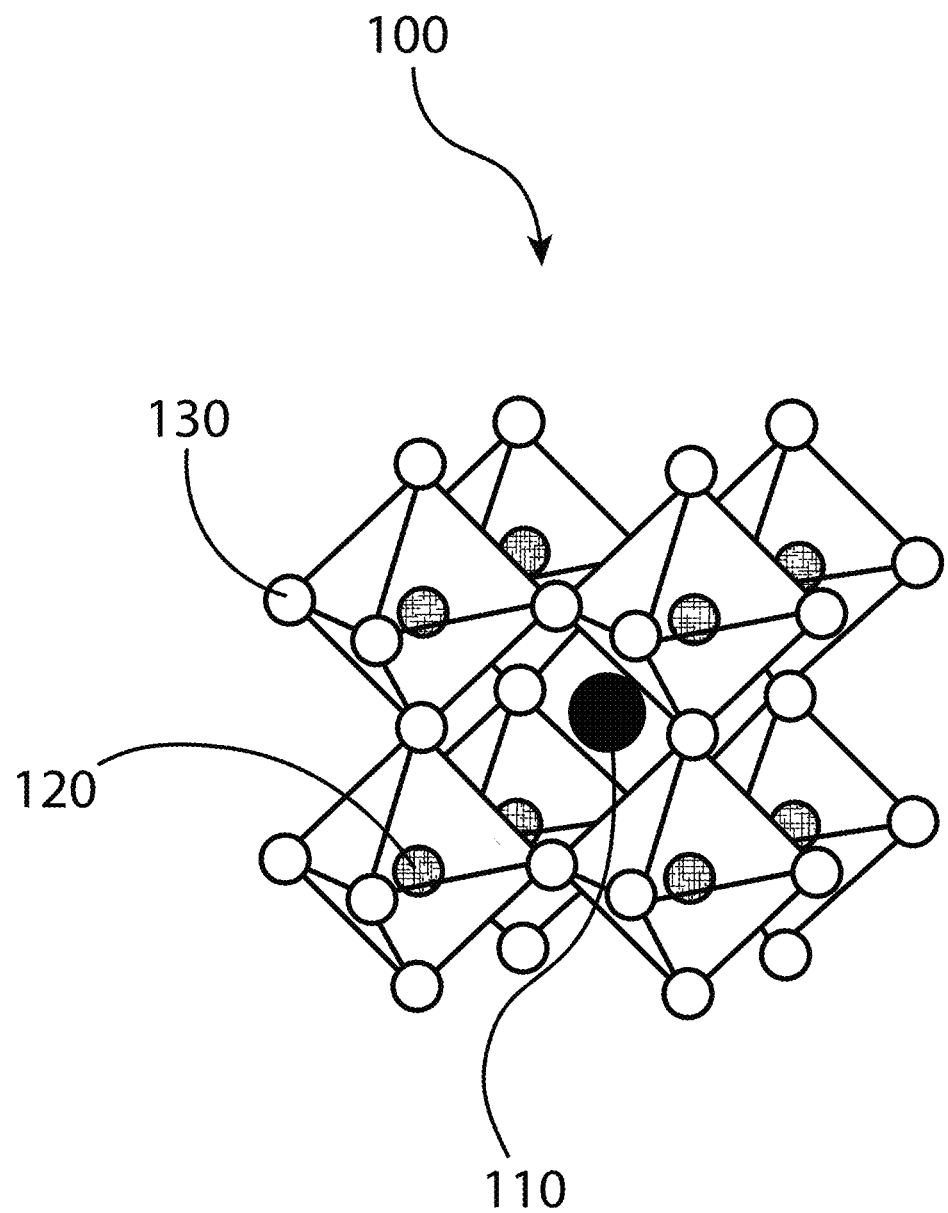
FIG. 1 illustrates an organic-inorganic perovskite crystal, according to some embodiments of the present disclosure.

100 . . . organic-inorganic perovskite crystal
110 . . . first cation
120 . . . second cation
130 . . . anion
200 . . . method
210 . . . preparing a first solution
220 . . . preparing a second solution
230 . . . mixing
240 . . . depositing
250 . . . treating
300 . . . device
310 . . . substrate
320 . . . first charge-transport layer
330 . . . organic-inorganic perovskite layer
340 . . . second charge-transport layer
350 . . . additional layer

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

The present disclosure relates to methods that enable the production of organic-inorganic perovskite crystals. As described herein, such methods are referred to as topotactic-oriented attachment (TOA) processes or methods, which are shown to enable the growth of at least formamidinium-based (FA-based) organic-inorganic perovskite films, having physical properties that include (−111) uniaxial orientation, micron-grain morphology, high crystallinity, and low trap density (about 4×10$^{14}$ cm$^{-3}$). Organic-inorganic perovskites synthesized using these TOA methods are shown to possess un-precedented 9-GHz charge-carrier mobility (about 70.8 cm$^2$/V·s) via time-resolved microwave conductivity experiments—more than double what has been reported for various organic-inorganic polycrystalline perovskites—almost 300% higher than randomly oriented perovskite thin films made by other synthesis methods. In addition, planar perovskite solar cells (PSCs) using organic-inorganic perovskite films made by the TOA methods described herein are shown to have a power-conversion efficiencies (PCE); e.g. up to about 19.7% (stabilized PCE of 19.0%). The present disclosure demonstrates the versatility of the disclosed TOA processes for growing various organic-inorganic perovskite compositions, including triple-cation and mixed-halide organic-inorganic perovskite crystals and films. Some examples of organic-inorganic perovskite films produced by the TOA processing methods described herein include $FA_{0.6}MA_{0.4}PbI_{(3-y)}Cl_y$, $MAPbI_{(3-y)}Cl_y$, $FA_{0.8}MA_{0.2}PbI_{(3-y)}Cl_y$, where $0 \leq y \leq 3.0$, and $FA_{0.55}MA_{0.4}Cs_{0.05}PbI_{(2.9-y)}Br_{0.1}Cl_y$, where $0 \leq y \leq 2.9$.

Thus, the present disclosure relates generally to methods of making organic-inorganic perovskite crystals. In addition, the present disclosure relates to unique organic-inorganic perovskite crystals having unique physical property and performances metrics, as well as films and devices (e.g. solar cells) that incorporate the unique organic-inorganic perovskite crystals. FIG. 1 illustrates that organic-inorganic perovskite crystals 100 (as well as inorganic perovskite crystals) may organize into cubic/pseudocubic crystalline structures and may be described by the general formula $AMX_3$, where X is an anion 130 and A and M are first cations 110 and second cations 120, respectively, typically of different sizes (A typically larger than M). In a cubic unit cell, the second cation 120 resides at the eight corners of a cube, while the first cation 110 is located at the center of the cube and with twelve anions 130 centrally located between the second cations 120 along each edge of the unit cell. Typical inorganic perovskites include cesium halide perovskites such as $CsPbI_3$ and $CsPbBr_3$, and titanium oxide (calcium titanate) minerals such as, for example, $CaTiO_3$ and $SrTiO_3$. In some structures, the first cation 110 may include a nitrogen-containing organic compound such as an alkyl ammonium compound. The second cation 120 may include a metal and the anion 130 may include a halogen.

Additional examples of a first cation 110 include organic cations and/or inorganic cations. First cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of first cations 110 include methylammonium ($CH_3NH^{3+}$), ethylammonium ($CH_3CH_2NH^{3+}$), propylammonium ($CH_3CH_2CH_2NH^{3+}$), butylammonium ($CH_3CH_2CH_2CH_2NH^{3+}$), formamidinium ($NH_2CH=NH^{2+}$), and/or any other suitable nitrogen-containing organic compound. In other examples, a first cation 110 may include an alkylamine. Thus, a first cation may include an organic component with one or more amine groups, resulting in the formation of an organic-inorganic perovskite crystal 100. For example, a first cation 110 may be an alkyl diamine such as formamidinium ($CH(NH_2)_2$).

Examples of metallic second cations 120 include, for example, lead, tin, germanium, and or any other 2+ valence state metal that may charge-balance the organic-inorganic perovskite crystal 100. Examples for an anion 130 include halogens: e.g. fluorine, chlorine, bromine, iodine and/or astatine. In some cases, an organic-inorganic perovskite crystal 100 may include more than one anion 130, for example compositions having different halogens; chlorine and iodine, bromine and iodine, and/or any other suitable pairs of halogens. In other cases, an organic-inorganic perovskite crystal 100 may include two or more halogens of fluorine, chlorine, bromine, iodine, and/or astatine.

Thus, a first cation 110, a second cation 120, and an anion 130 may be selected within the general formula of $AMX_3$ to produce a wide variety of organic-inorganic perovskite crystals 100, including, for example, methylammonium lead triiodide ($CH_3NH_3PbI_3$), and mixed organic-inorganic perovskites such as $CH_3NH_3PbI_{3-x}Cl_x$, and $CH_3NH_3PbI_{3-x}Br_x$. So, an organic-inorganic perovskite crystal 100 may have more than one halogen element, where the various halogen elements are present in none integer quantities; e.g. where x varies from 0 to 3 in more than just integer values; e.g. 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure.

As stated above, the first cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like. The methods provided herein, describe methods for producing organic-inorganic perovskites having compositions and components as described above, where the resultant organic-inorganic perovskites include a plurality of crystals that are all significantly oriented in when direction (e.g. across the width of an organic-inorganic perovskite film).

Figure 2:
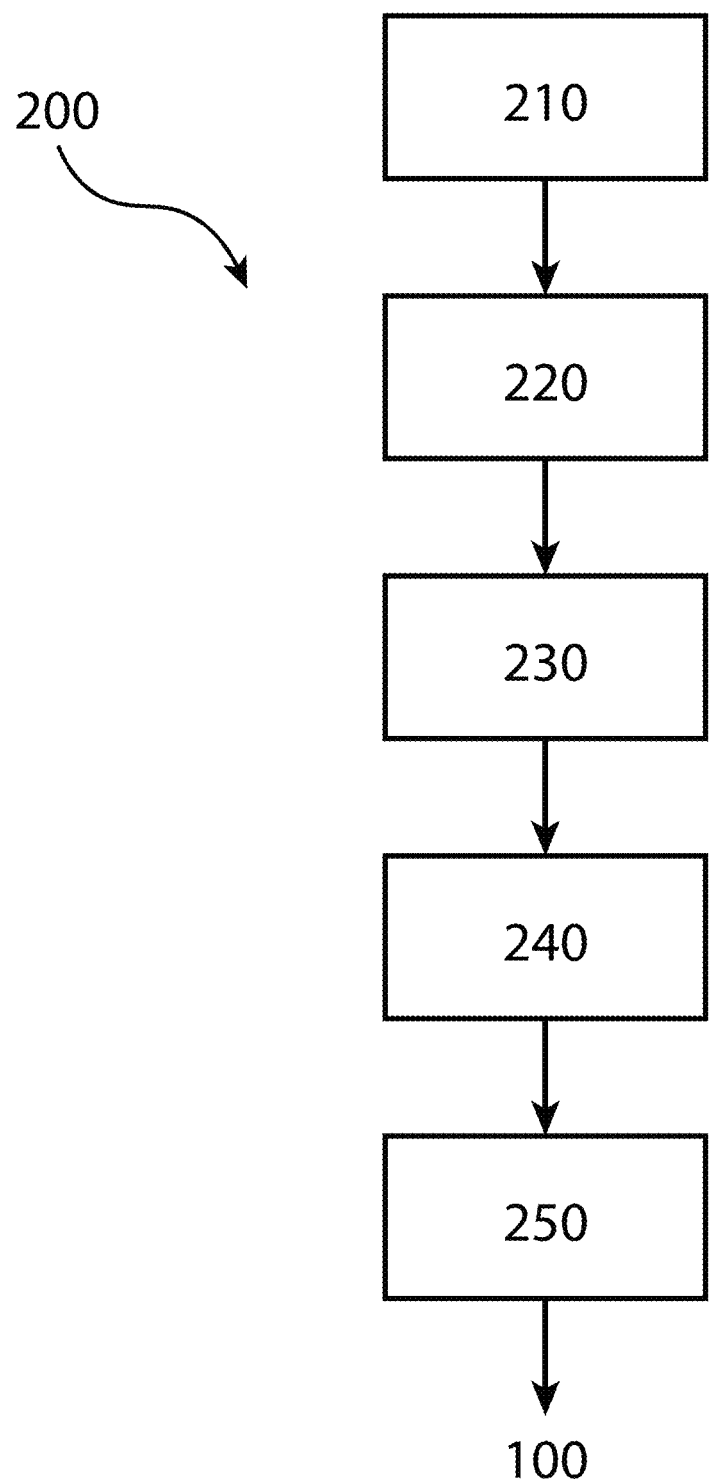
FIG. 2 illustrates a topotactic-oriented attachment (TOA) method for producing organic-inorganic perovskite crystals substantially oriented along the (−111) direction, according to some embodiments of the present disclosure.

FIG. 2 summarizes a TOA method 200 for synthesizing organic-inorganic perovskite materials (e.g. crystals, films, and/or devices), according to some embodiments of the present disclosure. In particular, the method 200 summarizes an example of a TOA method for producing organic-inorganic perovskite crystals that are significantly oriented relative to a single axis direction, with detailed examples of both TOA methods and the resultant organic-inorganic perovskite materials provided below. Thus, in the example of FIG. 2, the TOA method 200 begins with the preparing 210 of a first solution (solution not shown). The first solution may include a first organic salt ($A^1X^1$) and a first metal salt ($M^1(X^2)_2$) in a first solvent such that the first organic salt (not shown in FIG. 2) and the first metal salt (not shown) may be present at a first ratio between about 0.5 to 1.0 and about 1.5 to 1.0. As used herein, the term "about" refers to statistical variation at the endpoints of a given range. So, to provide a numerical definition for the term "about", the term "about" refers to a statistical variation that does not exceed 5% of the absolute value of an endpoint value.

In some embodiments of the present disclosure, the preparing 210 of the first solution may produce a first solution where the first organic salt and the first metal salt may be present at a first ratio of about one to one. The method 200 may continue with the preparing 220 of a second solution (not shown in FIG. 2). A second solution may include a second organic salt ($A^2X^3$) and a second metal salt ($M^2Cl_2$) in a second solvent such that the second organic salt (not shown in FIG. 2) and the second metal salt (not shown) may be present at a second ratio between about 2.0 to 1.0 and about 4.0 to 1.0. In some embodiments of the present disclosure, the preparing 220 of the second solution may produce a second solution where the second organic salt and the second metal salt may be present at a second ratio of about three to one. The TOA method 200 may then continue with the mixing 230 of the first solution and the second solution to produce a third solution (not shown in FIG. 2) having a third ratio of the first solution to the second solution between about 0.5 to 1.0 and about 2.0 to 1.0. In some embodiments of the present disclosure, the mixing 230 of the first solution with the second solution to produce a third solution may be at a third ratio of about 1.5 to 1.0. In so doing, the third solution, the final target solution to be utilized in the subsequent method steps, may have a final ratio of $(A^1X^1):(M^1(X^2)_2)$ to $(A^2X^3):(M^2Cl_2)$ between about 0.5 to 1.0 and about 2.0 to 1.0. In some embodiments of the present disclosure, the third (final target) solution may have a final ratio of $(A^1X^1):(M^1(X^2)_2)$ to $(A^2X^3):(M^2Cl_2)$ of about 1.5 to 1.0.

Although, the example of FIG. 2 illustrates a TOA method 200 that prepares two separate solutions (a first solution and a second solution), followed by the mixing of the two separate solutions to produce a third solution, it should be understood that the third solution, the final target solution, may also be produced in a single step. In such an example, one or more solvents may be utilized in a single, final target solution with the first organic salt, the second organic salt, the first metal salt, and the second metal salt such that the first organic salt and the first metal salt are present at ratio between about 0.5 to 1.0 and about 1.5 to 1.0. In addition, the second organic salt and the second metal salt may be included in the final target solution such that the second organic salt and the second metal salt may be present at a ratio between about 2.0 to 1.0 and about 4.0 to 1.0. As a result, the final target solution may have a final ratio of $(A^1X^1):(M^1(X^2)_2)$ to $(A^2X^3):(M^2Cl_2)$ between about 2.0 to 1.0 and about 0.5 to 1.0. In some embodiments of the present disclosure, the final target solution may have a final ratio of $(A^1X^1):(M^1(X^2)_2)$ to $(A^2X^3):(M^2Cl_2)$ of about 1.5 to 1.0. As used herein, unless specified otherwise, all ratios are on a molar basis.

In some embodiments of the present disclosure, $A^1$ and/or $A^2$ may include at least one of methylammonium (MA), formamidinium (FA), diethylammonium, dimethylammonium, ethane 1,2-diammonium, ethyl ammonium, methylammonium, iso-butylammonium, n-butylammonium, t-butylammonium, iso-propylammonium, n-propylammonium, propane 1,3-diammonium, n-octylammonium, phenylethylammonium, polyethylenimine, cesium, and/or rubidium. Thus, $A_1$ and/or $A_2$ may include at least one of the first cations 110 described above and shown in FIG. 1. $M^1$ and/or $M^2$ may include at least one of lead, tin, silver, and/or bismuth. Thus, $M^1$ and/or $M^2$ may include at least one of the second cations 120 described above and shown in FIG. 1. All of those chemicals may be dissolved in a pure or mixed organic solvent based on at least one of dimethylformamide (DMF), dimethylacetamide (DMA), butyrolactone (GBL), dimethyl sulfoxide (DMSO), and/or N-methyl-2-pyrrolidone (NMP). The concentration of any one of the components contained in the starting solutions and/or the final target solution may be between about 0.1 M and about 2 M. Solutions may be agitated at a temperature between about 25° C. and about 80° C. for a time period between about 0.5 hours and about 12 hours.

Referring again to FIG. 2, the example TOA method 200 illustrated may proceed with the depositing 240 of the final target solution onto a substrate (not shown in FIG. 2). The depositing 240 may be accomplished by a variety of solution processing methods such as at least one of spin coating, blade coating, curtain coating, dip coating, etc. The depositing 240 will result in the application of a liquid coating of the final target solution deposited onto a surface of the substrate. In some embodiments of the present disclosure, such a coating may have a thickness between about 100 nm and 3000 nm.

The TOA method 200 may continue with a treating 250 of the liquid coating on the substrate, for example the thermal treating of the liquid coating, resulting in the transformation of the liquid coating to a solid film and/or layer of organic-inorganic perovskite crystals. In some embodiments of the present disclosure, the treating 250 may be completed at a temperature of about 120° C. or higher, or between about 120° C. and about 200° C. In some embodiments of the present disclosure, the treating 250 may be completed for a time duration of about 5 minutes or longer, or between about 5 minutes and about 60 minutes. The treating 250 may be completed in an inert environment, for example in a nitrogen gas and/or argon gas environment. In general, the resultant organic-inorganic perovskite crystals formed may be defined by the composition

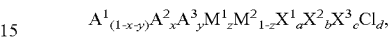

where x, y, and z are each between zero and one inclusively, and a+b+c+d=3.0. For example, an organic-inorganic perovskite crystal made by the TOA methods described herein may include $FA_{0.6}MA_{0.4}PbI_{(3-y)}Cl_d$ ($A^1$=FA, $A^2$=MA, y=0, $M^1$=Pb, $X^1$=I, b=c=0, x=0.4, and y=0), $MAPbI_{(3-y)}Cl_d$ ($A^1$=MA, $M^1$=Pb, $X^1$=I, b=c=0, x=y=0) and/or $FA_{0.8}MA_{0.2}PbI_{(3-d)}Cl_d$ ($A^1$=FA, $A^2$=MA, $M^1$=Pb, $X^1$=I, b=c=0, x=0.2, and y=0), where d is between zero and three, inclusively, for all three examples. In some embodiments of the present disclosure, an organic-inorganic perovskite crystal made by the TOA methods described herein may include $FA_{0.55}MA_{0.4}Cs_{0.05}PbI_{(3.0-0.1,1-d)}Br_{0.1}Cl_d$ ($A^1$=FA, $A^2$=MA, $A^3$=Cs, $M^2$=Pb, $X^1$=I, $X^2$=Br, x=0.4, y=0.05, b=0.1, c=0), where d is between zero and about 2.9, inclusively, due to the inclusion of bromide in the example of an organic-inorganic perovskite crystal. For some embodiments of the present disclosure, for TOA processing, a final precursor solution may have a final ratio of $(A^1X^1):(M^1(X^2)_2)$ to $(A^2X^3):(M^2Cl_2)$ between about 1.0 to 1.0 and about 1.5 to 1.0, respectively.

As described herein, the organic-inorganic perovskite crystals resulting from examples of the TOA method described herein have a variety of unique characteristics, including crystals having an aspect ratio (length dimension divided by width dimension) between about 1.5 and 50, with a length dimension between about 100 nm and about 3000 nm. Further, the organic-inorganic perovskite crystals may be significantly oriented such that the length dimension of each individual crystal is substantially aligned relative to a reference axis and/or plane. For example, relative to a planar substrate, the individual crystals may be aligned substantially perpendicular to the substrate. Relative to the thickness dimension of a film constructed of a plurality of organic-inorganic perovskite crystals, the individual crystals may be aligned substantially parallel with the thickness dimension. In crystallographic terms, organic-inorganic perovskite crystals produced by embodiments of the TOA methods described herein demonstrate high crystallinity in the (−111) with uniaxial orientation, with low trap densities (as low as $4 \times 10^{14}$ cm$^{-3}$), compared with that of previous reported values (about $10^{16}$-$10^{17}$ cm$^{-3}$), and grain sizes between about 2 μm and about 5 μm.

Figure 3:
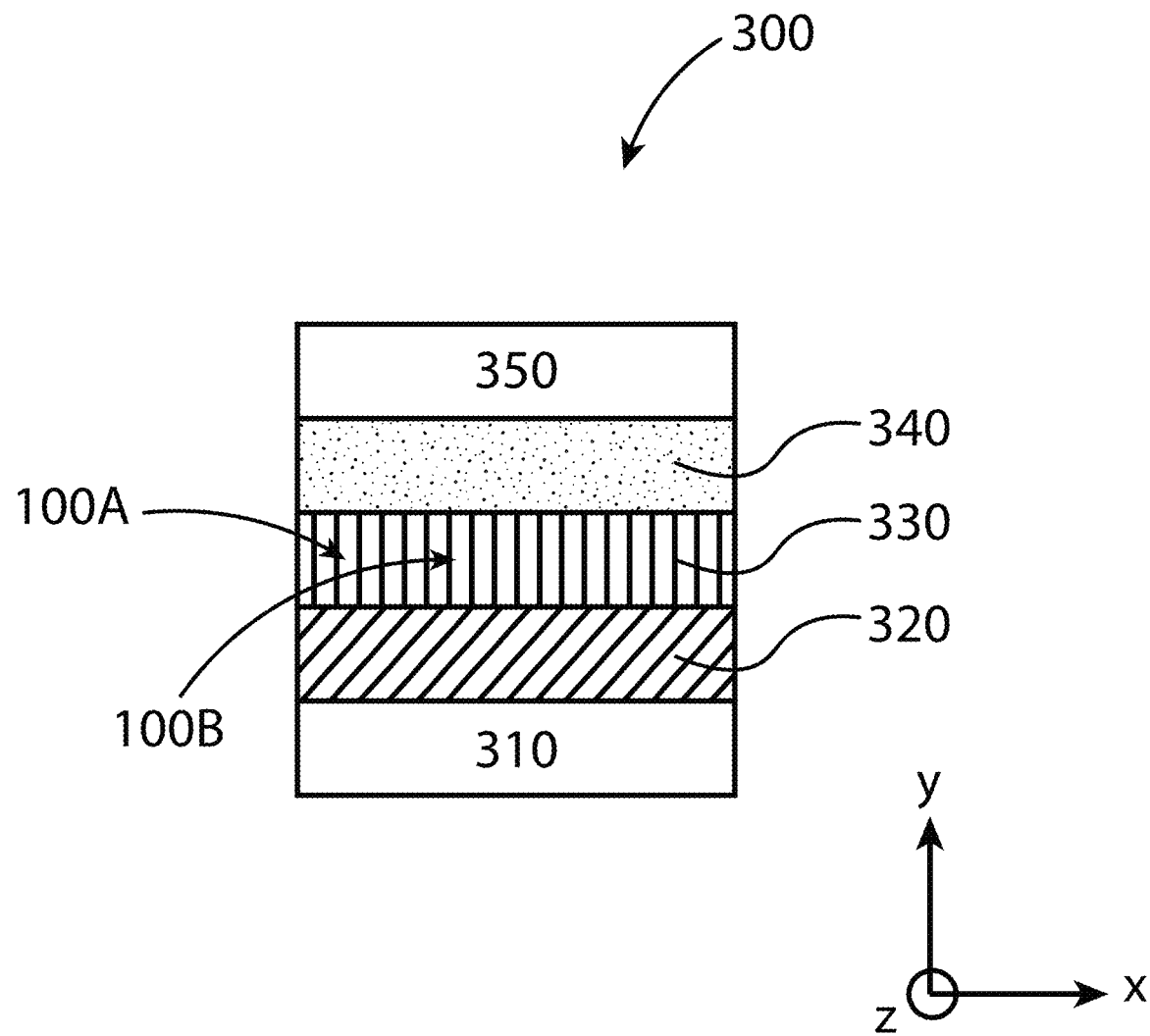
FIG. 3 illustrates a device that incorporates a film of organic-inorganic perovskite crystals substantially oriented along the (−111) direction, according to some embodiments of the present disclosure.

FIG. 3 illustrates an example of a device 300 that incorporates an organic-inorganic perovskite layer 330 made from a plurality of organic-inorganic perovskite crystals (only two of the plurality called out with reference numbers 100a and 100b) produced by embodiments of the TOA method described herein. This device 300 includes a substrate 310, a first charge transport layer 320 (e.g., TiO$_2$, SnO$_2$, and/or ZnO layer), the organic-inorganic perovskite layer 330, a second charge transport layer 340 (e.g., spiro-OMeTAD, poly[bis(4-phenyl)(2,4,6-trimethylphenyl)

amine] (PTAA), and/or poly(3,4-ethylenedioxythiophene)-poly(styrenesulfonate) (PEDOT:PSS)), and an additional layer 350 (e.g. a conducting layer of gold, silver, and/or copper). FIG. 3 illustrates an embodiment where the lengths (versus widths) of the individual organic-inorganic perovskite crystals (100a and 100b) are aligned substantially parallel with the y-axis reference axis (e.g. thickness of the substrate), and substantially perpendicular to the width dimension (x-axis) and length dimension (z-axis) of the substrate 310.

Referring again to FIG. 3, a substrate 310 such as fluorine-doped tin oxide (FTO), was deposited with a compact $TiO_2$ layer having a thickness between about 10 nm and about 60 nm as an electron-transport layer. This layer was deposited by spray pyrolysis at 450° C. using 0.2 M titanium diisopropoxide bis(acetylacetonate) in 1-butanol solution, followed by 450° C. annealing for about 1 hour. An organic-inorganic perovskite layer 330 was deposited in a dry nitrogen box using a spin coating method. In this example, the spin coating was a two-step procedure with the first step completed at 500 rpm for about 15 seconds, and the second step completed at 2000 rpm for about 45 seconds. For the control sample (by solvent engineering (SE))), a precursor solution prepared by a two-step spin coating procedure at 1,000 rpm and 4,000 rpm for 60 seconds and 40 seconds, respectively. At 30 seconds of the second spin-coating step, 0.7 mL of diethyl ether was drop-casted on the spinning substrate (e.g. solvent engineering (SE)). After the spin coating, the resultant liquid coatings were annealed at about 50° C. for about 5 minutes in a first thermal treating step, followed sequentially, by a second thermal treating step at 130° C. for about 10 minutes to form the final organic-inorganic perovskite layer 330. After annealing, 60 μL of a hole-transport layer (HTL) solution (72 mg of spiro-OMeTAD, 29 μL of 4-tert-butylpyridine, 17 μL of Li-TFSI solution (520 mg of Li-TFSI in 1 mL acetonitrile) and 20 μL of FK102 Co(III) TFSI salt (300 mg FK102 Co(III) TFSI in 1 mL acetonitrile) in 1 mL of chlorobenzene) was spin-coated on the perovskite/c-$TiO_2$/FTO device at 3,500 rpm for about 30 seconds. Finally, a 130-nm Ag layer was deposited on the HTL by thermal evaporation with 0.15 nm s$^{-1}$ deposition rate, resulting in the completed device.

Figure 4A:
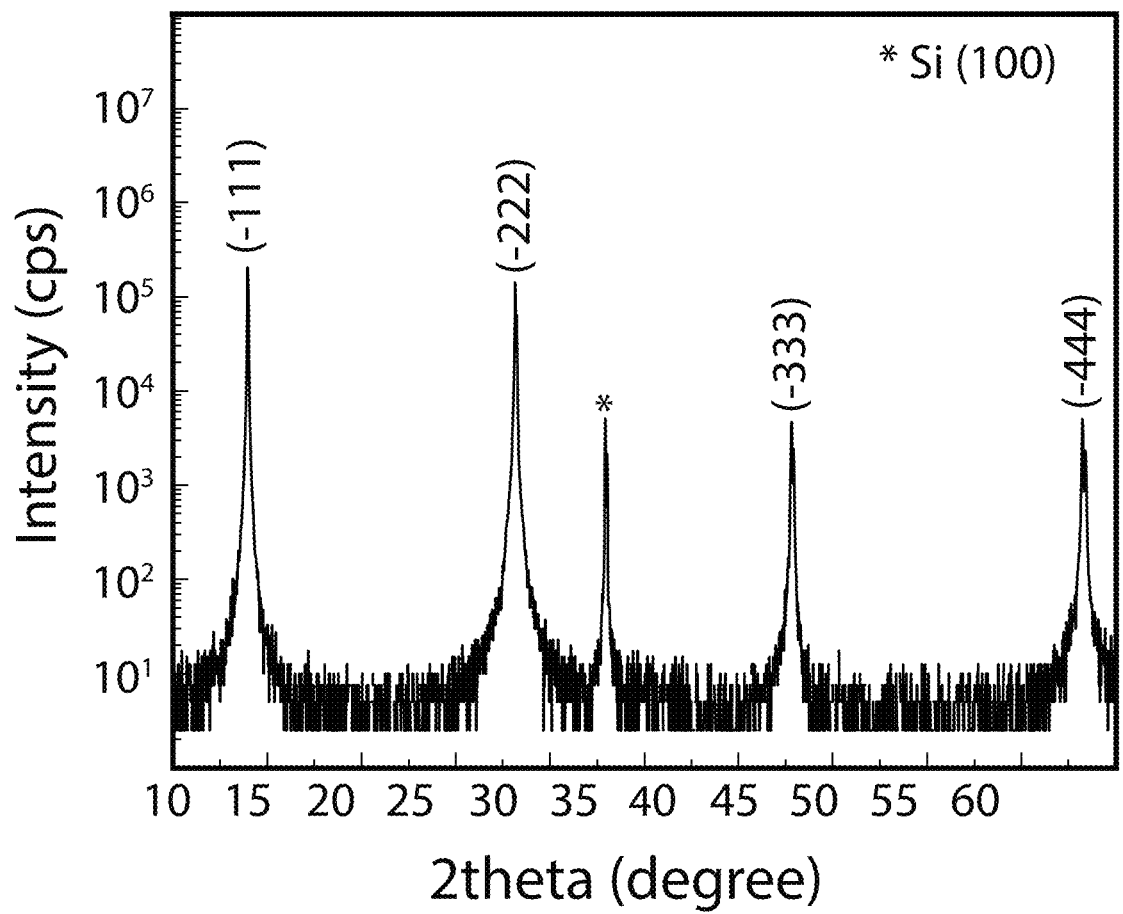
FIGS. 4A through 4D illustrate the crystal structure and morphological property of a (−111) uniaxial-oriented organic-inorganic perovskite thin film, according to some embodiments of the present disclosure.
Figure 4B:
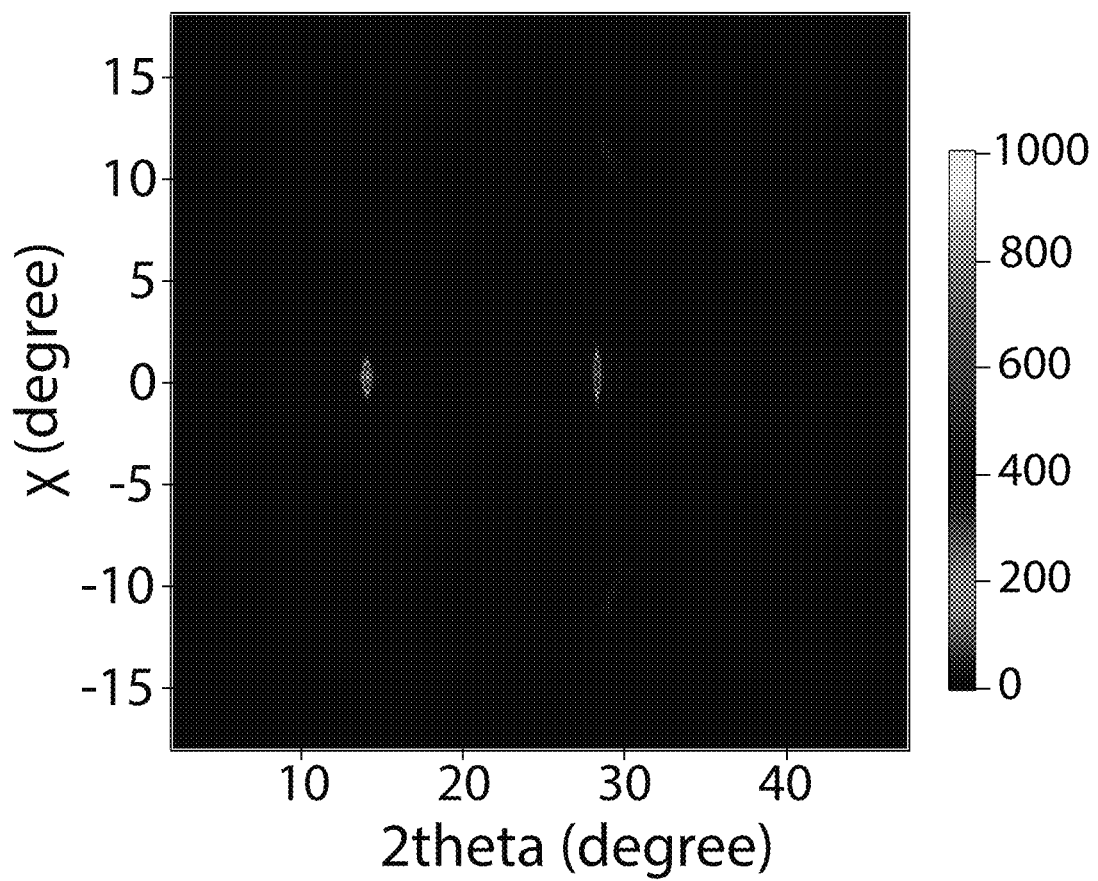

Structural information of thin films of organic-inorganic perovskite crystals films was obtained through analysis of their X-ray diffraction (XRD) patterns. In FIG. 4A, the XRD patterns of an $FA_{0.6}MA_{0.4}PbI_{3-y}Cl_y$ organic-inorganic perovskite crystal layer deposited on a (100) silicon substrate by a TOA-method only exhibited planes of P3m1 trigonal structure, suggesting that the TOA-deposited organic-inorganic perovskite was highly oriented along a [−111] uniaxial direction. Two-dimensional XRD (2D-XRD) profiles shown in FIG. 4B further illustrate the uniaxial-orientation feature through the two bright spots at 14.0° and 28.2° (corresponding, respectively, to the diffractions from the (−111) and (−222) planes). Pole figures of the organic-inorganic perovskite crystals produced by TOA method (such a perovskite hereinafter also referred to generally as a "TOA-perovskite") also confirm the uniaxial [−111]-orientation with the strong single-spots of (−111) and (−222) planes and clear ring-shape of (−120) and (021) planes (see FIGS. 5A-5D).

Figure 4C:
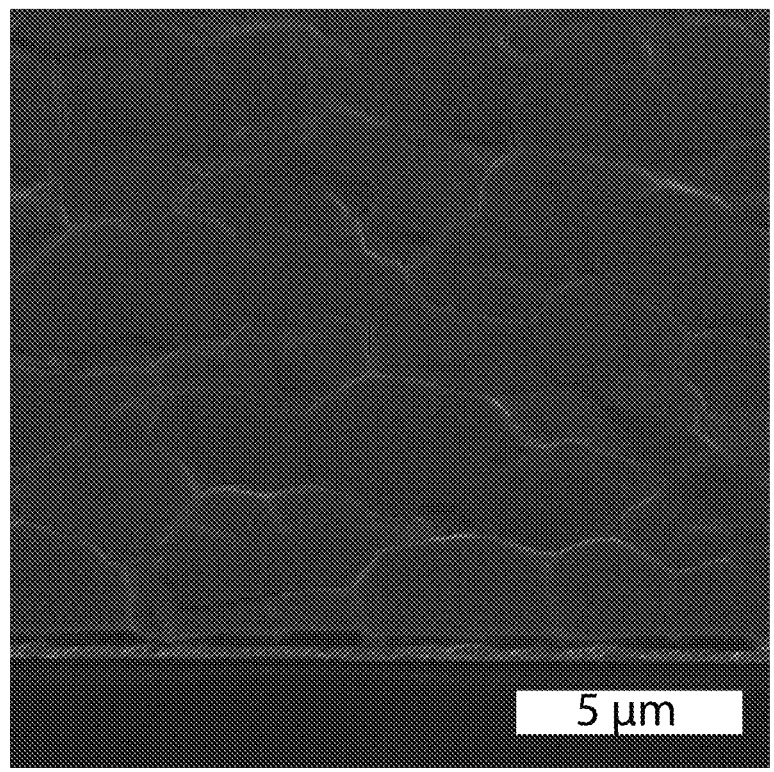
Figure 4D:
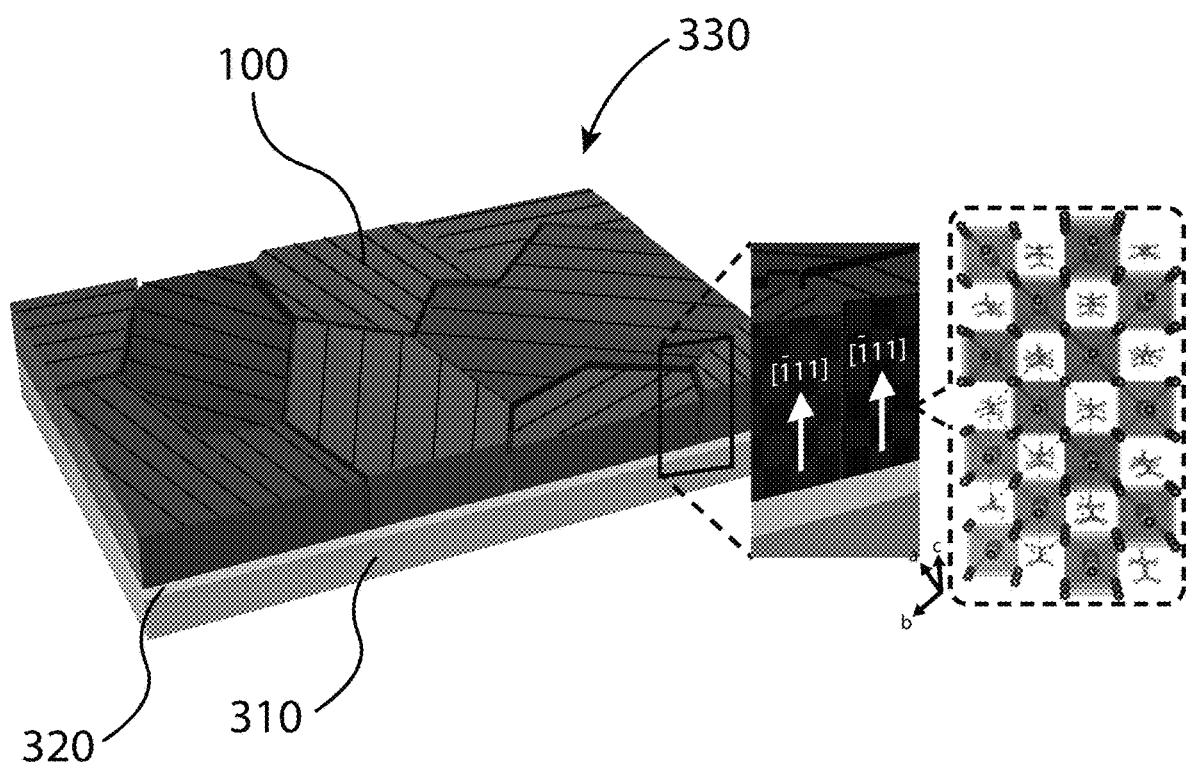
Figure 5A:
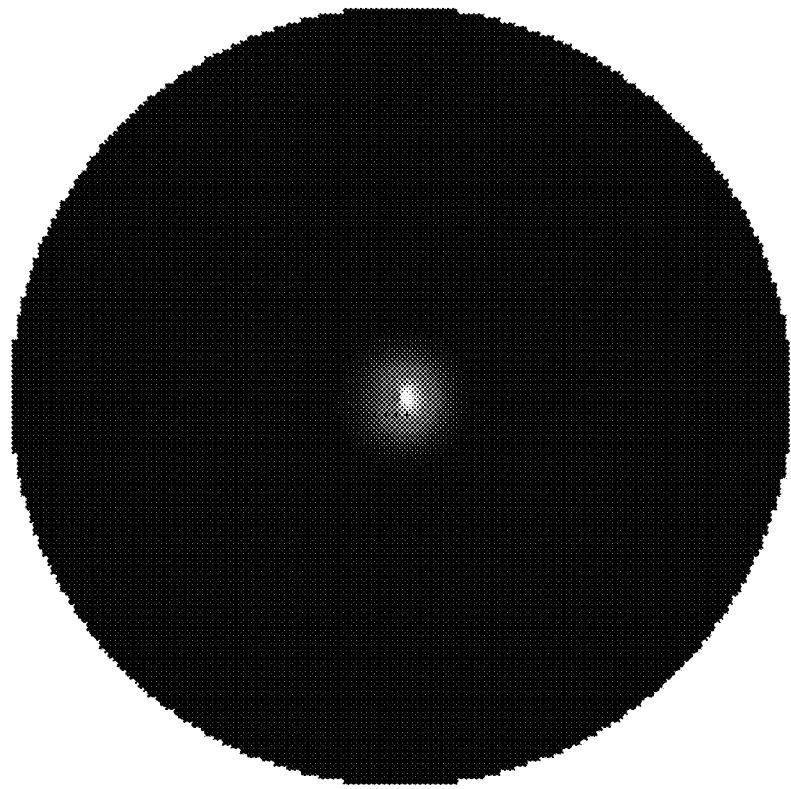
FIGS. 5A through 5D illustrate pole figures of a (−111) uniaxial-oriented organic-inorganic perovskite thin film, according to some embodiments of the present disclosure.
Figure 5B:
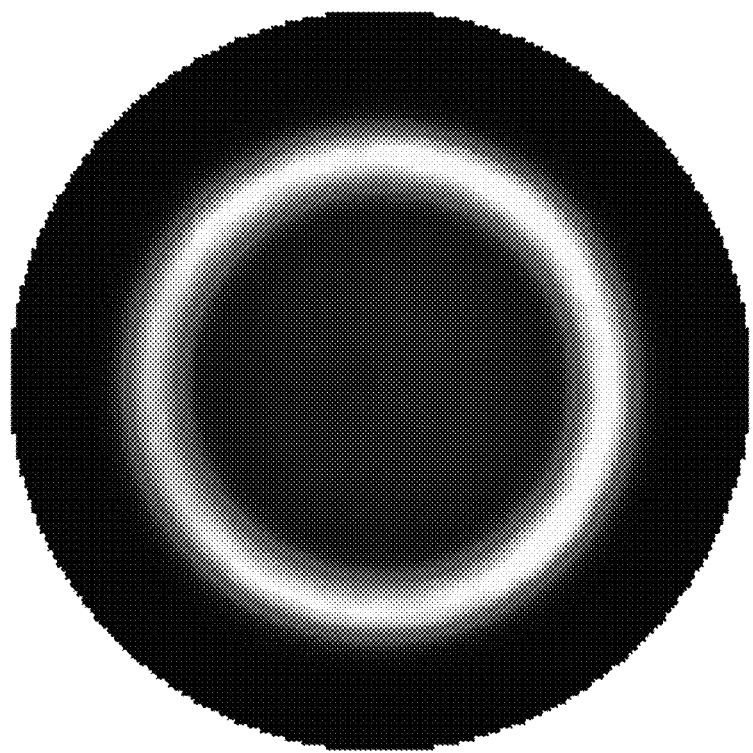
Figure 5C:
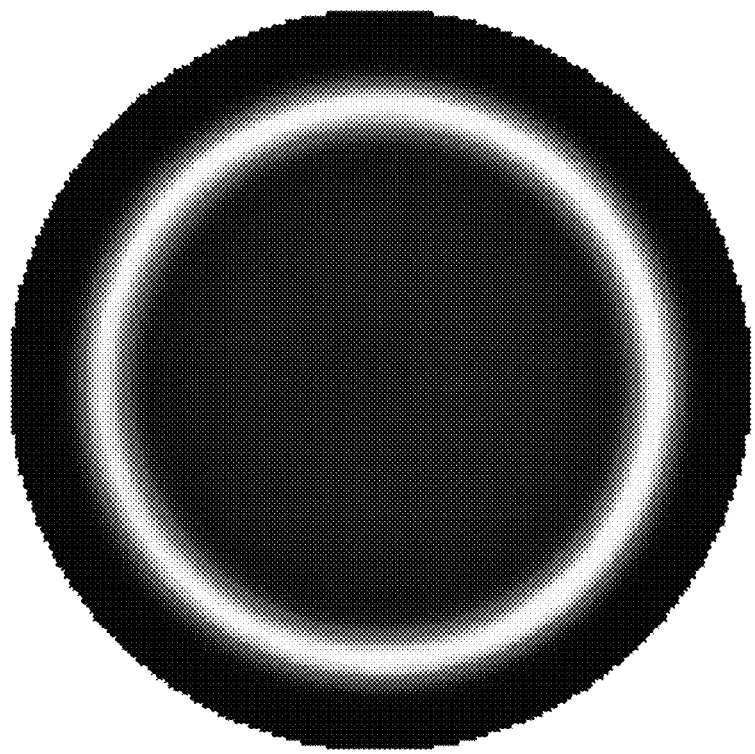
Figure 5D:
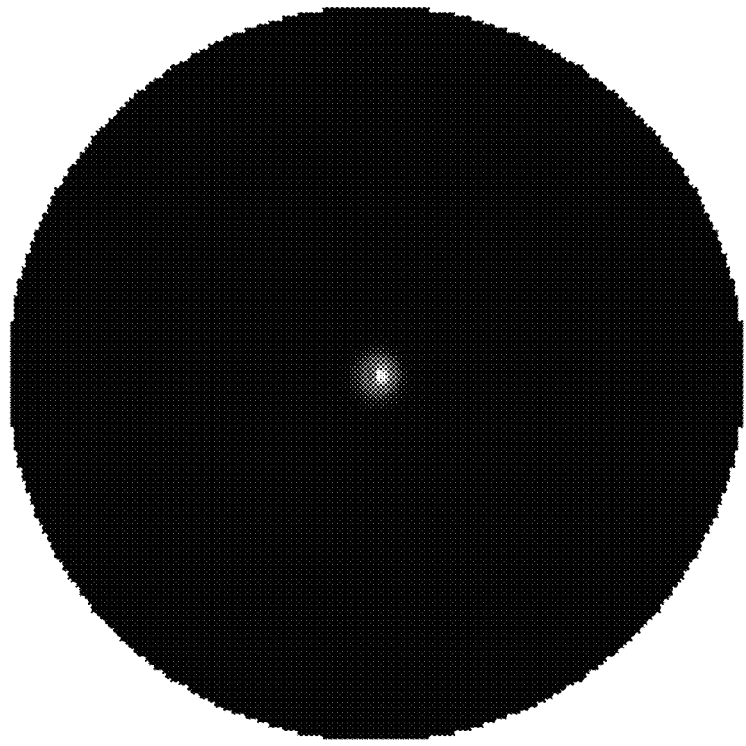
Figure 6:
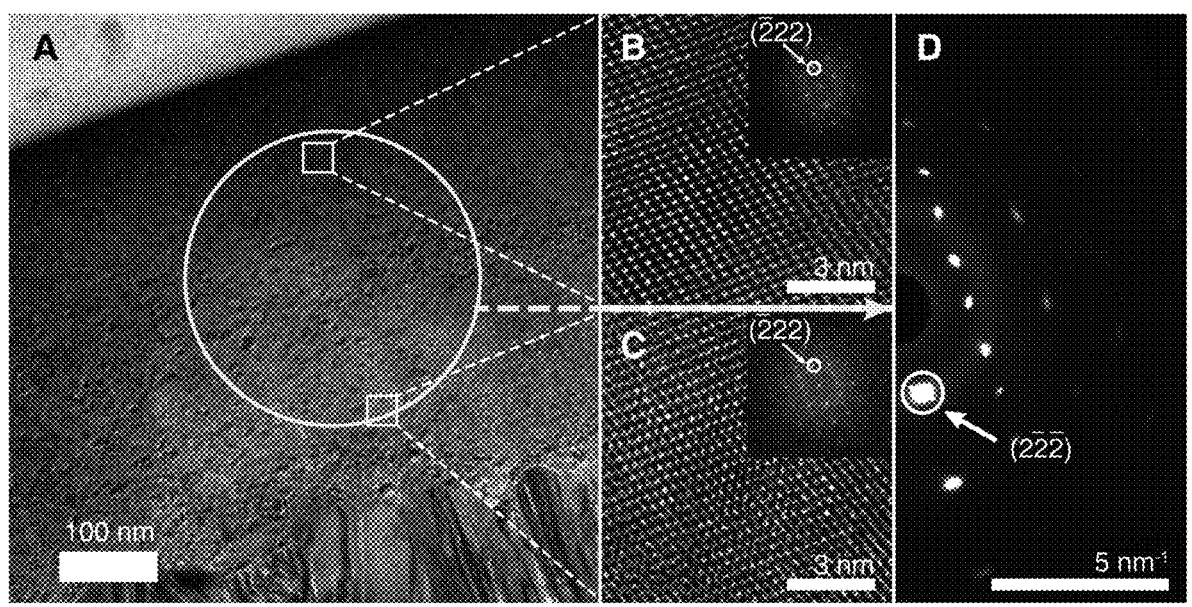
FIG. 6 illustrates the cross-sectional crystal structure of a (−111) uniaxial-oriented organic-inorganic perovskite thin film, according to some embodiments of the present disclosure. (Panel A) Low-magnification image of cross-sectional transmission electron microscopy (TEM) image and high-resolution TEM (HRTEM) images of (Panel B) top and (Panel C) bottom regions of Panel A. The inset images of each HRTEM image are the fast Fourier-transform (FFT) images. (Panel D) The selected-area electrical diffraction (SAED) pattern obtained by 260-nm aperture corresponding with the marked area in FIG. 6 Panel A using the circle.

FIG. 4C presents the tilted SEM image of an example TOA-perovskite deposited on c-$TiO_2$/F-doped $SnO_2$ (FTO) substrate. FIG. 4C shows that the perovskite layer is fairly smooth and densely packed with about 2-5-μm-sized grains. The cross-sectional crystallographic information of this example TOA-perovskite was examined using high-resolution transmission electron microscopy (HRTEM), as shown in FIG. 6. No perovskite grain boundaries parallel to the substrate were found (see FIG. 6 Panel A). Two selected (top and bottom) regions of the organic-inorganic perovskite crystal film show identical lattice spacing of 3.15 Å from the (−222) planes (see FIG. 6 Panels B and C respectively). Their fast Fourier-transform (FFT) patterns (see insets of FIG. 6 Panels B and C respectively) match well with the selected-area diffraction patterns (see FIG. 6 Panel D; the circled region in FIG. 6 Panel A). These crystallographic and morphological results strongly indicate that TOA-derived organic-inorganic perovskite crystal layer is composed substantially of (−111) uniaxial-oriented crystals aligned perpendicular to the substrate, and that other planes such as (−120) and (021) are randomly oriented along in-plane directions, as illustrated in FIG. 4D.

Figure 7:
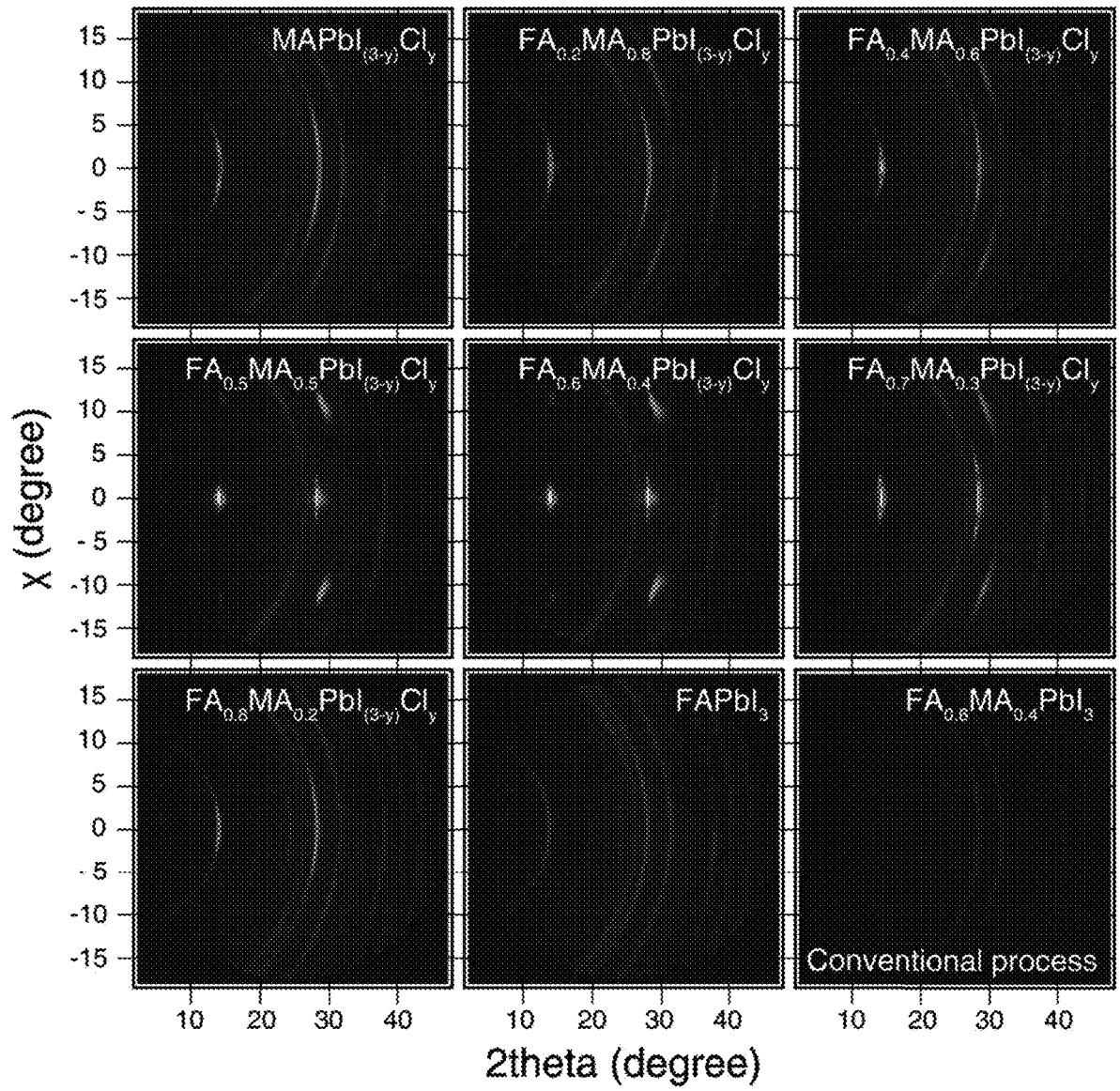
FIG. 7 illustrates complete 2D-XRD patterns of the $FA_xMA_{(1-x)}PbI_{(3-y)}Cl_y$ TOA-produced organic-inorganic perovskite crystals with x=0 to 1 formed on FTO substrates for determining $DCO_{\{-111\}}$, according to some embodiments of the present disclosure. The $MAPbI_{(3-x)}Cl_x$ (x=0) and $FAPbI_3$ (x=1) perovskites were annealed at 100° C. and 150° C. for 50 and 10 min, respectively. Other $FA_xMA_{(1-x)}PbI_{(3-y)}Cl_y$ perovskite were prepared using a two-step annealing process at 50° C. and 130° C. For comparison, the $FA_{0.6}MA_{0.4}PbI_3$ perovskite films were also prepared via a conventional solvent-engineering (SE) process. All images are drawn with log scales.

Thin films made of organic-inorganic perovskite crystals were prepared by a solution processing method, e.g. spin-coating a precursor starting solution containing $x(FAI-PbI_2)$:$(1-x)(3MAI-PbCl_2)$ ($0 \leq x \leq 1$), where FAI was the first organic salt, $PbI_2$ the first metal salt, MAI the second organic salt, and $PbCl_2$ the second metal salt. Further, FAI and $PbI_2$ were mixed at a first ratio of about one to one, and MAI and $PbCl_2$ were mixed at a second ratio of about three to one. Finally, the ($FAI-PbI_2$) pair was mixed with the ($3MAI-PbCl_2$) pair at a ratio that varied from 1:0 to 0:1. After spin-coating of the resultant solution on the substrate, resulting in a liquid coating of the solution on the substrate, the substrate and liquid coating were thermally treated (e.g. annealed) without using any additional solvent removal step. 2D-XRD patterns of the resultant TOA-perovskite thin films with varying x, where x refers to $x(FAI-PbI_2)$:$(1-x)(3MAI-PbCl_2)$ ($0 \leq x \leq 1$), show a clear correlation between organic-inorganic perovskite composition and crystallographic properties (see FIG. 7). To capture both crystallinity and orientation, the degree of crystallographic orientation (DCO) relative to the {−111} planes was defined, denoted as $DCO_{\{-111\}}$.

Figure 8A:
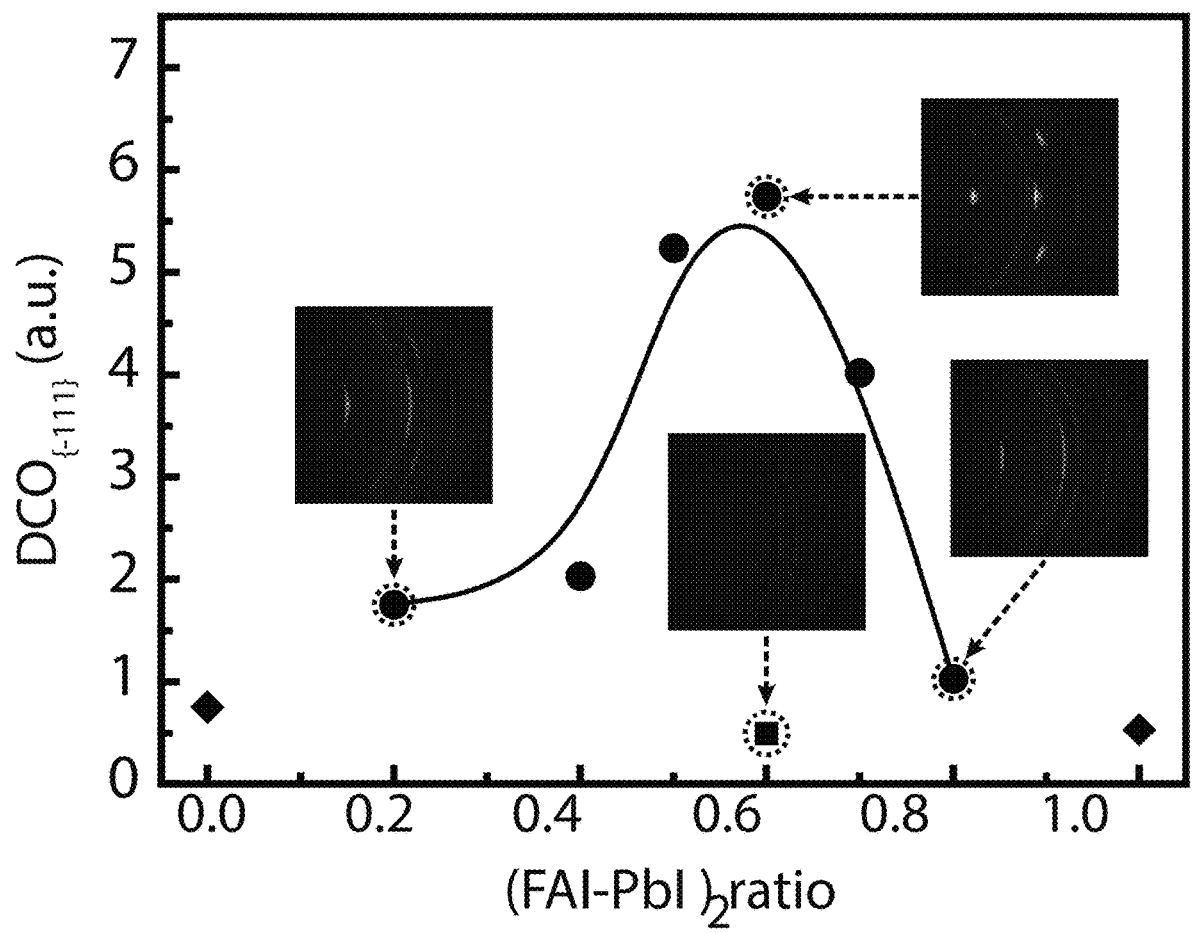
FIGS. 8A through 8G illustrate crystallographic orientation and growth mechanism information for TOA-produced organic-inorganic perovskite crystals, according to some embodiments of the present disclosure.

Briefly, $DCO_{\{111\}}$ measures the proportion of the crystallinity of the oriented {−111} planes (e.g., (−111) and (−222) planes), and it is determined from the integrated intensities of each plane over the entire χ range of 2D-XRD patterns using Equation 2 (see below). FIG. 8A shows that the $DCO_{\{111\}}$ values of the TOA-produced organic-inorganic perovskite crystals depend strongly on the fraction x of (FAI-$PbI_2$) component pairing provided in the starting solution. $DCO_{\{111\}}$ values increased from a value of about 2.0 for a starting solution targeting $FA_{0.4}MA_{0.6}PbI_{3-y}Cl_y$ to a value of about 5.2 for a starting solution targeting $FA_{0.5}MA_{0.5}PbI_{3-y}Cl_y$, and reached the maximum of about 5.7 for a starting solution targeting $FA_{0.6}MA_{0.4}PbI_{3-y}Cl_y$; $0 \leq y \leq 3.0$. In contrast, a perovskite film prepared by using solvent engineering (referred to hereinafter as a "SE-perovskite") with the same FA:MA ratio yielded a value for $DCO_{\{-111\}}$ of only 0.5. For the conventional mixed-halide $MAPbI_{(3-y)}Cl_y$ perovskite prepared using the recipe from Lee et al. (*Science* 338, 643-647 (2012)), the DCO along the preferred orientation [110]-direction is about 0.76. Thus, the high $DCO_{\{-111\}}$ value of the uniaxially oriented $FA_{0.6}MA_{0.4}PbI_{(3-y)}Cl_y$ perovskite indicates that the new TOA processing method not only enables (−111) uniaxial orientation, but also leads to a high degree of crystallinity of the organic-inorganic perovskite crystal film.

Figure 9:
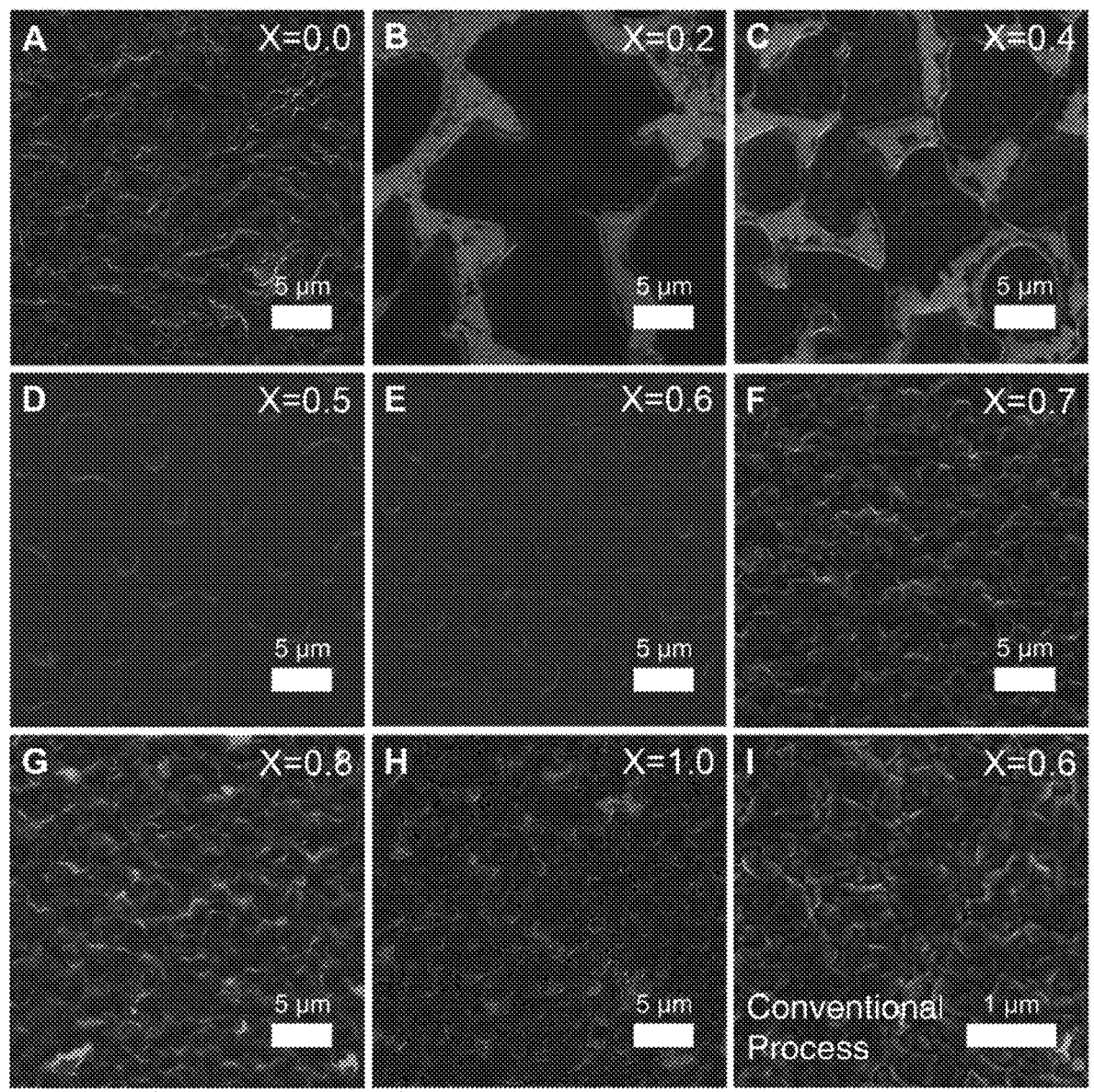
FIG. 9 illustrates the morphological evolution of the $FA_xMA_{(1-x)}PbI_{(3-y)}Cl_y$ (0≤x≤1) perovskite used for determining $DCO_{\{-111\}}$, according to some embodiments of the present disclosure.

SEM images (see FIG. 9) show that the $FA_xMA_{(1-x)}PbI_{(3-y)}Cl_y$ inorganic-organic perovskite crystal film morphology also depends on the ($FAI-PbI_2$) ratio x. With an increasing amount of the ($FAI-PbI_2$) pair in the precursor solution, the grain size decreased from about 25 μm (at x=0.2) to about 200 nm (at x=0.8) and the void space between grains also decreased concomitantly. When x reached between about 0.5 and about 0.6, the resulting organic-inorganic perovskite crystal films were dense and flat with large grains (between about 2 μm and about 5 μm). However, when x was further increased to 0.7 or more, rougher perovskite grains were formed in conjunction with more random orientation in the organic-inorganic perovskite crystal film, as reflected by the much reduced DCO values (See FIG. 8A).

To understand the growth mechanism for forming the uniaxial orientation and dense, smooth, micronized morphology of TOA-processed $FA_{0.6}MA_{0.4}Pb I_{(3-y)}Cl_y$, organic-inorganic perovskite crystal films, three different perovskite precursor formulations were compared: 1) $0.6(FAI-PbI_2)$-$0.4(3MAI-PbCl_2)$; 2) $0.6FAI-2.4MAI-PbCl_2$; and 3) $0.6FAI$-$0.4MAI-PbI_2$. Annealing temperatures were also varied for the three different precursor formulations. Thus, the first formulation used a first reactant pair of a first organic salt of FAI and a first metal salt of $PbI_2$, at a first ratio of the first organic salt to the first metal salt of about 1:1. The first formulation also used a second reactant pair of a second organic salt of MAI and a second metal salt of $PbCl_2$, at a second ratio of the second organic salt to the second metal salt of about 3:1. Finally, the first formulation used a third ratio of the first reactant pair to the second reactant pair of about 0.6:0.4. The second formulation used a first organic salt of FAI, a second organic salt of MAI, a first metal salt of $PbCl_2$, with each of these at a ratio of $FAI:MAI:PbCl_2$ of about 0.6:2.4:1.0. The third formulation used a first organic salt of FAI, a second organic salt of MAI, and first metal salt of $PbI_2$, with each of these at a ratio of $FAI:MAI:PbI_2$ of about 0.6:0.4:1.0.

Figure 8B:
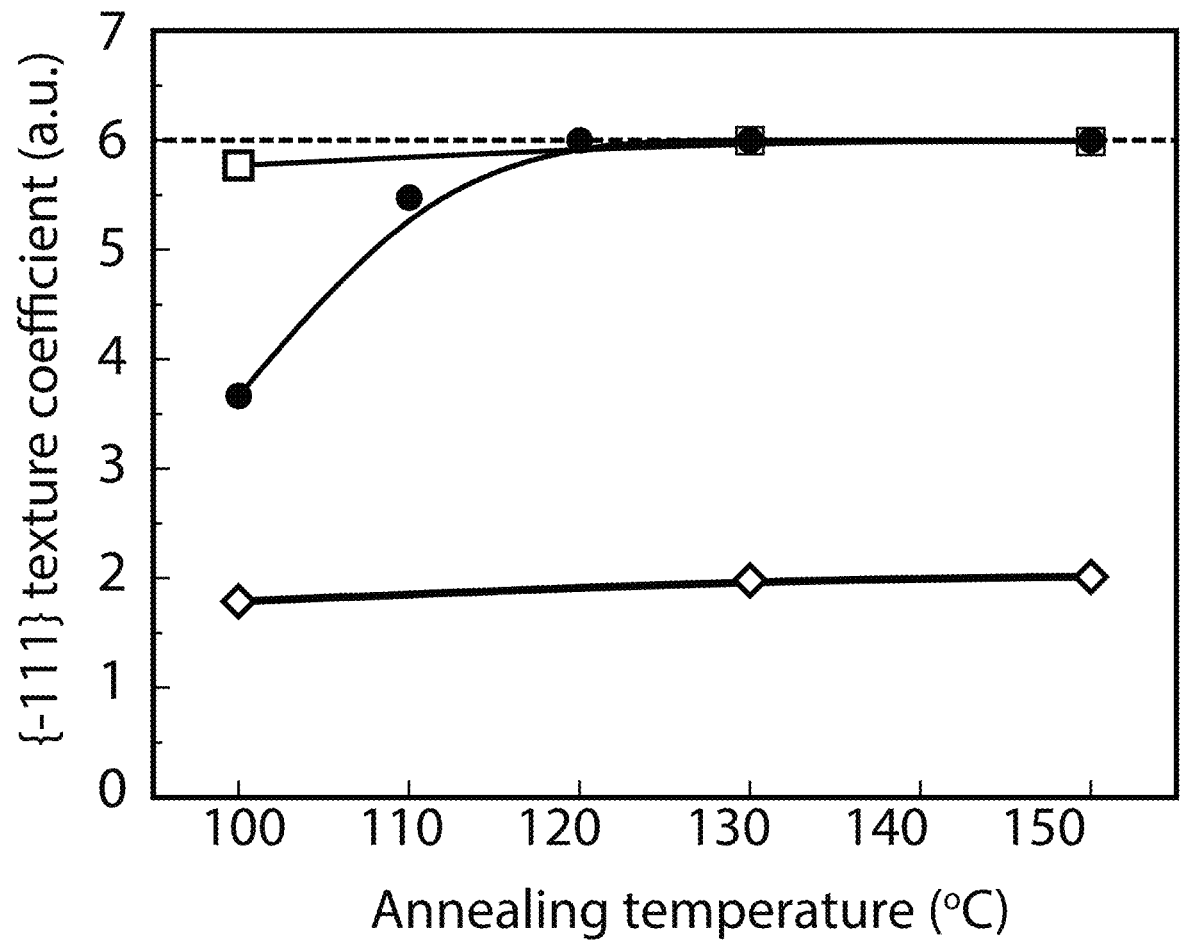
Figure 10A:
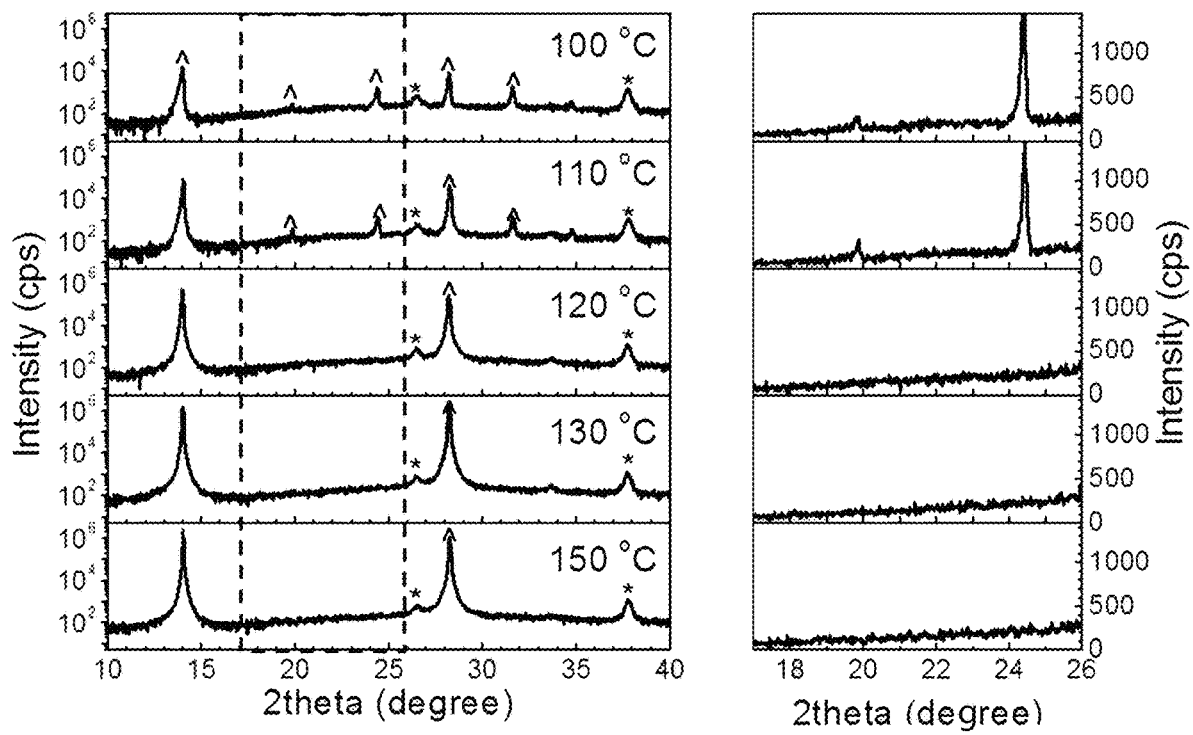
FIGS. 10A, 10B, and 10C illustrate XRD spectra for organic-inorganic perovskite crystals prepared using different precursors with different annealing temperature from 100° C. to 150° C., according to some embodiments of the present disclosure. The left sides of FIGS. 10A 10C illustrate the conventional 2theta scan XRD spectra of perovskite films using 0.6(FAI-$PbI_2$)-0.4(3MAI-$PbCl_2$), 0.6FAI-2.4MAI-$PbCl_2$, and 0.6FAI-0.4MAI-$PbI_2$ precursors, respectively, with various thermal annealing temperatures. The right sides of FIGS. 10A 10C illustrate magnified XRD spectra from 17° to 26° 2theta ranges corresponding to dashed boxes shown in the left sides of FIGS. 10A 10C, respectively.
Figure 10B:
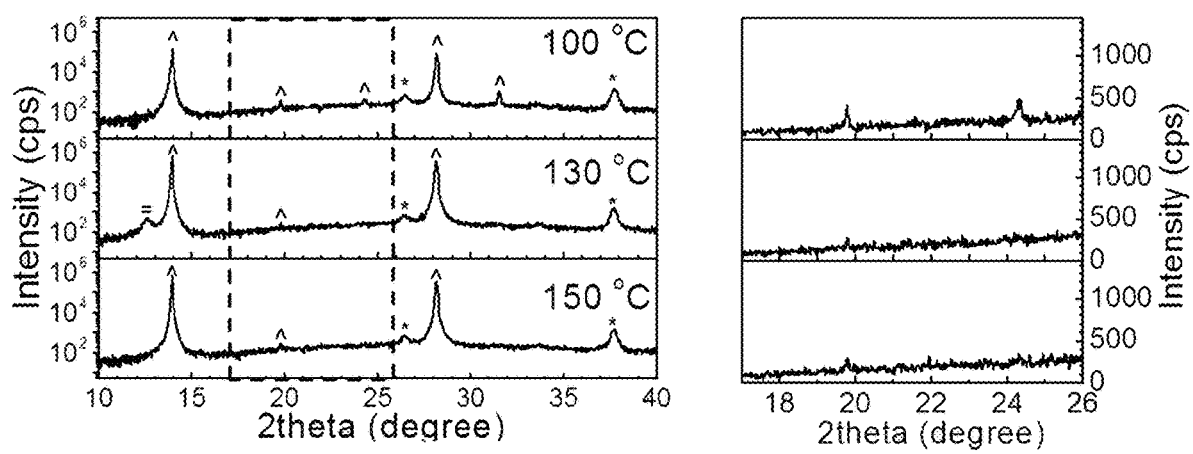
Figure 10C:
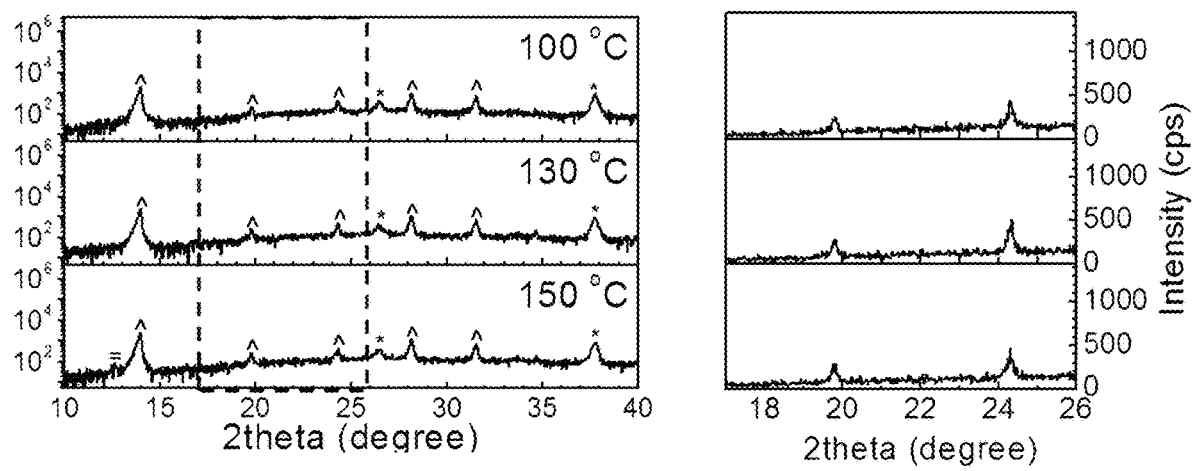
Figure 11:
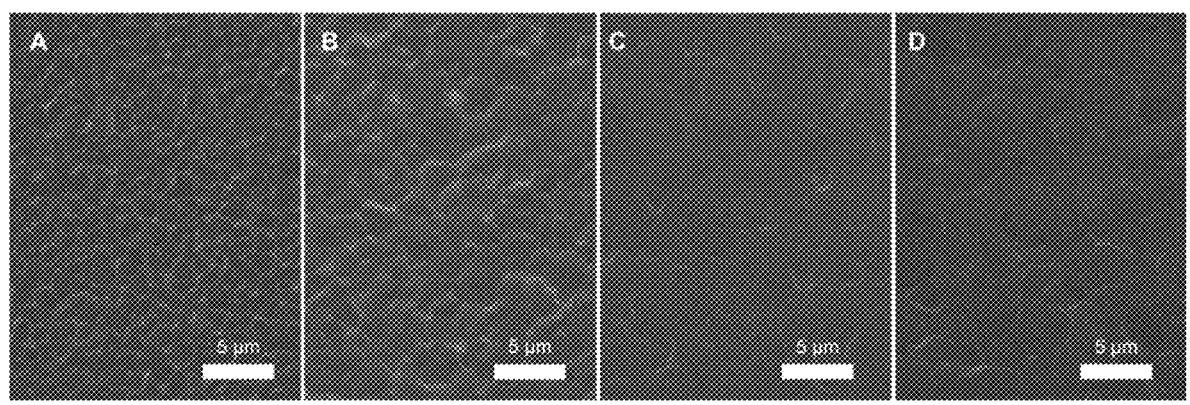
FIG. 11 illustrates the representative morphological evolution of organic-inorganic perovskite crystals prepared via 0.6(FAI-$PbI_2$)-0.4(3MAI-$PbCl_2$) precursor solution with various annealing temperature, according to some embodiments of the present disclosure; (Panel A) 100, (Panel B) 110, (Panel C) 130, and (Panel D) 150° C. As the increases, the perovskite grain size becomes larger and surface roughness becomes smoother. Maintaining uniform morphologies under high annealing temperature can be described by the high morphological stability of (FAI-$PbI_2$) parts in 0.6(FAI-$PbI_2$)-0.4(3MAI-$PbCl_2$) precursor similar that the morphological stability of 0.6FAI-0.4MAI-$PbI_2$ precursor-based perovskite films as shown FIG. 12.
Figure 12:
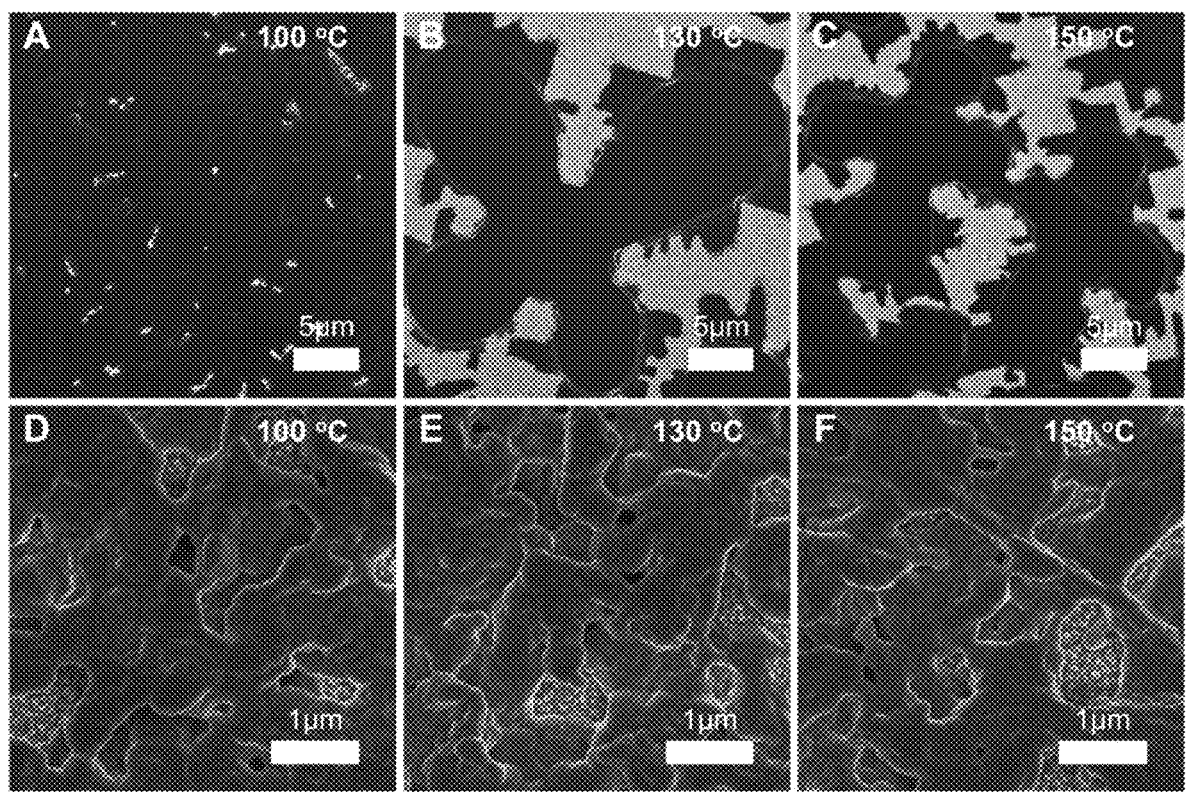
FIG. 12 illustrates the morphologies of organic-inorganic perovskite crystals deposited using (Panel A)(Panel C) 0.6FAI-2.4MAI-$PbCl_2$ and (Panel D)(Panel F) 0.6FAI-0.4MAI-$PbI_2$ precursors with 100° C., 130° C., and 150° C. annealing, respectively, according to some embodiments of the present disclosure. The 0.6FAI-2.4MAI-$PbCl_2$-based perovskites show obvious morphology change from a smooth surface with small pinholes at a lower annealing temperature (100° C.) to the ones with wide voids between large island-like grains at higher annealing temperature. In contrast, the films based on the latter precursors show consistent dendritic morphologies regardless of the annealing temperature.

The impact of the three precursors formulations on the resultant organic-inorganic perovskite crystal orientations can be obtained by determining the texture coefficient of $\{-111\}$ planes, noted as $TC_{\{-111\}}$, which can be calculated from XRD patterns (see FIGS. 10A, 10B, and 10C) using Equation 3 (see below). FIG. 8B shows that $TC_{\{-111\}}$ values for organic-inorganic perovskites derived from the $0.6FAI$-$2.4MAI-PbCl_2$ precursor formulation and the $0.6FAI$-$0.4MAI-PbI_2$ precursor formulation are about 6 and 2, respectively, with negligible dependence on the annealing temperature. These values represent approximately the upper and lower bounds for completely textured and randomly oriented films. For perovskites based on the $0.6(FAI$-$PbI_2)$-$0.4(3MAI-PbCl_2)$ precursor formulation, the $TC_{\{-111\}}$ value increases rapidly with temperature, approaching 6 at 120° C., and staying unchanged at higher temperature (see FIG. 8B). Interestingly, perovskites using this precursor exhibited uniform and dense morphology regardless of annealing temperature (see FIG. 11), which contrasts significantly to perovskites prepared using the other two precursors formulations (see FIG. 12). The dramatic increase of $TC_{\{-111\}}$ values and grain size with higher annealing temperature for organic-inorganic perovskites crystals using $0.6(FAI-PbI_2)$-$0.4(3MAI-PbCl_2)$ precursor cannot be simply explained by grain coarsening, halide mixing effects, or topotactic self-assembly nucleation/growth.

Figure 8C:
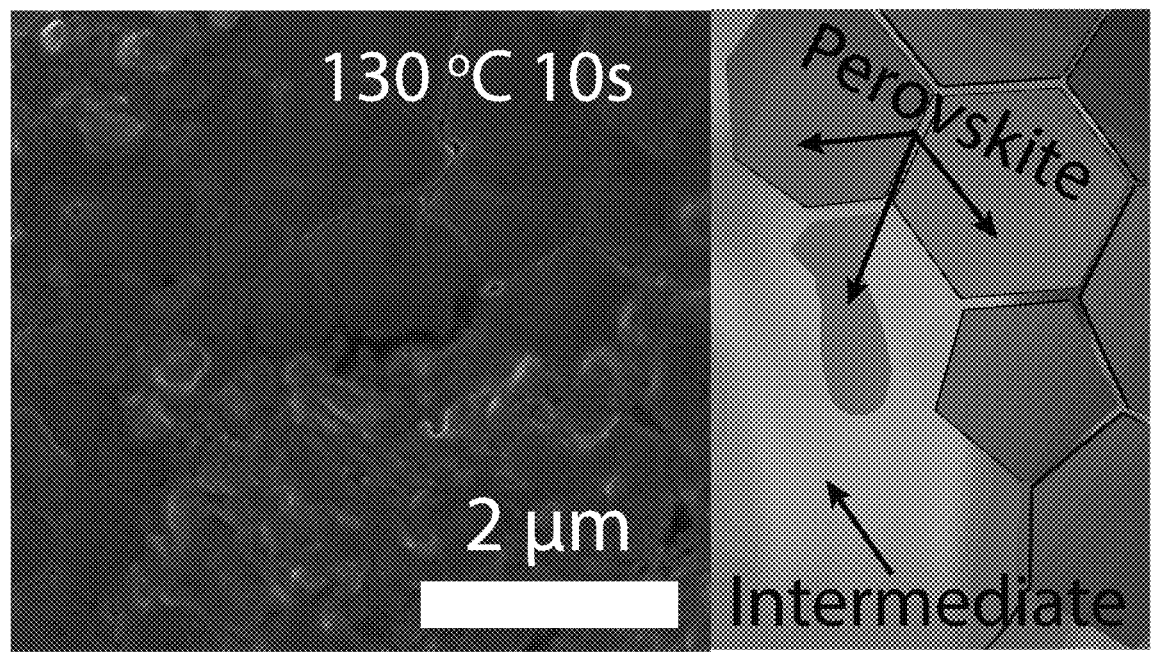
Figure 8D:
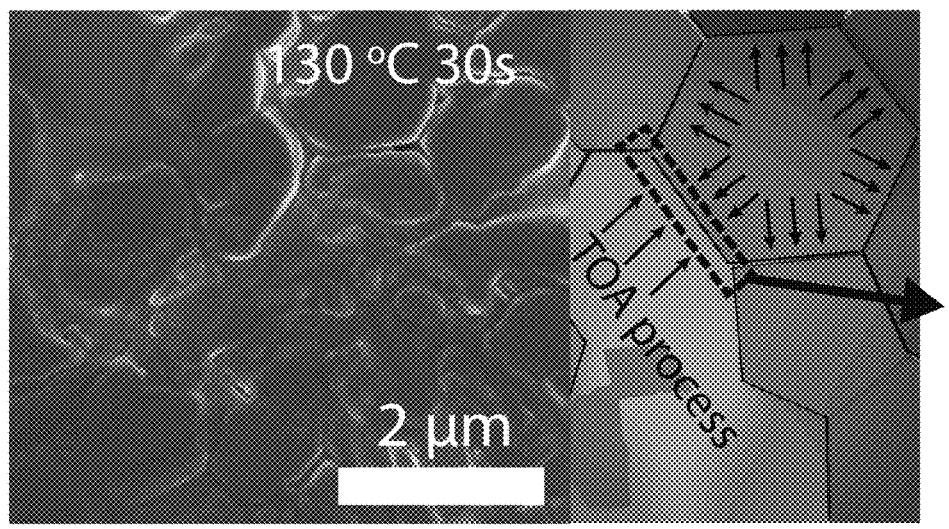
Figure 13:
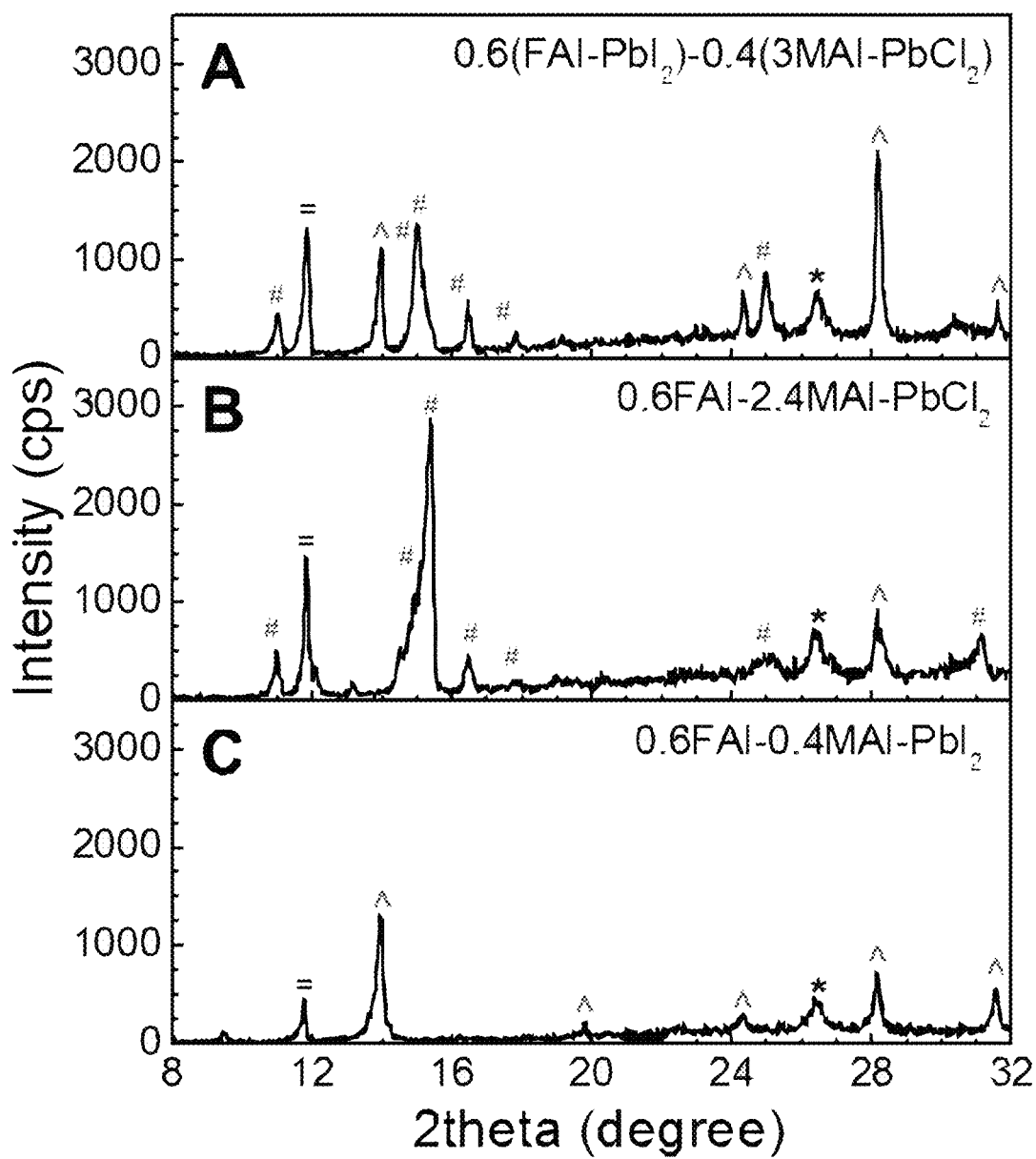
FIG. 13 illustrates XRD patterns of solid-state-precursor films (SSPs) of (Panel A) 0.6(FAI-$PbI_2$)-0.4(3MAI-$PbCl_2$), (Panel B) 0.6FAI-2.4MAI-$PbCl_2$, and (Panel C) 0.6FAI-0.4MAI-$PbI_2$ precursor formulations, according to some embodiments of the present disclosure. The SSPs are obtained through 50° C. thermal annealing after the spin-coating process. #: chlorine-contained intermediate phase, ˆ: perovskite phase, =: $PbI_2$, *: FTO, and o: unknown phase.
Figure 14:
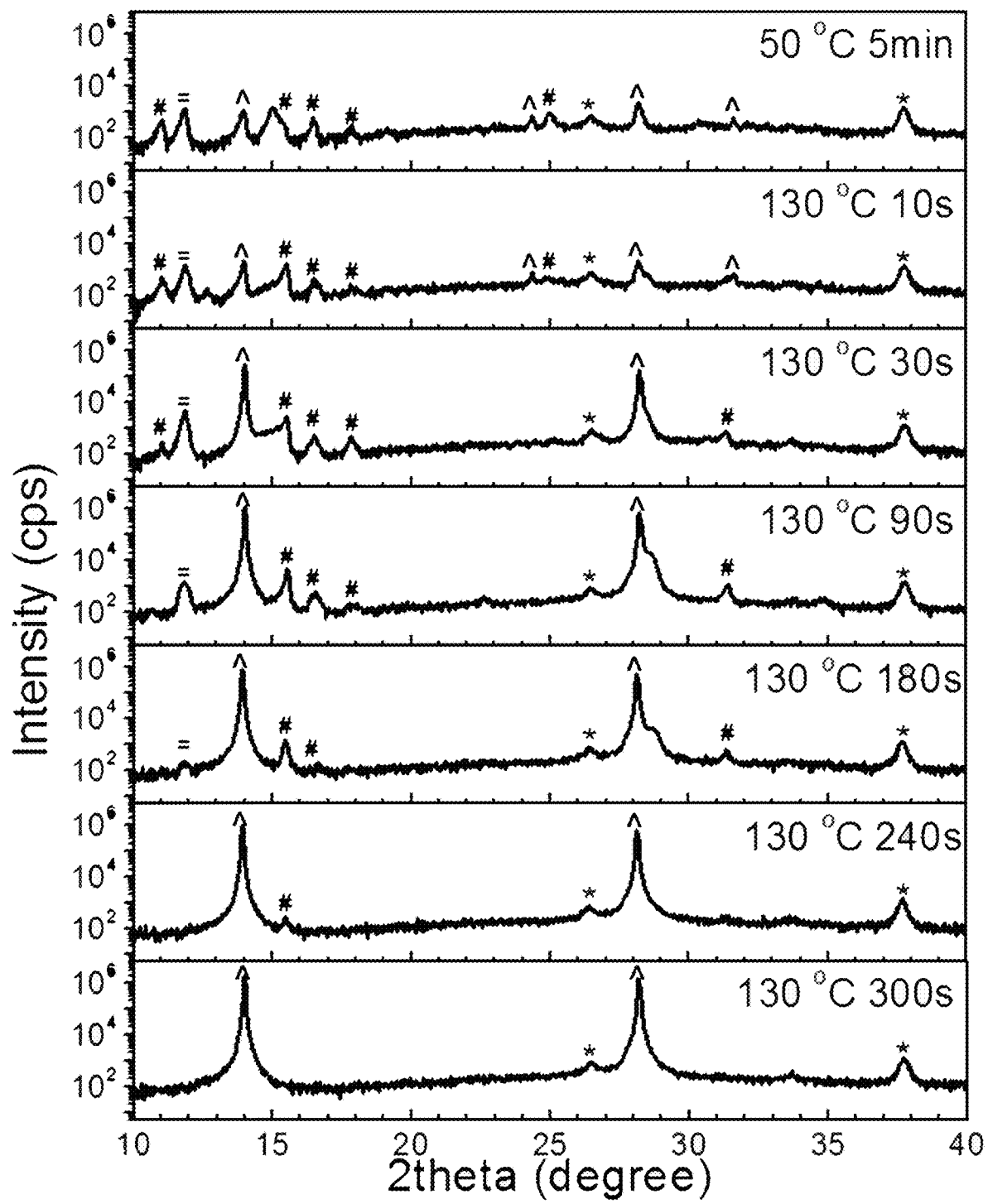
FIG. 14 illustrates XRD patterns of 0.6(FAI-$PbI_2$)-0.4 (3MAI-$PbCl_2$)-based solid-state precursor films (SSPs) at early stage (10-300 s) of the 130° C., according to some embodiments of the present disclosure. All films were quenched through a cool aluminum plate, after appropriate annealing. #: chlorine-contained intermediate phase, ^: perovskite phase, =: PbI$_2$, and *: FTO.

Further analysis of morphological (see FIGS. 8C-G) and crystal-structure evolutions (see FIGS. 13 and 14) of 0.6 $(FAI-PbI_2)$-$0.4(3MAI-PbCl_2)$ solid-state-precursor (SSP) film during the early stages of the annealing process (~300 seconds at 50° C. and between about 10 seconds and about 300 seconds at 130° C.) provides insight on a formation process of uniaxial-oriented organic-inorganic perovskite films. The XRD patterns shown in FIG. 13 clearly show the coexistence of chlorine-containing intermediates and perovskite phases for the SSP film based on the $0.6(FAI$ $PbI_2)$-$0.4(3MAI-PbCl_2)$ precursor formulation, in comparison to the SSP films using the $0.6FAI$-$2.4MAI-PbCl_2$ and $0.6FAI$-$0.4MAI-PbI_2$ precursor formulations. When annealed at 130° C. for about 10 seconds, distinct perovskite and intermediate morphologies (see FIG. 8C) were observed, which is consistent with the XRD patterns shown if FIG. 14. After about 30 seconds of annealing, several micron-sized organic-inorganic perovskite grains appeared at the interface between perovskite and intermediates (see FIG. 8D). During this early-stage annealing, the perovskite (−111) and (−222) plane diffraction intensities increased dramatically, whereas the diffraction peaks from planes started to disappear (see FIG. 14).

Figure 8E:
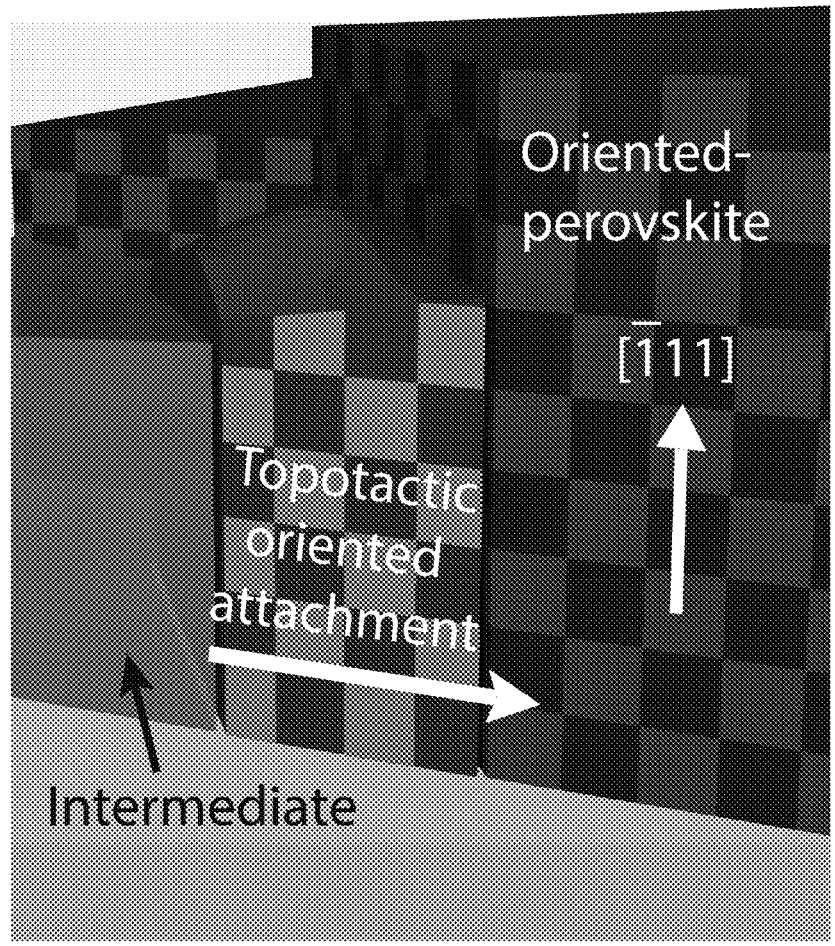
Figure 8F:
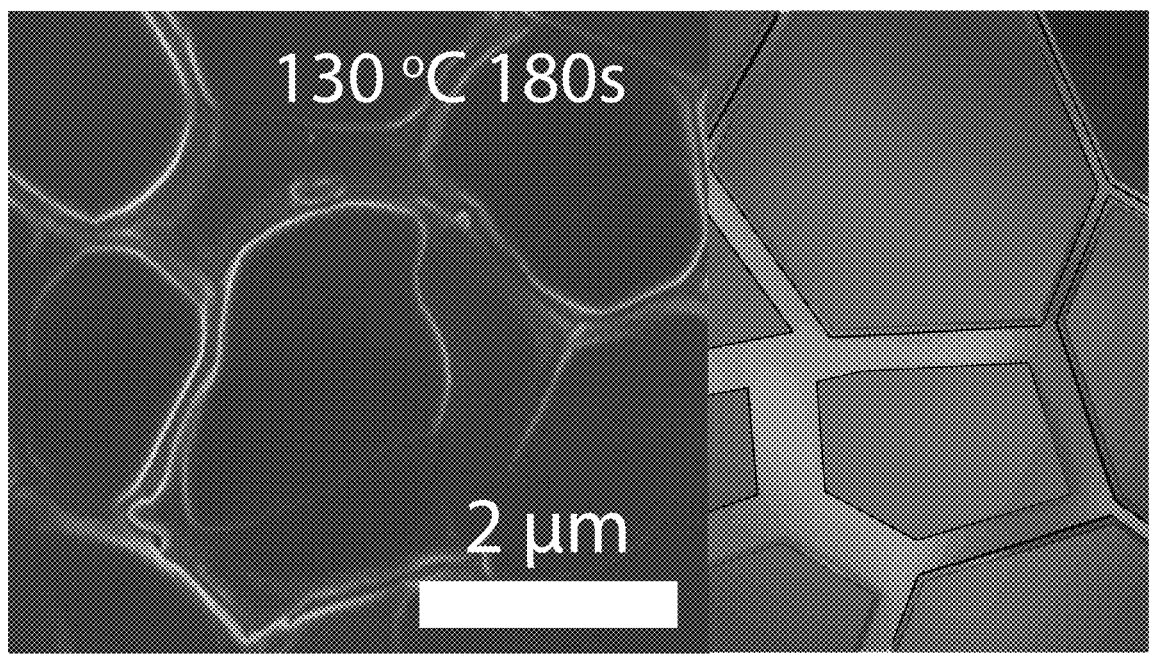
Figure 8G:
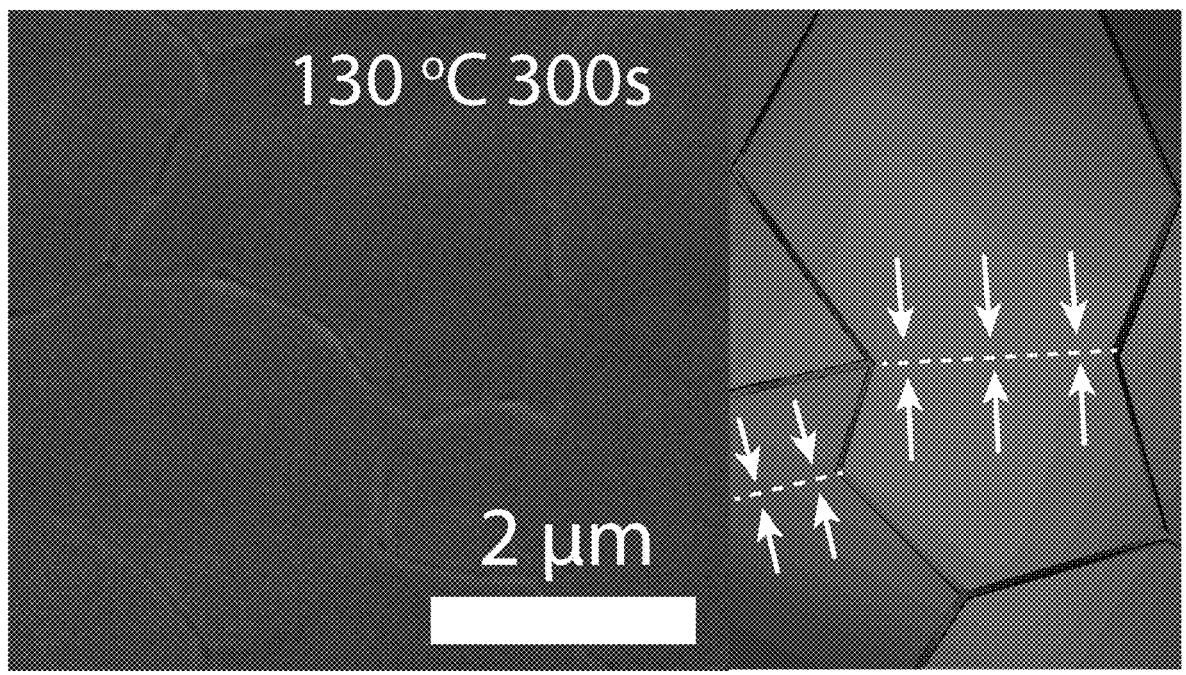

In general, when the agglomeration of nanoparticles coarsens with high-energy conditions (e.g., hydrothermal growth), oriented attachment between neighboring particles involving spontaneous self-organization along a common crystallographic orientation and sequential coalescence could occur to reduce the overall energy. As schematically illustrated in FIG. 8E, the aforementioned simultaneous evolution of film morphology and crystalline orientation of perovskites may be explained by oriented attachment along [−111] direction during the topotactic phase transformation from intermediates to perovskites. Thus, this new growth mechanism is referred to herein as "topotactic-oriented attachment". The results herein suggest that above about 120° C., TOA growth is dominant over other competing crystal-formation processes (e.g., topotactic self-assembly nucleation/growth or direct perovskite formation). During TOA growth, the rearrangement of organic-inorganic perovskite crystal domains occurs, leading to a single dominant orientation. As annealing and film formation continue, inorganic-organic perovskite grains gradually coalesce and become larger, while the intermediate surrounding organic-inorganic perovskite crystals diminish (see FIG. 8F). Finally, after about 300 seconds of annealing, the organic-inorganic perovskite film becomes densely packed with a smooth surface (see FIG. 8G) and the intermediate phase completely disappears (see FIG. 14).

Figure 15:
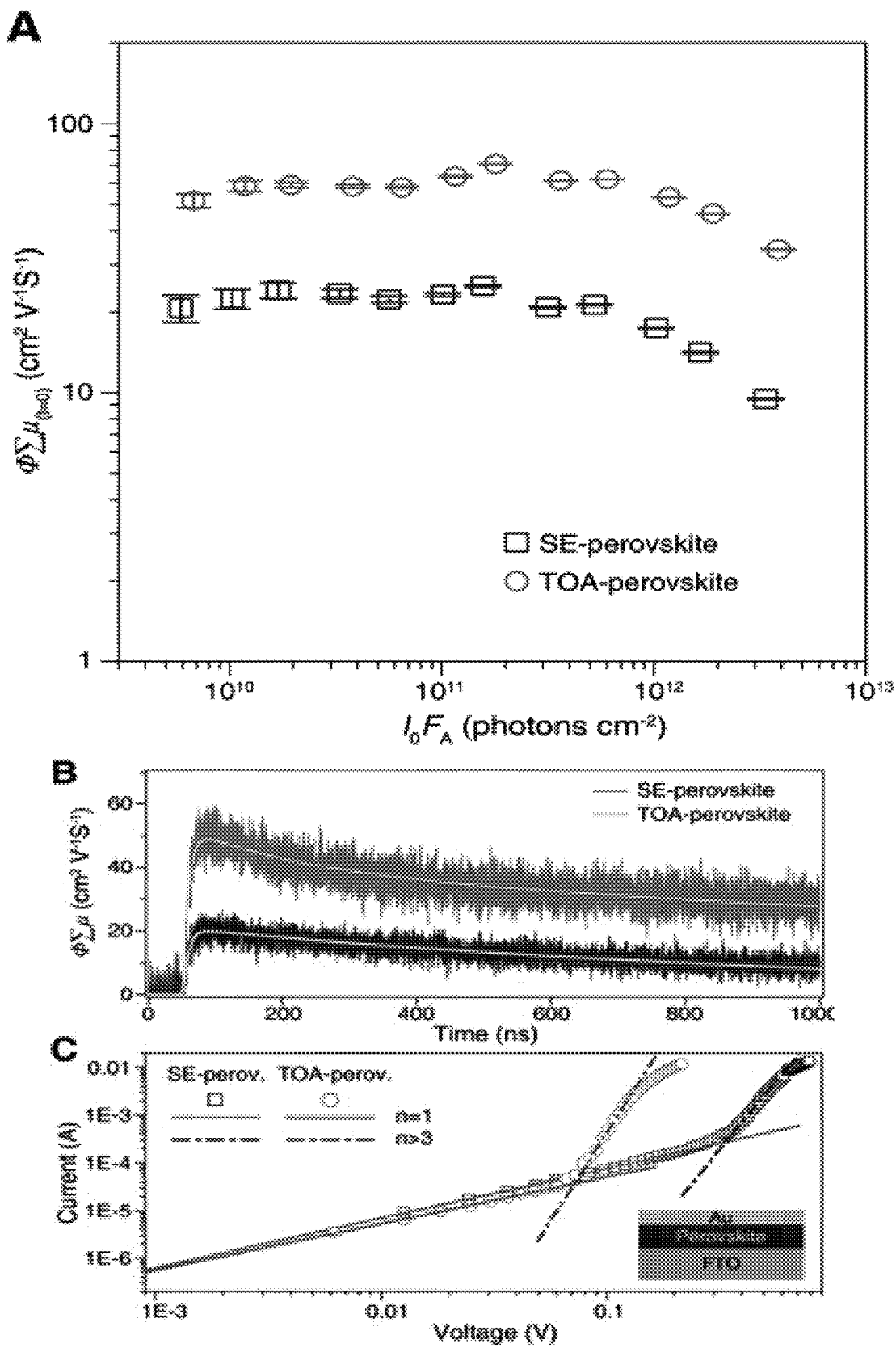
FIG. 15 illustrates charge-carrier dynamics and trap density of TOA- and SE-perovskite films where SE refers to organic-inorganic perovskite crystals prepared using conventional solvent engineering routes). (Panel A) $\Phi\Sigma\mu_{(t=0)}$ as a function of absorbed photon fluence (I$_0$F$_A$) for TOA-perovskite (circle) and for SE-perovskite (square) probed by fp-TRMC with excitation at 600 nm. The error bar denotes the standard deviation. (Panel B) Representative time-resolved $\Phi\Sigma\mu$ transients for (top data set) TOA- and (lower data set) SE-perovskites at relatively low excitation intensity (about 7-8×10$^9$ photons cm$^{-2}$ pulse$^{-1}$). Solid lines are fitting results as detailed in text. (Panel C) Dark current-voltage curves of the TOA- and SE-perovskites for SCLC analysis. The inset shows the device architecture. Two regions are identified based on the exponent value of n in I∝V$^n$: n=1 denotes the ohmic region (solid line); n>3 represents the trap-filled region (dashed line).
Figure 16:
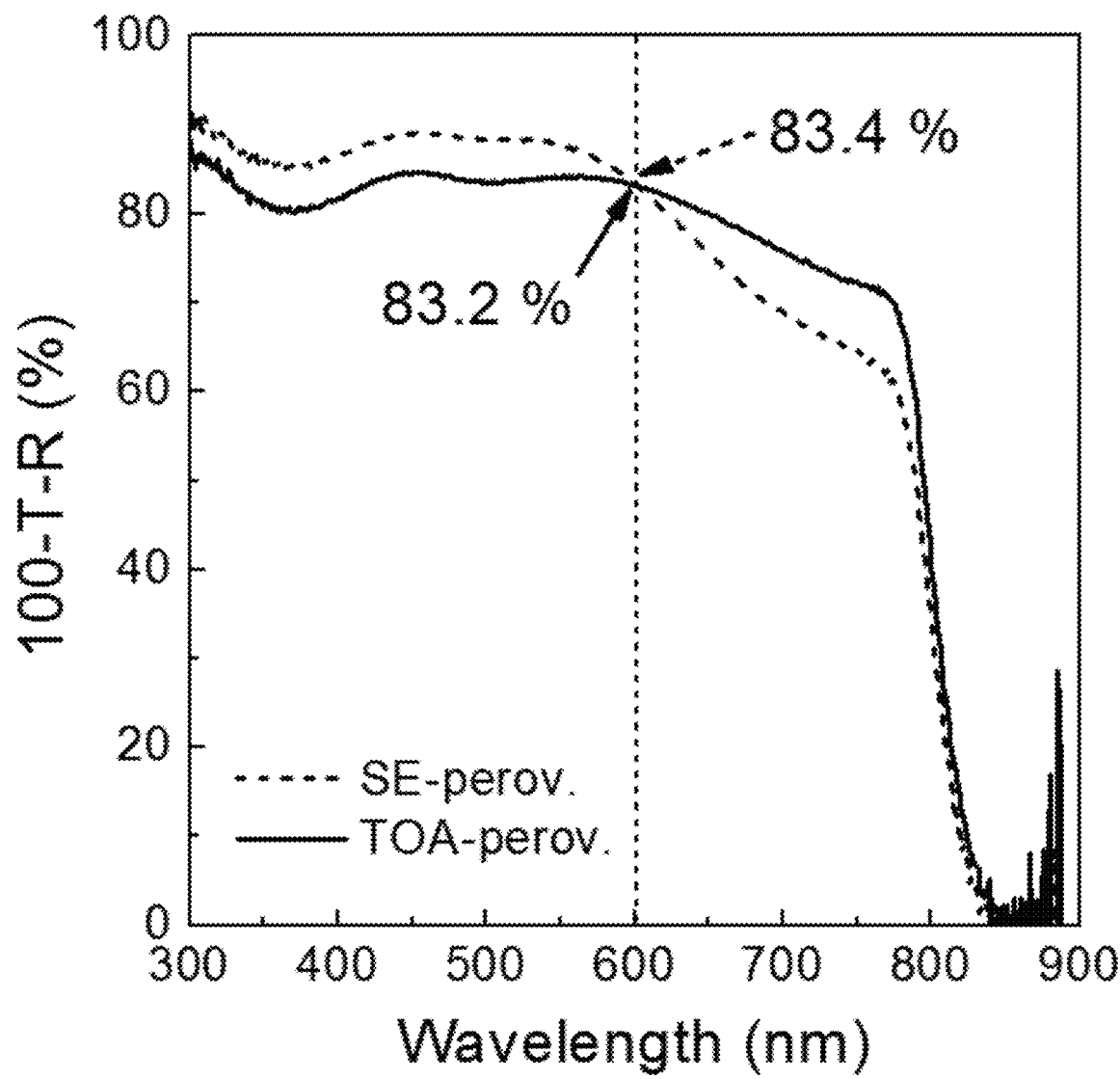
FIG. 16 illustrates optical absorptance of TOA- and SE-perovskite films deposited on quartz substrate for fp-TRMC measurements, where T is the transmission and R is the reflectance, according to some embodiments of the present disclosure.
Figure 17:
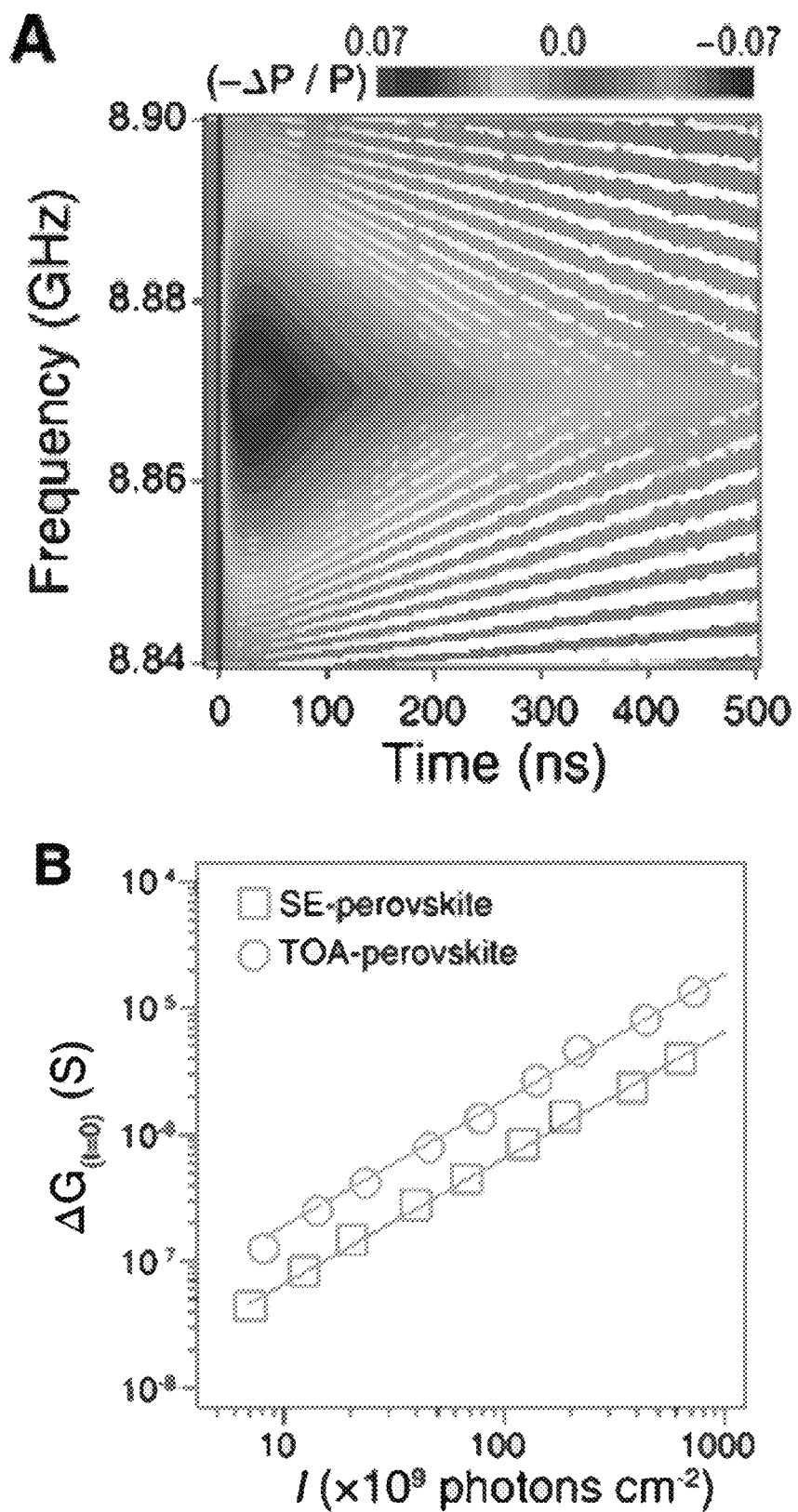
FIG. 17 illustrates additional TRMC transient results, according to some embodiments of the present disclosure. (Panel A) A contour plot of frequency-dependent reflected microwave power transients (−ΔP(t)/P) for TOA-perovskite, following excitation at 600 nm. (Panel B) The peak intensities of photoconductance transient signals, ΔG$_{(t=0)}$, evincing the linearity of peak transient signals of (circles) TOA- and (squares) SE-perovskite below the incident excitation photon fluence 0.5×10$^{12}$ photons cm$^{-2}$

The impact of TOA-perovskite growth on charge transport in the resultant organic-inorganic perovskite crystals was studied by comparing the photoconductance (AG) of TOA- and SE-perovskite films using flash-photolysis time-resolved microwave conductivity (fp-TRMC). In fp-TRMC, $\Delta G(t)$ is related to the product $(\Phi\Sigma\mu(t))$ of carrier-generation yield $(\Phi(t))$ and both electron $(\mu_e)$ and hole $(\mu_h)$ mobilities $(\Sigma\mu=\mu_e+\mu_h)$ (20). In this work, $\Phi(t)$ values for these organic-inorganic perovskite crystals are near unity as determined from internal quantum efficiencies of TOA- and SE-PSCs (94% and 96%, respectively) at the excitation wavelength (600 nm). FIG. 15 Panel A displays $\Phi\Sigma\mu_{(t=0)}$ for TOA- and SE-perovskites as a function of absorbed photon fluence $(I_0F_A)$, where $I_0$ is the excitation fluence and $F_A$ is the film absorptance (see FIG. 16). The representative $\Phi\Sigma\mu(t)$ transient signal decays for both TOA- and SE-perovskite films are shown in FIG. 15 Panel B. At the low range of excitation fluences ($<6\times10^{11}$ photons $cm^{-2}$), many-body interactions (e.g., carrier-carrier annihilation or carrier quenching) appear to be negligible, and the imaginary contribution of photoconductivity is also negligible (see FIG. 17, Panels A and B). With the near-unity $\Phi$, the maximum $\Sigma\mu_{(t=0)}$ of TOA-perovskites is as high as 70.8 $cm^2V^{-1}s^{-1}$, which is ~2.8 times higher than that of SE-perovskite (maximum $\Sigma\mu_{(t=0)}=25.0$ $cm^2V^{-1}s^{-1}$).

Figure 18:
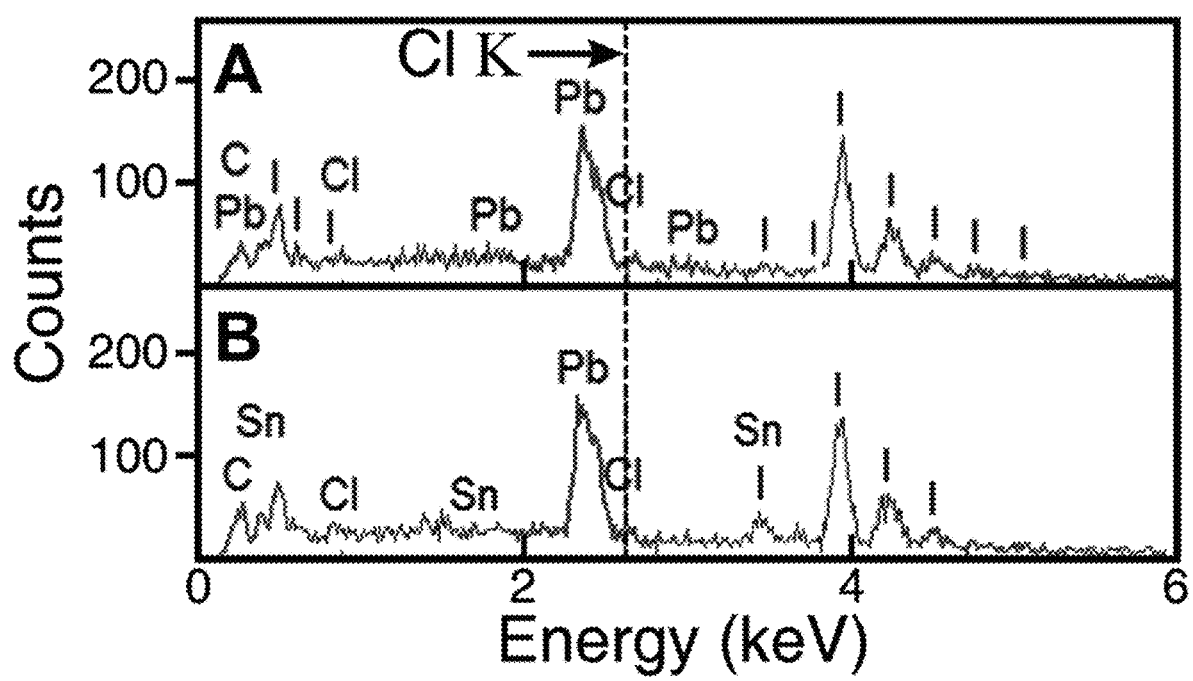
FIG. 18 illustrates energy-dispersive X-ray spectroscopy (EDS) spectra of TOA- and SE-perovskite, according to some embodiments of the present disclosure. (Panel A) EDS spectrum of TOA-perovskite (FA$_{0.6}$MA$_{0.4}$PbI$_{(3-y)}$Cl$_y$), and (Panel B) SE-perovskite (FA$_{0.6}$MA$_{0.4}$PbI$_3$).

The 25.0 cm$^2$V$^{-1}$s$^{-1}$ of $\Sigma\mu_{(SE)}$ value for SE-perovskite was comparable to those previously reported 9-GHz $\Sigma\mu$ values (1-30 cm$^2$V$^{-1}$s$^{-1}$) for various perovskite samples. Thus, this 70.8 cm$^2$V$^{-1}$s$^{-1}$ of $\Sigma\mu_{(TOA)}$ has exceeded all previously reported 9-GHz $\Sigma\mu$ values for organic-inorganic polycrystalline perovskite thin films, unambiguously supporting the enhanced electrical properties of organic-inorganic perovskite crystals formed by the TOA methods described herein. In general, charge-carrier mobilities can be affected by various factors such as grain size, compositional doping, and crystal orientation, film architectures (e.g., planar or mesoscopic), and perovskite compositions (e.g., mixed halides). Thus, in the work described herein, the grain sizes of both TOA- and SE-perovskites are too large (>400 nm) to affect fp-TRMC carrier mobilities. Given the same composition and film architecture, for both TOA- and SE-perovskites, the un-precedented $\Sigma\mu$ in TOA-perovskite may be ascribed mainly to uniaxial TOA-perovskite growth with the enhanced crystallinity and low defect (or trap) density. FIG. 15 Panel C shows the space-charge-limited current (SCLC) analysis of the TOA- and SE-perovskite samples. The trap density, $n_t$, is linearly proportional to the onset voltage ($V_{TFL}$; see Equation 3 below) at the kink point of the current-voltage (I-V) response, which represents a transition from the linear ohmic region ($I \propto V^{n=1}$) to the trap-filled limit ($I \propto V^{n>3}$) or the Child region ($I \propto V^{n>2}$) (20,30,31). Here, for TOA-perovskites a remarkably low trap density $n_{t(TOA)} = (3.7 \pm 0.6) \times 10^{14}$ cm$^{-3}$ was determined, which is more than 10-fold lower than that of SE-perovskite ($n_{t(SE)} = (7.8 \pm 0.5) \times 10^{15}$ cm$^{-3}$). The elemental analysis through energy-dispersive X-ray spectroscopy indicates that remaining Cl was negligible (see FIG. 18). It is worth noting that the fp-TRMC experiments measured the intrinsic characteristics of perovskite thin films in a dimension of 2.29×1.09 cm$^2$, rather than locally favored characteristics; thus, the Cl presence, if there was any, was not critical to the observed enhanced mobilities for TOA-perovskites.

The transient decay of $\Phi\Sigma\mu(t)$ signals and corresponding parameters with bi-exponential fitting results under $I_0 = \sim 7$-$8 \times 10^9$ photons cm$^{-2}$ pulse$^{-1}$ are shown in FIG. 15 Panel B and Table 1, respectively.

TABLE 1

Fitting results of either bi- (for TOA-perovskite) and single- (for SE-perovskite) exponential decay function for TRMC transients shown in FIG. 15 Panel B.[a]

|  | $a_1$ ($f_1$) | $\tau_1$ [ns] | $a_2$ ($f_2$) | $\tau_2$ [ns] | $\tau_{avg}$ [ns] |
|---|---|---|---|---|---|
| TOA-perovskite | 13.2 (0.02) | 183 | 38.5 (0.98) | 2840 | 2783 |
| SE-perovskite | 20.7 (1.0) | 1021 |  |  | 1021 |

[a] $a_i$ is the prefactor of exponential decay function in $\Phi\Sigma\mu(t) = \Sigma_i a_i \exp(-t/\tau_i)$, and fi is the fractional contribution of each time constant ($\tau_i$)

The average lifetime $\tau_{avg}$ for TOA-perovskites was determined to be 2.8 μs from $\tau_{avg} = \Sigma_i f_i \tau_i$, where $f_i$ is the fractional contribution of each time constant, whereas SE-perovskites exhibited single-exponential decay with a 1.0-μs time constant. Although no attempt is made in this work to address the distinguished relaxation behavior between TOA- and SE-perovskites, it is noteworthy that the significantly longer carrier lifetime in TOA-perovskites is consistent with their improved material properties (e.g., enhanced crystallinity, low defect density, and compact coverage), allowing for a much longer time window to extract charges compared with SE-perovskite.

Figure 19:
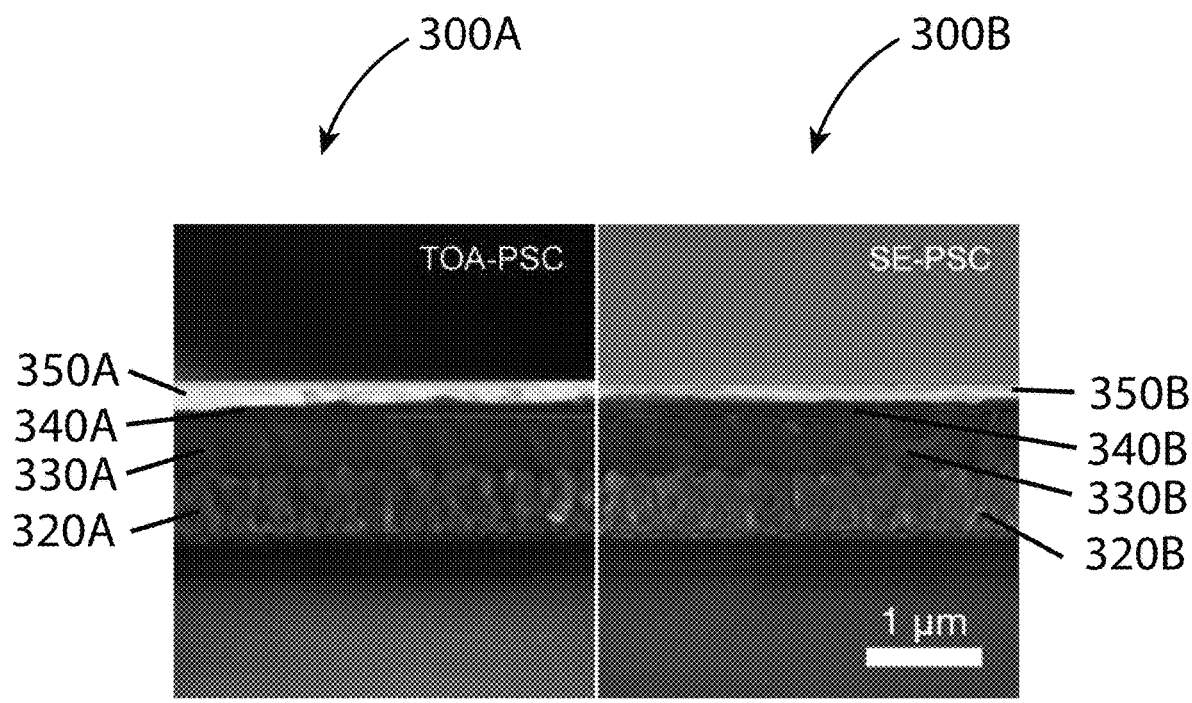
FIG. 19 illustrates cross-sectional SEM images of TOA- and SE-perovskite solar cells, according to some embodiments of the present disclosure. The thickness of the organic-inorganic perovskite absorbing layers are both about 450 nm.

Planar organic-inorganic perovskite solar cells with 450-nm-thick inorganic-organic perovskite layers were fabricated to examine the effect of TOA growth on photovoltaic (PV) properties. Referring to FIG. 19, a first device 300A is shown on the right manufactured by the TOA methods described herein, and a second device 300B made by conventional solvent engineering (SE) methods. These side-by-side images compare the first charge-transport layers (320A and 320B), the organic-inorganic perovskite layers (330A and 330B), the second charge-transport layers (340A and 340B), and additional layers (350A and 350B) for the two devices (300A and 300B) respectively, where in this example the additional layers (350A and 350B) are a contact layer The current density-voltage (J-V) curves with various scan rate (or delay time), external quantum efficiency (EQE) spectra, and stabilized PCEs for TOA- and SE-PSCs are compared to understand the correlation between enhanced electrical properties and device characteristics.

Figure 20A:
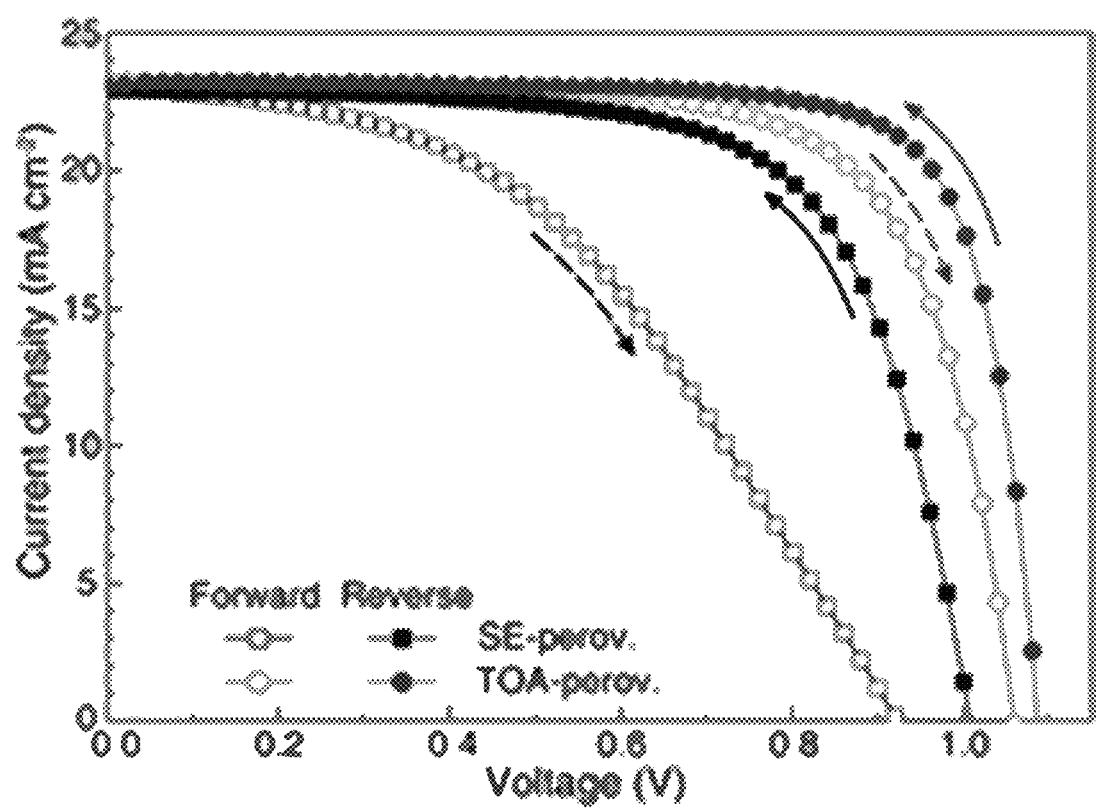
FIGS. 20A through 20D illustrate a comparison of PV properties of TOA- and SE-PSCs, according to some embodiments of the present disclosure.
Figure 20B:
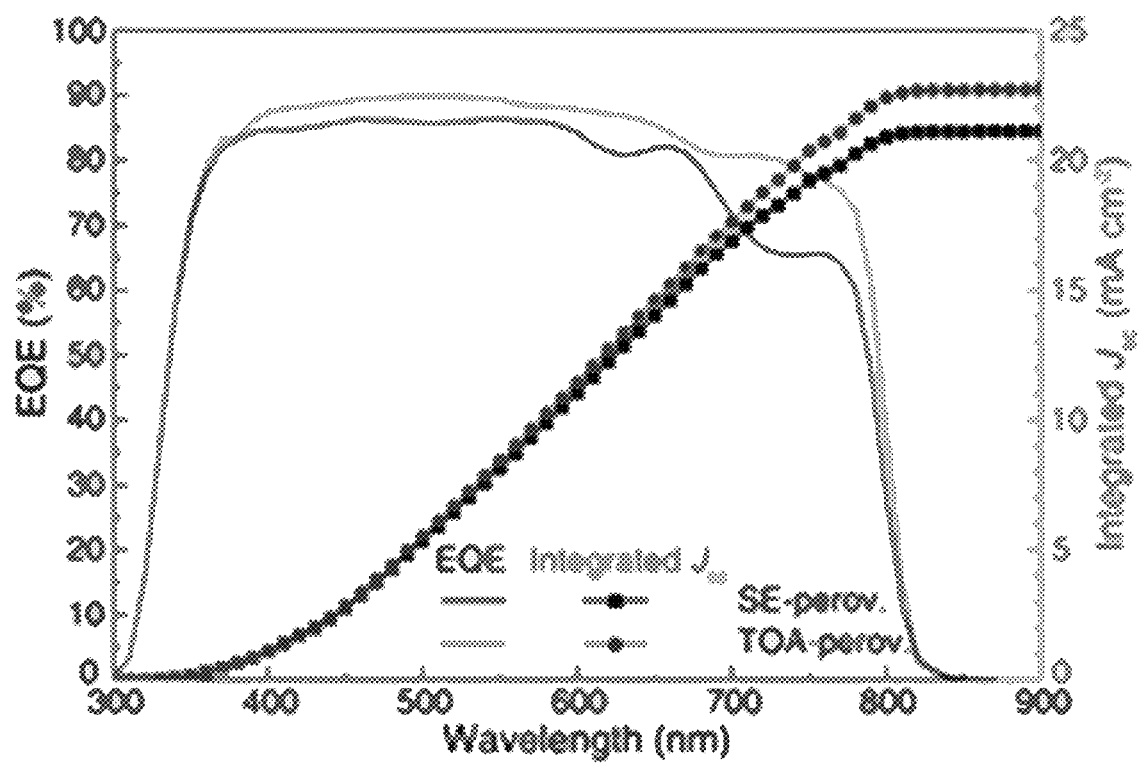
Figure 20C:
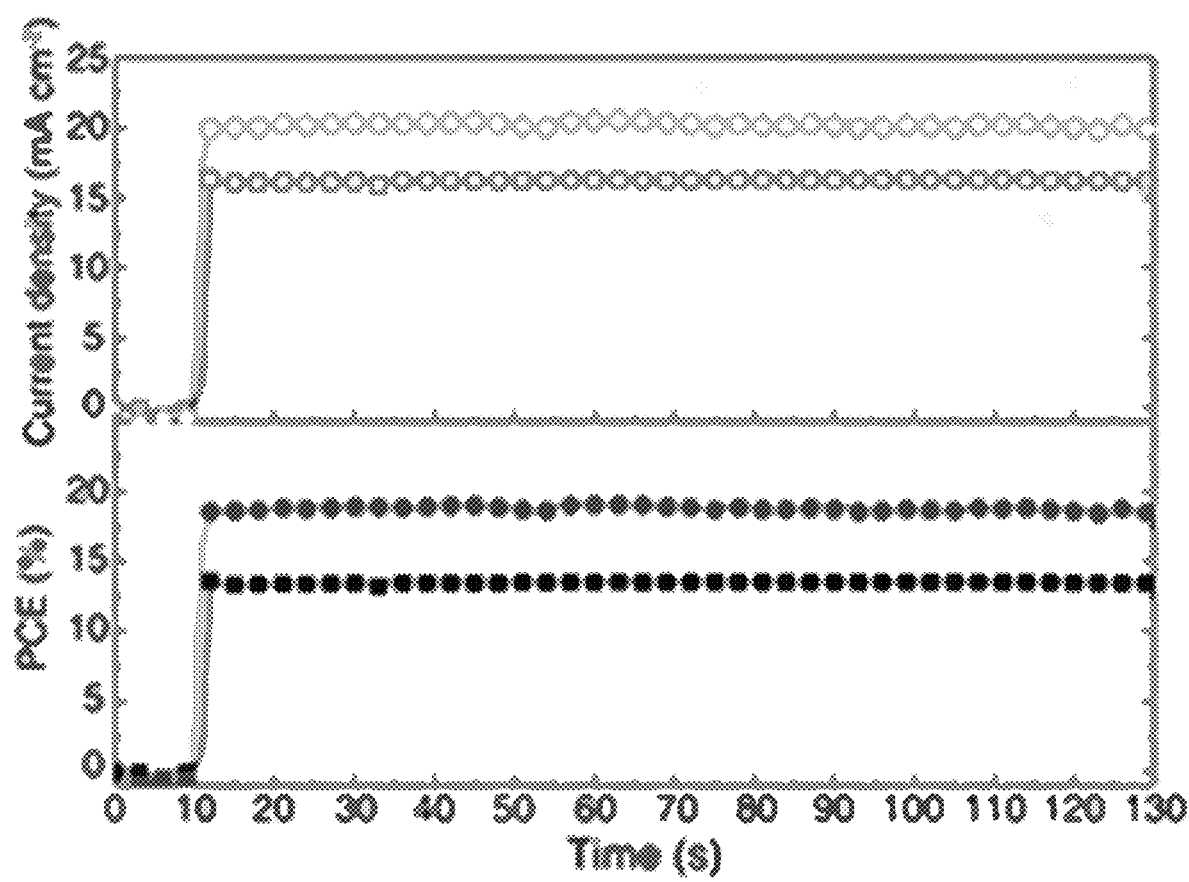
Figure 21:
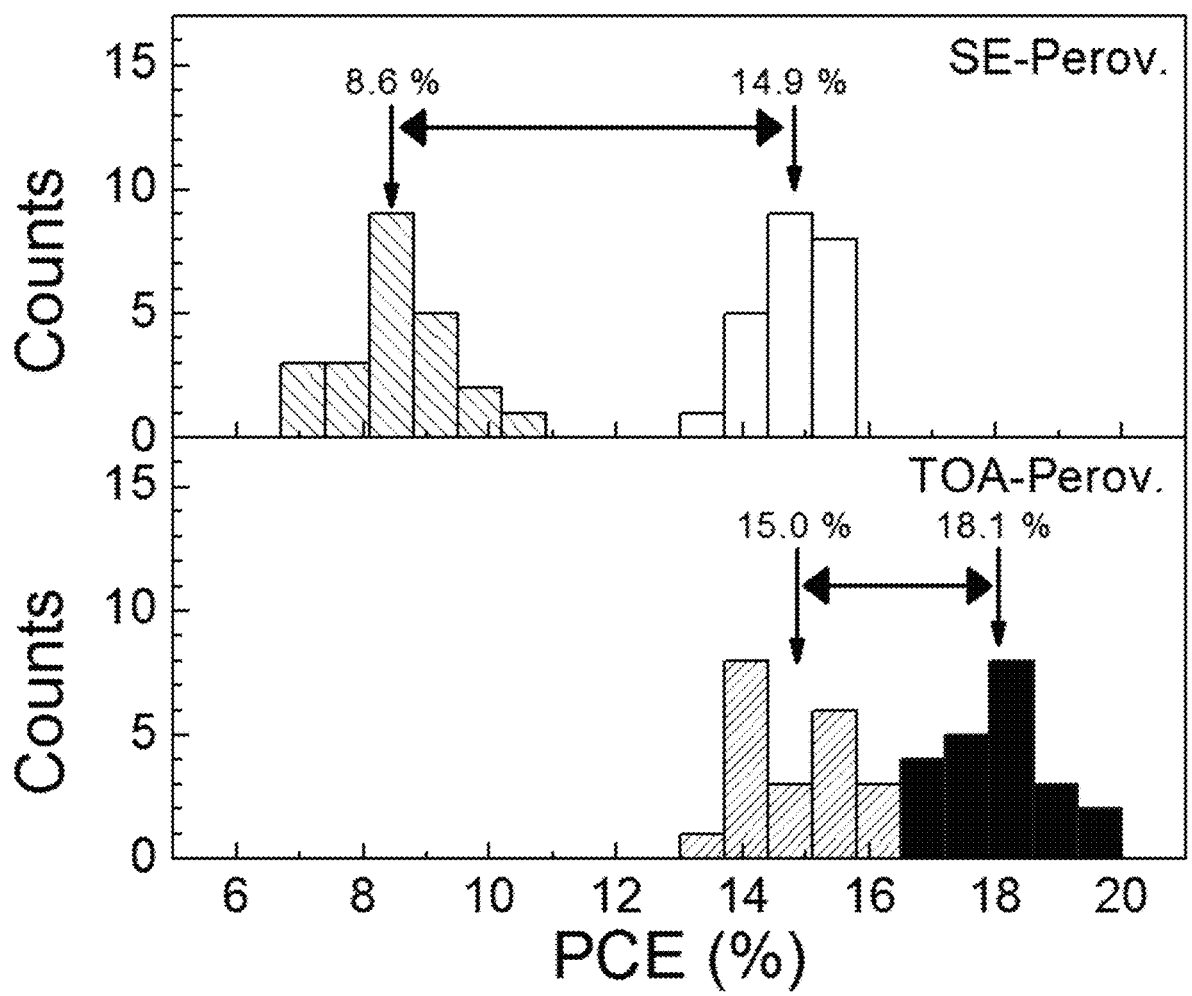
FIG. 21 illustrates histograms of PCEs of the SE- and TOA-perovskite-based PHJ solar cells, according to some embodiments of the present disclosure. For statistics, 23 and 22 devices are tested, respectively. The histograms filled with oblique lines are obtained from forward-scan PCEs, and histograms filled with solid color are obtained from reverse-scan PCEs.

FIG. 20A shows the J-V curves for the champion device with both forward and reverse scans and 50-ms delay time under AM 1.5G illumination. For the reverse scan, TOA-PSC shows a PCE of 19.7% with short-circuit current voltage (JO of 23.2 mA cm$^{-2}$, open-circuit voltage ($V_{oc}$) of 1.08 V, and fill factor (FF) of 0.78, whereas SE-PSC delivers a lower PCE of 15.7% with $J_{sc}$ of 22.9 mA cm$^{-2}$, $V_{oc}$ of 1.00 V, and FF of 0.68. Hysteresis for TOA-PSC was also significantly reduced in comparison to SE-PSC. The PCE of TOA-PSC is 17.4% with forward-scan, corresponding to 88% of its reverse-scan PCE. In contrast, the forward-scan PCE (9.5%) of SE-PSC is only about 61% of its reverse-scan PCE. The improved device characteristics with TOA-PSCs are further confirmed by the statistic PV parameters (see Tables 2 and 3 below) and efficiency distribution (see FIG. 21). The EQE spectra and the integrated $J_{sc}$ determined by EQE for TOA- and SE-PSCs are shown in FIG. 20B. The differences between $J_{sc}$ and EQE-integrated $J_{sc}$ are 7.9% for SE-PSC (22.9 and 21.1 mA cm$^{-2}$, respectively) and only 2.2% for TOA-PSC (23.2 and 22.7 mA cm$^{-2}$, respectively). Although the difference (<10%) is reasonable for both devices, TOA-PSC showed more consistent results between the $J_{sc}$ and EQE measurement. These consistent improvements in PV properties (including higher $V_{oc}$ and FF, less hysteresis, and negligible discrepancy between $J_{sc}$ and EQE) of TOA-PSCs can be ascribed to the enhanced charge-carrier mobility and lifetime of TOA-perovskite with (−111) uniaxial-orientation, much higher crystallinity, and lower defect/trap density. FIG. 20C compares the stable output of TOA- and SE-PSCs. TOA-PSC exhibited a stabilized PCE of 19.0%, representing 96.4% of its reverse-scan PCE.

Figure 20D:
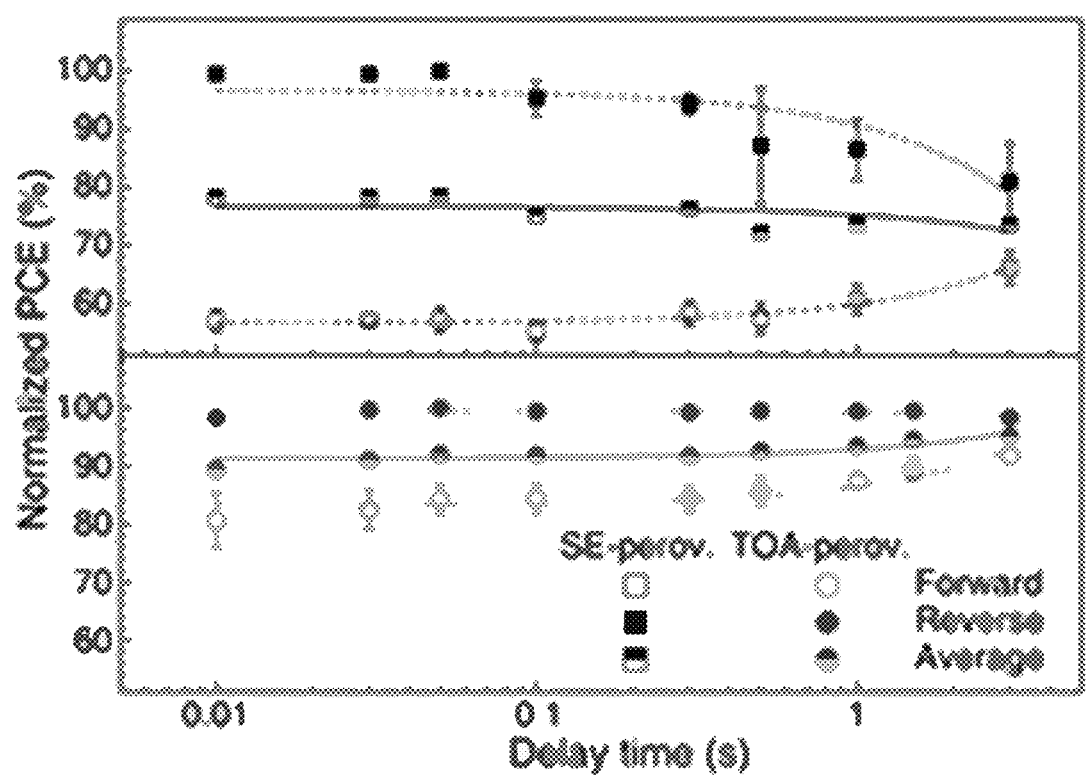
Figure 22A:
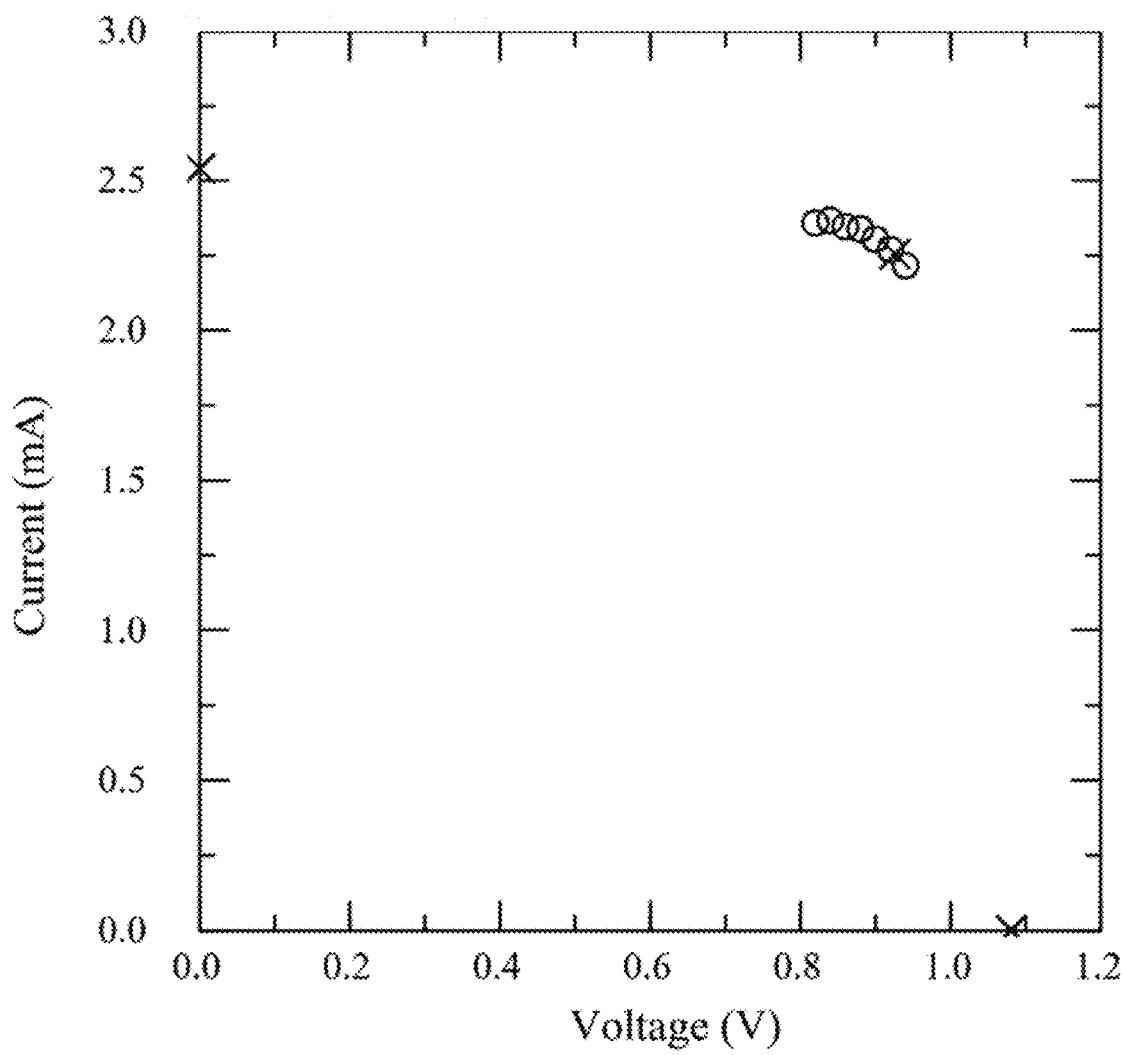
FIGS. 22A and 22B illustrate a comparison between certified stabilized PCE output and PCE obtained from general J-V curve, according to some embodiments of the present disclosure.
Figure 22B:
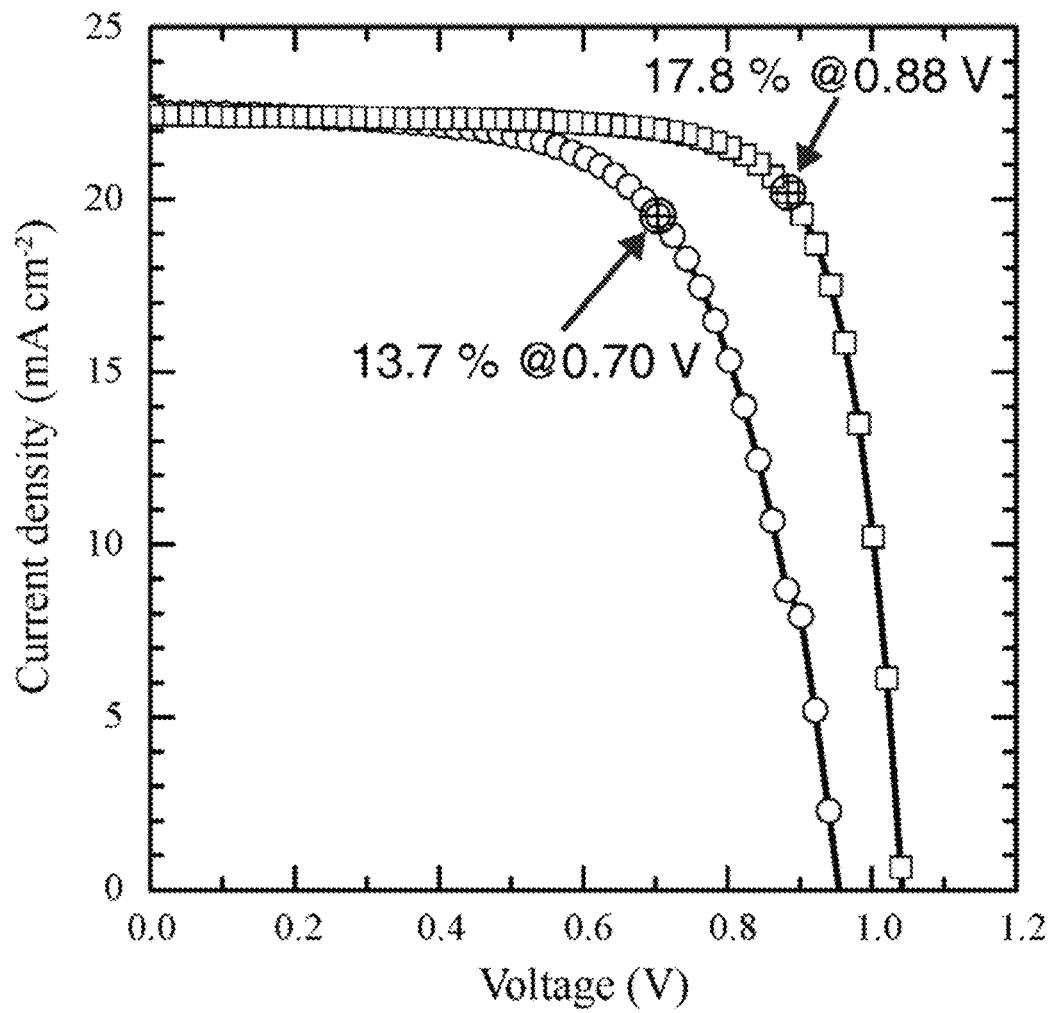

In contrast, SE-PSC showed a stabilized PCE of 13.4%, corresponding to 85.3% of its reverse-scan PCE. A typical TOA-PSC (17.8% reverse-scan PCE) was analyzed and the cell performance was verified by using an asymptotic stabilization method, confirming a stabilized PCE of 17.2% (see FIG. 22B). This certified PCE corresponds to 96.5% of the reverse-scan PCE, which shows almost the same difference as shown in FIG. 20C. The hysteresis behavior of TOA- and SE-PSCs is further examined by checking their forward- and reverse-scan PCEs as a function of scan delay time from 0.01 to 3 s (see FIG. 20D). The PCEs were normalized with respect to that measured with 50-ms delay under reverse scan. For the SE-PSC, as the delay time was increased, the average PCE and hysteresis decreased. Interestingly, for TOA-PSC, the reverse-scan PCE did not depend on the scan delay time, whereas the forward-scan PCE increased and approached the reversed-scan PCE with longer scan delay. With a 3-second scan delay, the average PCE reached about 96% of reverse-scan PCE. Although more detailed investigations are necessary to understand the hysteresis behavior of TOA-PSCs, the negligible discrepancy between reverse-scan and stabilized PCEs, as well as the absence of the scan-rate dependence of reverse-scan PCEs, likely result from the unique structural and electro-optical properties of the TOA-perovskites discussed above.

Finally, the versatility of the TOA growth process described herein has been demonstrated by applying it to other organic-inorganic perovskite compositions including triple-cation and mixed-halide perovskites (e.g., $MAPbI_{(3-y)}Cl_y$, $FA_{0.8}MA_{0.2}PbI_{(3-y)}Cl_y$, and $FA_{0.55}MA_{0.4}Cs_{0.05}PbI_{(2.9-y)}Br_{0.1}Cl_y$). All of these organic-inorganic perovskite thin films were grown by embodiments of the TOA processes described herein and demonstrated high-crystalline uniaxial orientation and uniform morphology with 2-5-μm grain sizes

TABLE 2

Photovoltaic parameters measured with 50-ms delay times in forward and reverse direction for 22 TOA-PSCs with a 0.12-cm² black metal aperture under AM 1.5 G illumination condition calibrated using a standard Si solar cell for every measurement.

| | $J_{sc}$ (mA cm$^{-2}$) | | $V_{oc}$ (V) | | FF | | PCE (%) | |
|---|---|---|---|---|---|---|---|---|
| | Forward | Reverse | Forward | Reverse | Forward | Reverse | Forward | Reverse |
| #1 | 22.2 | 22.1 | 1.08 | 1.10 | 0.67 | 0.79 | 16.1 | 19.1 |
| #2 | 22.2 | 22.2 | 0.96 | 1.00 | 0.64 | 0.77 | 13.8 | 17.0 |
| #3 | 21.7 | 21.6 | 1.06 | 1.08 | 0.62 | 0.73 | 14.3 | 17.0 |
| #4 | 22.2 | 22.2 | 0.98 | 1.04 | 0.63 | 0.76 | 13.7 | 17.6 |
| #5 | 22.7 | 22.7 | 0.98 | 1.04 | 0.64 | 0.72 | 14.3 | 17.1 |
| #6 | 22.8 | 22.8 | 0.98 | 1.06 | 0.66 | 0.76 | 14.8 | 18.4 |
| #7 | 22.6 | 22.5 | 1.04 | 1.08 | 0.61 | 0.75 | 14.3 | 18.1 |
| #8 | 22.5 | 22.5 | 1.04 | 1.08 | 0.63 | 0.74 | 14.7 | 17.9 |
| #9 | 22.6 | 22.4 | 1.08 | 1.10 | 0.63 | 0.74 | 15.3 | 18.2 |
| #10 | 22.9 | 22.8 | 1.02 | 1.06 | 0.61 | 0.72 | 14.2 | 17.4 |
| #11 | 23.3 | 23.2 | 1.06 | 1.09 | 0.71 | 0.78 | 17.4 | 19.7 |
| #12 | 21.9 | 21.9 | 1.06 | 1.08 | 0.65 | 0.77 | 15.0 | 18.1 |
| #13 | 23.3 | 23.2 | 1.04 | 1.08 | 0.65 | 0.77 | 15.7 | 19.4 |
| #14 | 22.6 | 22.6 | 1.02 | 1.06 | 0.70 | 0.78 | 16.1 | 18.8 |
| #15 | 22.7 | 22.7 | 1.02 | 1.08 | 0.67 | 0.77 | 15.6 | 18.8 |
| #16 | 22.2 | 22.1 | 1.04 | 1.08 | 0.59 | 0.71 | 13.5 | 16.8 |
| #17 | 22.5 | 22.5 | 1.00 | 1.06 | 0.70 | 0.78 | 15.8 | 18.5 |
| #18 | 22.7 | 22.8 | 1.00 | 1.06 | 0.63 | 0.74 | 14.3 | 17.9 |
| #19 | 22.4 | 22.3 | 1.02 | 1.05 | 0.67 | 0.76 | 15.3 | 17.9 |
| #20 | 22.6 | 22.5 | 1.02 | 1.06 | 0.67 | 0.75 | 15.3 | 17.9 |
| #21 | 22.7 | 22.7 | 0.96 | 1.04 | 0.66 | 0.76 | 14.3 | 17.9 |
| #22 | 22.8 | 22.8 | 1.00 | 1.06 | 0.67 | 0.75 | 15.2 | 18.1 |
| Average | 22.6 ± 0.4 | 22.5 ± 0.4 | 1.02 ± 0.04 | 1.07 ± 0.02 | 0.65 ± 0.03 | 0.75 ± 0.02 | 15.0 ± 0.9 | 18.1 ± 0.8 |

TABLE 3

Photovoltaic parameters measured with 50-ms delay times in forward and reverse direction for 23 SE-PSCs under same measurement conditions applied to measurement of TOA-PSCs.

| | $J_{sc}$ (mA cm$^{-2}$) | | $V_{oc}$ (V) | | FF | | PCE (%) | |
|---|---|---|---|---|---|---|---|---|
| | Forward | Reverse | Forward | Reverse | Forward | Reverse | Forward | Reverse |
| #1 | 22.0 | 21.9 | 0.98 | 1.04 | 0.33 | 0.69 | 7.2 | 15.8 |
| #2 | 21.8 | 21.7 | 0.96 | 1.02 | 0.38 | 0.70 | 7.9 | 15.4 |
| #3 | 22.4 | 22.4 | 0.94 | 1.00 | 0.41 | 0.67 | 8.5 | 15.0 |
| #4 | 22.4 | 22.5 | 0.88 | 0.96 | 0.42 | 0.66 | 8.3 | 14.3 |
| #5 | 22.6 | 22.6 | 0.92 | 1.02 | 0.34 | 0.66 | 7.1 | 15.2 |
| #6 | 23.0 | 22.9 | 0.92 | 1.01 | 0.45 | 0.68 | 9.5 | 15.7 |
| #7 | 22.4 | 22.4 | 0.94 | 1.02 | 0.41 | 0.65 | 8.6 | 14.8 |
| #8 | 22.2 | 22.1 | 0.94 | 1.02 | 0.37 | 0.63 | 7.6 | 14.2 |
| #9 | 22.5 | 22.5 | 0.92 | 1.00 | 0.44 | 0.69 | 9.1 | 15.5 |
| #10 | 22.3 | 22.2 | 0.88 | 0.96 | 0.44 | 0.67 | 8.6 | 14.3 |
| #11 | 22.3 | 22.2 | 0.90 | 1.00 | 0.45 | 0.64 | 9.0 | 14.2 |
| #12 | 22.5 | 22.4 | 0.94 | 1.02 | 0.45 | 0.64 | 9.5 | 14.5 |
| #13 | 22.8 | 22.8 | 0.88 | 0.98 | 0.47 | 0.66 | 9.4 | 14.8 |
| #14 | 22.4 | 22.4 | 0.96 | 1.04 | 0.48 | 0.68 | 10.3 | 15.8 |
| #15 | 22.7 | 22.8 | 0.90 | 0.98 | 0.38 | 0.65 | 7.7 | 14.5 |
| #16 | 22.1 | 22.0 | 0.90 | 0.98 | 0.43 | 0.63 | 8.7 | 13.6 |
| #17 | 22.7 | 22.8 | 0.88 | 0.98 | 0.47 | 0.68 | 9.5 | 15.2 |
| #18 | 22.5 | 22.5 | 0.86 | 0.96 | 0.45 | 0.67 | 8.6 | 14.6 |
| #19 | 21.8 | 21.7 | 0.94 | 1.02 | 0.36 | 0.64 | 7.4 | 14.2 |
| #20 | 21.9 | 21.9 | 0.94 | 1.02 | 0.42 | 0.67 | 8.7 | 15.0 |
| #21 | 22.2 | 22.1 | 0.94 | 1.04 | 0.42 | 0.66 | 8.8 | 15.1 |
| #22 | 22.0 | 21.9 | 0.98 | 1.04 | 0.42 | 0.66 | 9.1 | 14.9 |
| #23 | 22.3 | 22.2 | 0.92 | 1.02 | 0.41 | 0.67 | 8.4 | 15.2 |
| Average | 22.3 ± 0.3 | 22.3 ± 0.4 | 0.92 ± 0.03 | 1.01 ± 0.03 | 0.42 ± 0.04 | 0.66 ± 0.02 | 8.6 ± 0.8 | 14.9 ± 0.6 |

Figure 23A:
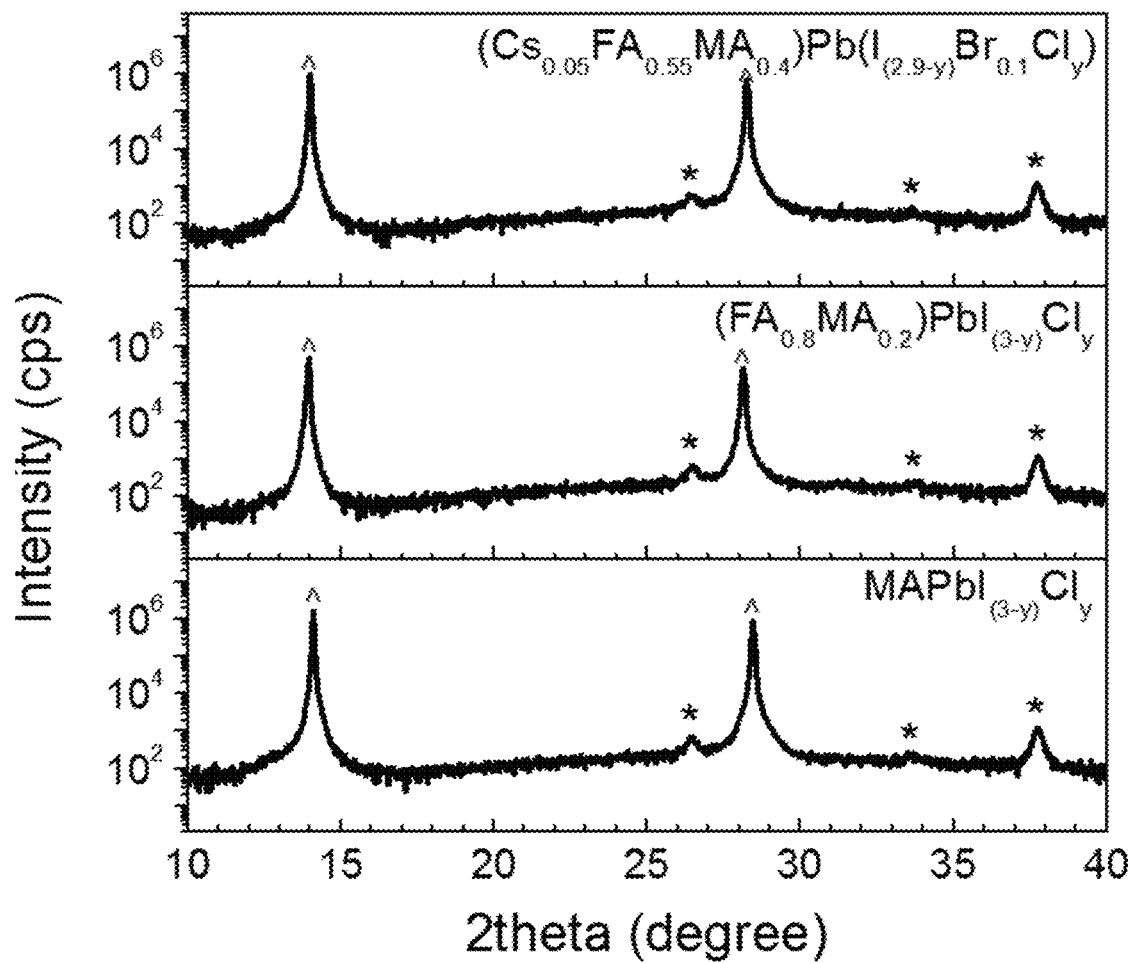
FIGS. 23A and 23B illustrate crystal structure and morphology of uniaxial-oriented perovskites prepared by TOA process with various compositions, according to some embodiments of the present disclosure.
Figure 23B:
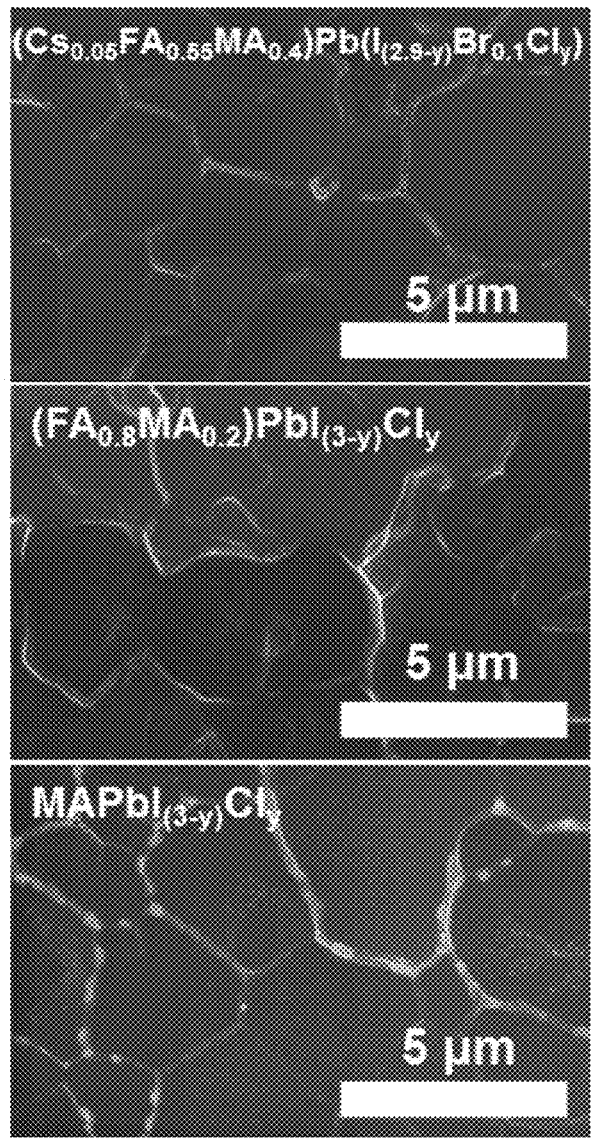

(see FIGS. 23A and 23B). Thus, the TOA growth is promising as a general synthetic route for preparing perovskite thin films, featuring a high degree of orientation and crystallinity, uniform and compact film morphology with several-micrometer grain sizes, high carrier mobility and lifetime, and low defect density—all of which are preferred material attributes for developing high-performance organic-inorganic perovskite solar cells.

Materials and Methods

Preparation of organic-inorganic perovskite precursor solutions: A precursor solution for TOA-processed organic-inorganic perovskite crystals and films having substantial orientation relative to a single reference axis was prepared by dissolving a first FAI-PbI$_2$ reactant pair and a second 3MAI-PbCl$_2$ reactant pair at about a 3:2 ratio in anhydrous N,N-dimethylformamide (DMF) at 55° C. for about 4 hours. To form an organic-inorganic perovskite film of oriented organic-inorganic perovskite crystals, having a thickness of about 450 nm, the precursor solution was prepared using 0.95 M lead concentration. For the crystallographic studies describe above, a precursor solution of x(FAI-PbI$_2$)(1−x) (3MAI-PbCl$_2$) (0≤x≤1), as described above, was dissolved under the same conditions. The 0.95 M (0.6FAI-0.4MAI-PbI$_2$) starting solution, and the (0.6FAI-2.4MAI-PbCl$_2$) starting solution were also prepared under the same conditions, dissolved in DMF. For the conventional solvent-engineering process, the a 1.4 M precursor solution was prepared by dissolving HC(NH$_2$)$_2$I, CH$_3$NH$_3$I, and PbI$_2$ at a ratio of 0.6:0.4:1 in a mixture of γ-butyrolactone (GBL) and dimethyl sulfoxide (DMSO) (7:3 v/v) at room temperature. Preparation of precursor was carried out in a N$_2$-filled glovebox.

Solar cell fabrication: A patterned fluorine-doped tin oxide (FTO) was deposited with a compact TiO$_2$ blocking layer by spray pyrolysis at 450° C. using 0.2 M titanium diisopropoxide bis(acetylacetonate) in 1-butanol solution, followed by 450° C. annealing for about 1 hour. Organic-inorganic perovskite starting solutions were deposited in a dry nitrogen box using a spin coater to form a liquid coating of the organic-inorganic perovskite starting solutions on the c-TiO$_2$/FTO substrate. Spin coating utilized a two-step procedure with a first step of 500 rpm for about 15 seconds, and a second step of 2000 rpm for about 45 seconds with sufficient dispensing of precursor solution on a 1-inch-square c-TiO$_2$/FTO substrate.

For the control sample (randomly oriented perovskite using conventional solvent-engineering), the precursor solution was deposited on the substrate by spin-coating at 1,000 and 4,000 rpm for 60 seconds and 40 seconds, respectively. At 30 seconds into spin-coating at 4,000 rpm, 0.7 mL of diethyl ether was drop-casted on the spinning substrate.

After spin-coating both the TOA-processed sample and the control sample, the solid-state precursor (SSP) films were annealed (thermally treated) at about 50° C. for about 5 minutes, followed sequentially, by further annealing at about 130° C. for about 10 minutes. After annealing, 60 μL of a hole-transport layer (HTL) solution (72 mg of spiro-OMeTAD, 29 μL of 4-tert-butylpyridine, 17 μL of Li-TFSI solution (720 mg of Li-TFSI in 1 mL acetonitrile) and 20 μL of FK102 Co(III) TFSI salt (300 mg FK102 Co(III) TFSI in 1 mL acetonitrile) in 1 mL of chlorobenzene) was spin-coated on the perovskite/c-TiO$_2$/FTO at 3,500 rpm for 30 seconds. Finally, a 130-nm Ag layer was deposited on the HTL by thermal evaporation with 0.15 nm s[1] deposition rate. Before depositing of the organic-inorganic perovskite layers and the HTL layers, all prepared solutions were infiltrated through 0.45-μL-size PTEF filter.

Material characterization: The crystal structures of the prepared organic-inorganic perovskite films were characterized using an X-ray diffractometer (XRD, D-Max 2200, Rigaku). Two-dimensional XRD (2D-XRD) was measured using a D8-Discover (Bruker) with GADDS 4-circle detector (General Area Detector Diffraction System). The morphologies and microstructures of the prepared perovskite films and the cross-sectional structure and thickness of the solar cells were investigated using a field-emission scanning electron microscopy (FESEM, Quanta 600 and Nova 630 NanoSEM, FEI). Energy-dispersive X-ray spectroscopy (EDS) spectra of perovskite were also obtained using the same scanning electron microscopy (Quanta 600) microscope. To analyze the cross-sectional crystal structure of single-oriented perovskite, perovskite films were treated by focused ion beam (FIB, SMI3050SE, SII Nanotechnology), then the prepared sample was investigated using Cs-corrected transmission electron microscopy (Cs-TEM, JEM-ARM200F, JEOL). The optical absorption spectra of perovskite films were measured using a UV-Vis spectrophotometer with the aid of an integrated sphere (Cary-6000i, Agilent). The current-voltage measurements of perovskite films for space-charge-limited current (SCLC) analysis were carried out with a potentiostat (Princeton Applied Research, VersaSTAT MC) under dark. To determinate permittivity of perovskite films, impedance spectroscopy was carried out from $10^4$ to $10^6$ Hz, under dark, using a potentiostat (Princeton Applied Research, Parstat 2273).

Device characterization: Photovoltaic performance measurements were taken under a simulated AM 1.5G illumination (100 mW cm$^{-2}$, Oriel Sol3A Class AAA Solar Simulator, Newport). The AM 1.5G sunlight was calibrated using a standard Si solar cell (Oriel, VLSI standards) for every measurement. The photocurrent density-voltage (J-V) characteristics were measured using a Keithley 2400 source meter with 0.12-cm$^2$ black metal aperture. The stabilized current and power output were measured using a potentiostat (Princeton Applied Research, VersaSTAT MC). External quantum efficiency (EQE) spectra of devices were measured using a solar cell quantum-efficiency measurement system (QEX10, PV Measurements).

Flash-Photolysis Time-Resolved Microwave Conductivity (fp-TRMC): The details of the fp-TRMC experimental setup, its theoretical background, and data analysis have been extensively reported elsewhere. In brief, our fp-TRMC uses a visible-pump/microwave-probe configuration, and a sample is optically excited by a 4-ns full-width-at-half-maximum laser pulse from an optical parametric oscillator (OPO, Continuum Panther), pumped by the 355-nm harmonic of an Nd:YAG laser (Continuum Powerlite) and sample photoconductance (ΔG(t)) is measured by monitoring a transient change (ΔP(t)) in microwave power absorption by a sample after a laser pulse as a function of delay time. A sample is mounted and sealed into a microwave cavity in a nitrogen glovebox, and transferred to the experimental apparatus where ultra-high-purity (UHP)-grade nitrogen flow through the cavity is maintained at all times to avoid any ambient exposure to humidity that can readily degrade organic/inorganic perovskites during experiments. Excitation pulse energy is adjusted with a series of neutral-density filters and measured by a laser-energy meter (Coherent, EPM2000 power meter, J25 and J-10SI-HE energy sensors). We measured the electronic absorption spectrum of a sample before and after fp-TRMC experiments to ensure that a sample is robust. The perovskite/quartz samples are prepared through the same procedure mentioned in the solar cell fabrication section.

Below, Equation 1 shows the relations between experimentally obtained transient microwave power difference ($\Delta P(t)$) to photoconductance ($\Delta G(t)$) and the product ($\Phi\Sigma\mu(t)$) of carrier-generation yield ($\Phi^*t$)) and the sum ($\Sigma\mu=\mu_e\mu_h$) of electron and hole mobilities:

$$-\frac{\Delta P(t)}{P} = K\Delta G(t) = K\beta q_e \big(\Phi(t)\sum\mu\big)(I_0 F_A), \quad (1)$$

where K[$\Omega$] is a sensitivity factor, determined as 28,200 from the cavity resonance characteristics and the dielectric properties of the medium, $\beta$ is the ratio between the long and short axes of the sample volume, $q_e$ [C] is the elementary charge, $I_0$ [photons cm$^{-2}$ pulse$^{-1}$] is the excitation photon fluence, and $F_A$ is the fraction of light absorbed at the excitation wavelength (absorptance).

Calculation of degree of {-111} crystallographic orientation (DCO$_{\{-111\}}$): The relative degree of {-111} crystallographic orientation was calculated from Equation 2 as below:

$$\frac{\sum\int I_{\{-111\}}}{\sum\int I_{(other\ hkl)}}, \quad (2)$$

where N is the number of diffractions considered in the analysis; and $\int I_{(hkl)}$ is integrated 2D-XRD spectra of each plane, corresponding to (-111), (-120), (021), (-222), (-231), and (-240) planes. For MAPbI$_{(3-x)}$Cl$_x$ perovskite (at x=0), the (110), (112), (211), (220), (310), and (024) planes were selected.

Evaluation of real-part contribution for photoconductivity to TRMC transient signals: fp-TRMC experiments probe the time-dependent complex dielectric constant $\varepsilon$ of the sample after photoexcitation, which is revealed as microwave power difference ($\Delta P$). Conductivity has a relation to dielectric constant as $\sigma=i\omega\varepsilon=\varepsilon_0\omega(i\varepsilon'+\varepsilon'')$, where $\sigma$, $\omega$, $\varepsilon_0$, $\varepsilon'$, and $\varepsilon''$ represent the complex conductivity, radian frequency of the microwave electric field, vacuum permittivity, and real and imaginary parts of the dielectric constant at frequency co, respectively. This leads to the real photoconductivity being proportional to the imaginary dielectric constant change, which appears as microwave absorption. The imaginary photoconductivity is proportional to the change in the real dielectric constant, revealing a shift in the microwave-cavity resonance frequency. In this regard, the contour plots of frequency-dependent reflected microwave power transients shown in FIG. 18 Panel A can evaluate the origin of photoconductance; for samples in this work, the imaginary-part contributions of photoconductivity are negligible.

Determination of trap density of TOA- and SE-perovskite film: The trap density, $n_t$, of perovskite films are determined from the onset voltage, called trap-filled limited voltage ($V_{TFL}$), of I-V curves using Equation 3 as below:

$$V_{TFL} = \frac{en_t d^2}{2\varepsilon\varepsilon_0}, \quad (3)$$

where e is elementary charge, $n_t$ is trap density, d is the thickness of perovskite films (d$_{(TOA)}$=1.2 µm and d$_{(SE)}$=550 nm, respectively), $\varepsilon_0$ is vacuum permittivity, and $\varepsilon$ is relative dielectric constant of perovskite. In this study, $\varepsilon$ of perovskite films was determined from impedance spectroscopy using Equation 4 as below:

$$\varepsilon(f) = \frac{d}{A\varepsilon_0}\frac{-1}{2\pi f \mathrm{Im}(Z)}, \quad (4)$$

where d is the thickness of perovskite film between two parallel electrodes, A is the capacitor area, and $\varepsilon_0$ is vacuum permittivity. Consequently, we determined relative dielectric constant $\varepsilon$=60 of our mixed-cation perovskite films.

EXAMPLES

Example 1

A method comprising: combining a first organic salt (A$^1$X$^1$), a first metal salt (M$^1$(X$^2$)$_x$) a second organic salt (A$^2$X$^3$), a second metal salt (M$^2$Cl$_2$), and a solvent to form a primary solution, wherein: A$^1$X$^1$ and M$^1$(X$^2$)$_2$ are present in the primary solution at a first ratio between about 0.5 to 1.0 and about 1.5 to 1.0; and A$^2$X$^3$ to M$^2$Cl$_2$ are present in the primary solution at a second ratio between about 2.0 to 1.0 and about 4.0 to 1.0.

Example 2

The method of Example 1, wherein A$^1$ comprises at least one of an alkyl ammonium, an alkyl diamine, cesium, or rubidium.

Example 3

The method of Example 2, wherein A$^1$ comprises at least one of methylammonium, ethyl ammonium, propylammonium, or butyl ammonium.

Example 4

The method of Example 3, wherein A$^1$ is methylammonium.

Example 5

The method of Example 2, wherein A$^1$ is formamidinium.

Example 6

The method of Example 1, wherein A$^2$ comprises at least one of an alkyl ammonium, an alkyl diamine, cesium, or rubidium.

Example 7

The method of Example 6, wherein A$^2$ comprises at least one of methylammonium, ethyl ammonium, propylammonium, or butyl ammonium.

Example 8

The method of Example 7, wherein A$^2$ is methylammonium.

Example 9

The method of Example 6, wherein A$^2$ is formamidinium.

Example 10

The method of Example 6, wherein: $A^2$ comprises an alkyl ammonium and cesium, and the alkyl ammonium is methylammonium.

Example 11

The method of Example 1, wherein at least one of $A^1$ or $A^2$ comprises at least one of an alkyl ammonium, an alkyl diamine, cesium, or rubidium.

Example 12

The method of Example 11, wherein at least one of $A^1$ or $A^2$ comprises at least one of methylammonium, ethylammonium, propylammonium, or butylammonium.

Example 13

The method of Example 11, wherein at least one of $A^1$ or $A^2$ comprises formamidinium.

Example 14

The method of Example 11, wherein $A^1$ comprises methylammonium and $A^2$ comprises formamidinium.

Example 15

The method of Example 11, wherein $A^1$ comprises methylammonium and $A^2$ comprises formamidinium and cesium.

Example 16

The method of Example 1, wherein $M^1$ comprises a metal having a 2+ valence state.

Example 17

The method of Example 16, wherein $M^1$ comprises at least one of lead, tin, or germanium.

Example 18

The method of Example 17, wherein $M^1$ is lead.

Example 19

The method of Example 1, wherein $M^2$ comprises a metal having a 2+ valence state.

Example 20

The method of Example 19, wherein $M^2$ comprises at least one of lead, tin, or germanium.

Example 21

The method of Example 20, wherein $M^2$ is lead.

Example 22

The method of Example 1, wherein at least one of $M^1$ or $M^2$ comprises a metal having a 2+ valence state.

Example 23

The method of Example 22, wherein at least one of $M^1$ or $M^2$ comprises at least one of lead, tin, or germanium.

Example 24

The method of Example 1, wherein $X^1$ comprises a halogen.

Example 25

The method of Example 24, wherein $X^1$ comprises at least one of fluorine, bromine, iodine, or astatine.

Example 26

The method of Example 25, wherein $X^1$ comprises at least one of bromine or iodine.

Example 27

The method of Example 1, wherein $X^2$ comprises a halogen.

Example 28

The method of Example 27, wherein $X^2$ comprises at least one of fluorine, bromine, iodine, or astatine.

Example 29

The method of Example 28, wherein $X^2$ comprises at least one of bromine or iodine.

Example 30

The method of Example 1, wherein $X^3$ comprises a halogen.

Example 31

The method of Example 30, wherein $X^3$ comprises at least one of fluorine, bromine, iodine, or astatine.

Example 32

The method of Example 31, wherein $X^3$ comprises at least one of bromine or iodine.

Example 33

The method of Example 1, wherein at least one of $X^1$, $X^2$, or $X^3$ comprises a halogen.

Example 34

The method of Example 33, wherein at least one of $X^1$, $X^2$, or $X^3$ comprises at least one of fluorine, bromine, iodine, or astatine.

Example 35

The method of Example 34, wherein $X^1$ is iodine and $X^2$ is bromine.

Example 36

The method of Example 1, wherein the solvent comprises an organic solvent.

Example 37

The method of Example 36, wherein the solvent comprises at least one of γ-butyrolactone or dimethyl sulfoxide.

Example 38

The method of Example 37, wherein the solvent comprises at least one of dimethylformamide, dimethylacetamide, γ-butyrolactone, dimethyl sulfoxide, or N-methyl-2-pyrrolidone.

Example 39

The method of Example 1, wherein the first ratio is about 1.0. to 1.0.

Example 40

The method of Example 1, wherein the second ratio is about 3.0 to 1.0.

Example 41

The method of Example 1, wherein: $A^1X^1$ and $M^1(X^2)_2$ form a first reactant pair, $A^2X^3$ to $M^2Cl_2$ form a second reactant pair, and the first reactant pair and the second reactant pair are present in the primary solution at a third ratio between about 1.0 to 1.0 and about 1.5 to 1.

Example 42

The method of Example 1, wherein at least one of $A^1X^1$, $M^1(X^2)_2$, $A^2X^3$, or $M^2Cl_2$ is present in the primary solution at a molar concentration between about 0.1 M and about 2.0 M.

Example 43

The method of Example 1, wherein the combining is performed at a first temperature between about 25° C. and about 80° C.

Example 44

The method of Example 1, wherein the combining is performed for a first period between about 0.5 hours and about 12 hours.

Example 45

The method of Example 1, wherein the combining comprises: a first combining of the first organic salt ($A^1X^1$) and the first metal salt ($M^1(X^2)_2$) in a first solvent to form a first solution containing the first ratio; a second combining of the second organic salt ($A^2X^3$) and the second metal salt ($M^2Cl_2$) in a second solvent to form a second solution containing the second ratio; and a third combining of the first solution with the second solution to form the primary solution.

Example 46

The method of Example 45, wherein the first solvent and the second solvent are the same.

Example 47

The method of Example 45, wherein the first solvent comprises an organic solvent.

Example 48

The method of Example 47, wherein the first solvent comprises at least one of γ-butyrolactone or dimethyl sulfoxide.

Example 49

The method of Example 48, wherein the first solvent comprises at least one of dimethylformamide, dimethylacetamide, γ-butyrolactone, dimethyl sulfoxide, or N-methyl-2-pyrrolidone.

Example 50

The method of Example 45, wherein the second solvent comprises an organic solvent.

Example 51

The method of Example 50, wherein the second solvent comprises at least one of γ-butyrolactone or dimethyl sulfoxide.

Example 52

The method of Example 51, wherein the second solvent comprises at least one of dimethylformamide, dimethylacetamide, γ-butyrolactone, dimethyl sulfoxide, or N-methyl-2-pyrrolidone.

Example 53

The method of Example 1, further comprising: depositing at least a portion of the primary solution onto a solid surface, wherein: the depositing forms a liquid layer comprising the primary solution on the solid surface.

Example 54

The method of Example 53, wherein the depositing is performed using at least one of spin coating, blade coating, curtain coating, or dip coating.

Example 55

The method of Example 53, wherein the liquid layer has a thickness between about 100 nm and about 3000 nm.

Example 56

The method of Example 53, further comprising, after the depositing: treating at least the liquid layer, wherein: the treating converts at least a portion of the liquid layer to a solid layer comprising a plurality of organic-inorganic perovskite crystals, and the solid layer is adhered to the solid surface.

Example 57

The method of Example 56, wherein the treating is performed by thermal treating.

Example 58

The method of Example 57, wherein the thermal treating is performed by heating at least the liquid layer to a second temperature greater than about 120° C.

Example 59

The method of Example 58, wherein the second temperature is between greater than about 120° C. and about 200° C.

Example 60

The method of Example 56, wherein the plurality of organic-inorganic perovskite crystals comprise $A^1_{(1-x-y)}A^2_xA^3_yM^1_zM^2_{1-z}X^1_aX^2_bX^3_cCl_d$, where x, y, and z are each between zero and one inclusively, and a+b+c+d=3.0.

Example 61

The method of Example 60, wherein the plurality of organic-inorganic perovskite crystals comprise $FA_{0.6}MA_{0.4}PbI_{(3-d)}Cl_d$.

Example 62

The method of Example 60, wherein the plurality of organic-inorganic perovskite crystals comprise $MAPbI_{(3-d)}Cl_d$.

Example 63

The method of Example 60, wherein the plurality of organic-inorganic perovskite crystals comprise $FA_{0.8}MA_{0.2}PbI_{(3-d)}Cl_d$.

Example 64

The method of Example 60, wherein the plurality of organic-inorganic perovskite crystals comprise $FA_{0.55}MA_{0.4}Cs_{0.05}PbI_{(2.9-d)}Br_{0.1}Cl_d$.

Example 65

The method of Example 56, wherein: each of the plurality of organic-inorganic perovskite crystals has a length dimension and a width dimension, and the length dimension and the width dimension define an aspect ratio of the length dimension to the width dimension between about 1.5 and about 50.

Example 66

The method of Example 65, wherein the length dimension is oriented substantially perpendicular to the solid surface.

Example 67

The method of Example 65, wherein the length dimension is between about 100 nm and about 3000 nm.

Example 68

The method of Example 56, wherein the plurality of organic-inorganic perovskite crystals form grains measuring between about 2 μm and about 5 μm.

Example 69

The method of Example 53, wherein a first charge transport layer comprises the solid surface.

Example 70

The method of Example 69, wherein the first charge transport layer comprises at least one of $TiO_2$, $SnO_2$, ZnO, Spiro-OMeTAD, poly[bis(4-phenyl)(2,4,6-trimethylphenyl)amine] (PTAA), or poly(3,4-ethylenedioxythiophene)-poly(styrenesulfonate) (PEDOT:PSS).

Example 71

A device comprising: a perovskite layer comprising an organic-inorganic perovskite crystal, wherein: the perovskite layer is positioned substantially parallel with a plane, the organic-inorganic perovskite crystal has a molar composition defined by $A^1_{(1-x-y)}A^2_xA^3_yM^1_zM^2_{1-z}Cl_d$, where x, y, and z are each between zero and one inclusively, and d=3.0, at least one of $A^1$, $A^2$, or $A^3$ comprises at least one of an alkyl ammonium, an alkyl diamine, cesium, or rubidium, and at least one of $M^1$ or $M^2$ comprises a metal having a 2+ valence state.

Example 72

The device of Example 71, wherein the alky ammonium comprises at least one of methylammonium, ethylammonium, propylammonium, or butylammonium.

Example 73

The device of Example 71, wherein the alky ammonium comprises is methylammonium.

Example 74

The device of Example 71, wherein the alkyl diamine comprises formamidinium.

Example 75

The device of Example 71, wherein $A^1$ comprises methylammonium and $A^2$ comprises formamidinium.

Example 76

The device of Example 71, wherein $A^1$ comprises methylammonium, $A^2$ comprises formamidinium, and $A^3$ comprises cesium.

Example 77

The device of Example 71, wherein the metal comprises at least one of lead, tin, or germanium.

Example 78

The device of Example 71, wherein $M^1$ comprises lead.

Example 79

The device of Example 71, wherein: the organic-inorganic perovskite crystal further comprises $X^1_a X^2_b X^3_c$, where a+b+c+d=3.0, and at least one of $X^1$, $X^2$, or $X^3$ comprises a halogen.

Example 80

The device of Example 79, wherein the halogen comprises at least one of fluorine, chlorine, bromine, iodine, or astatine.

Example 81

The device of Example 79, wherein $X^1$ comprises iodine.

Example 82

The device of Example 79, wherein the organic-inorganic perovskite crystal comprises $FA_{0.6}MA_{0.4}PbI_{(3-d)}Cl_d$.

Example 83

The device of Example 79, wherein the organic-inorganic perovskite crystal comprises $MAPbI_{(3-d)}Cl_d$.

Example 84

The device of Example 79, wherein the organic-inorganic perovskite crystal comprises $FA_{0.8}MA_{0.2}PbI_{(3-d)}Cl_d$.

Example 85

The device of Example 79, wherein the organic-inorganic perovskite crystal comprises $FA_{0.55}MA_{0.4}Cs_{0.05}Pb I_{(2.9-d)}Br_{0.1}Cl_d$.

Example 86

The device of Example 79, wherein: the organic-inorganic perovskite crystal has a length dimension and a width dimension, and the length dimension and the width dimension define an aspect ratio of the length dimension to the width dimension between about 1.5 and about 50.

Example 87

The device of Example 86, wherein the length dimension is oriented substantially perpendicular to the plane.

Example 88

The device of Example 86, wherein the length dimension is between about 100 nm and about 3000 nm.

Example 89

The device of Example 71, wherein the organic-inorganic perovskite crystal forms a grain having a width between about 2 μm and about 5 μm.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A device comprising:
    a perovskite layer comprising an organic-inorganic perovskite crystal, wherein:
    the perovskite layer is positioned substantially parallel with a plane,
    the organic-inorganic perovskite crystal has a molar composition defined by $FA_xMA_{(1-x)}PbI_{(3-y)}Cl_y$,
    0<x<1.0,
    0<y<3.0,
    the organic-inorganic perovskite crystal has a length dimension and a width dimension,
    the length dimension and the width dimension define an aspect ratio of the length dimension to the width dimension between about 1.5 and about 50, and
    the length dimension has an orientation that is substantially perpendicular to the plane.

2. The device of claim 1, wherein the length dimension is between about 100 nm and about 3000 nm.

3. The device of claim 1, wherein the width dimension is between about 2 μm and about 5 μm.

4. The device of claim 1, wherein the orientation is uniaxial along the [−111] direction.

5. The device of claim 4, wherein the orientation is validated by XRD by the presence of bright spots at 14.0° and 28.2°.

* * * * *